(12) United States Patent  (10) Patent No.: US 7,551,450 B2
Sugawara et al.  (45) Date of Patent: Jun. 23, 2009

(54) EXTERNAL MEMORY DEVICE

(75) Inventors: Norio Sugawara, Tochigi (JP); Takashi Ando, Tochigi (JP); Hiroaki Yamanaka, Tochigi (JP)

(73) Assignee: Sony Corporation, Tokyo (JP)

( * ) Notice: Subject to any disclaimer, the term of this patent is extended or adjusted under 35 U.S.C. 154(b) by 917 days.

(21) Appl. No.: 10/506,719

(22) PCT Filed: Jan. 7, 2004

(86) PCT No.: PCT/JP2004/000035

§ 371 (c)(1),
(2), (4) Date: Sep. 7, 2004

(87) PCT Pub. No.: WO2004/063981

PCT Pub. Date: Jul. 29, 2004

(65) Prior Publication Data

US 2005/0157462 A1  Jul. 21, 2005

(30) Foreign Application Priority Data

Jan. 8, 2003 (JP) ............................ 2003-002675
May 30, 2003 (JP) ............................ 2003-156072
Nov. 28, 2003 (JP) ............................ 2003-400876

(51) Int. Cl.
 *H05K 5/00* (2006.01)
(52) U.S. Cl. .................. 361/752; 361/800; 361/756
(58) Field of Classification Search ................ 361/737, 361/727, 752, 800, 790, 797, 728, 760, 686; 439/61, 62, 79, 267, 325, 327, 377
See application file for complete search history.

(56) References Cited

U.S. PATENT DOCUMENTS

| 5,552,632 | A  | 9/1996  | Iwasaki      |
| 6,193,495 | B1 | 2/2001  | Sasai et al. |
| 6,201,295 | B1 | 3/2001  | Iwasaki      |
| 6,274,926 | B1 | 8/2001  | Iwasaki      |
| 6,296,523 | B1 | 10/2001 | Sasai        |
| 6,456,500 | B1 | 9/2002  | Chen         |

(Continued)

FOREIGN PATENT DOCUMENTS

EP      0 622 760 B1    9/1994

(Continued)

OTHER PUBLICATIONS

Corresponding Cases.

*Primary Examiner*—Hung S Bui
(74) *Attorney, Agent, or Firm*—Frommer Lawrence & Haug LLP; William S. Frommer; Ellen Marcie Emas

(57) ABSTRACT

An external storage apparatus capable of preventing erroneous assembly of components for which the assembly position is decided and of suppressing the occurrence of variations in its quality is provided.

An external storage apparatus including a main body 11, a memory substrate 12 having a connector 24, a substrate holder 13 for fixing the memory substrate 12 to the main body under the state that the connector 24 projects outward, a cap 14 to be attachable and detachable to and from the substrate holder 13 for protecting the connector 24, wherein erroneous assembly restricting means 38, 37, 40 and 32 are provided between the main body 11, the memory substrate 12 and the substrate holder 13.

23 Claims, 51 Drawing Sheets

U.S. PATENT DOCUMENTS

| | | | |
|---|---|---|---|
| 6,994,568 B2 * | 2/2006 | Huang et al. | 439/76.1 |
| 6,999,322 B1 * | 2/2006 | Lin | 361/752 |
| 7,066,742 B2 * | 6/2006 | Liang et al. | 439/76.1 |
| 7,364,445 B1 * | 4/2008 | Ni et al. | 439/140 |
| 7,438,562 B2 * | 10/2008 | Ni et al. | 439/79 |
| 2002/0001181 A1 | 1/2002 | Kondo | |
| 2002/0174286 A1 | 11/2002 | Tamura | |
| 2003/0099090 A1 * | 5/2003 | Su | 361/685 |
| 2004/0233645 A1 * | 11/2004 | Chen | 361/737 |

FOREIGN PATENT DOCUMENTS

| | | |
|---|---|---|
| EP | 1 467 310 | 10/2004 |
| FR | 2 806 505 | 9/2001 |
| JP | 3086525 U | 4/1991 |
| JP | 4 205079 | 7/1992 |
| JP | 06-312593 | 11/1994 |
| JP | 10-250275 | 9/1998 |
| JP | 11-99779 | 4/1999 |
| JP | 11-354213 | 12/1999 |
| JP | 2001-160390 | 12/2001 |
| JP | 2002-007974 | 1/2002 |
| JP | 3086524 | 3/2002 |
| JP | 2002-190004 | 7/2002 |

* cited by examiner

EXTERNAL MEMORY DEVICE

FIELD OF THE INVENTION

The present invention relates to an external storage apparatus capable of being exchanged or being portable as an external storage medium.

BACKGROUND OF RELATED ART

Conventionally, storage apparatuses or storage elements capable of recording and storing various data or audio/images etc. have been internally mounted in equipment cases of personal computers etc. or have been capable of being arbitrarily attachable and detachable (or exchangeable) to and from equipment cases.

In a case where, for example, flexible disk devices etc. are taken as external storage apparatuses capable of being freely removed from the equipment, attaching and removing is possible with one movement, and various data is possible to record and store in a manner appropriately corresponding to the purpose and object etc. This has the substantial advantage that arrangement etc. can be carried out in a straightforward manner.

However, in the case of a flexible disk, with respect to recording various data, not only is reliability insufficient, but access time is also slow. Further, when apparatuses are made more compact in accordance with the tendency to develop miniaturized, the surface area of the storage medium inevitably becomes smaller and storage capacity is reduced, with this placing limits on achieving miniaturization with a high-capacity.

On the other hand, when semiconductor memory is used as an external storage apparatus, there is the advantage that it is possible to resolve problems with flexible disks such as problems with the reliability of recording and storing of various data and the access time being slow.

The card-type apparatus disclosed in, for example, Japanese Patent Application Publication No. 2003-281490 is well known as an external storage apparatus using semiconductor memory of the related art. However, with card-type external storage apparatuses, this is detrimental to the versatility of drive devices reading and writing data stored in this storage apparatuses, and it is not convenient for a user in its usability.

The present applicant has therefore formerly proposed an external storage apparatus utilized through insertion in a USB (Universal Serial Bus) port etc. of a personal computer (Japanese Patent Application No. 2003-281490). Since this external storage apparatus does not require a dedicated drive device and is capable of storing and reading data simply through insertion in a USB port typically provided at a personal computer, it is very convenient. A configuration for the above external storage apparatus is shown in FIG. 58 to FIG. 60.

An external storage apparatus 1 of the related art is a construction in which a substrate holder 5 made of synthetic resin, which houses a memory substrate 6 mounting a semiconductor memory, is inserted to a main body 2 made of synthetic resin and an external connection terminal 3 such as a connector attached at one edge of the memory substrate 6 is exposed to outside of the main body 2.

When in use, by the external connection terminal 3 is connected to a USB port etc. of a personal computer, which is not shown, recorded information in the semiconductor memory is read or information is recorded in the semiconductor memory. When not in use, a cap 4 made of synthetic resin is attached at the main body 2 with the purpose of protecting from dust and dirt and to ensure accurate reading, recording and storing of information.

Other than the above, the present applicant has formerly proposed Japanese Patent Application No. Hei 6-312593, Japanese Patent Application No. Hei 11-354213 and Japanese Patent Application No. 2001-160390.

DISCLOSURE OF INVENTION

The USB-compatible external storage apparatus 1 described above is configured from a combination of four components of a main body 2, cap 4, substrate holder 5 and memory substrate 6 manufactured such that the main body 2, substrate holder 5 and memory substrate 6 are respectively fixed in an integrated manner, with the cap 4 being freely attachable and detachable to and from the substrate holder 5.

The problem here is that the posture in which the main body 2, substrate holder 5, memory substrate 6 are assembled is decided and if these components are assembled with the posture of even one of these components being incorrect, there may be cases where this is detrimental to the reliability of the resulting product. In particular, with this type of external storage apparatus, principally from the viewpoint of the appearance from a design point of view, it is difficult to discriminate between the front and rear because the appearance of the front and rear is symmetrical, and there is tendency to assemble components incorrectly in the assembly process.

There are various reasons why the assembly posture of the components is restricted and one example is, as shown in FIG. 59, to position the memory substrate 6 so as to be offset to the rear surface side with respect to a center line 2C of the main body 2. The reason for this is to provide a design such that a center axis of an external connection terminal 3 provided at an end edge part of the memory substrate 6 is positioned above a center axis 2C of the main body 2. In this event, when providing a mechanism for preventing shaking of the memory substrate with the main body 2 and substrate holder 5, the mechanism is provided at a position corresponding to an offset position of the memory substrate 6. This causes the internal configuration of the main body 2 and the substrate holder 5 to be asymmetrical in a direction from front to rear.

Even when the internal configuration of the components is asymmetrical in a direction from front to rear for the aforementioned reasons etc., there may also be cases where a worker cannot recognize erroneous assembly of components. When the assembly process is accomplished without recognizing erroneous assembly of components, there may be cases where problems develop in relation to quality as a product, such as being functionally inadequate when compared to a product where the components have been appropriately assembled, or where durability deteriorates etc., which causes variation in the quality of the products.

In particular, the above problems become more marked as this type of external storage apparatus becomes smaller.

For example, in the case that such an external storage apparatus is used with a portable-type personal computer referred to as a notebook-type computer, the extent of projection from a USB port provided at a side surface etc. of a personal computer is substantial. This makes handling troublesome for the user and there are cases where it is therefore wished to make the external storage apparatus smaller. In this kind of case, discrimination of the front and rear of the components during assembly of each miniaturized component becomes substantially more difficult, and the likelihood of assembly in an erroneous direction increases.

The present invention is made under the aforementioned problems and its object is to provide an external storage apparatus capable of preventing erroneous assembly of components for which the assembly position is decided and to suppress the occurrence of variations in its quality.

BEST MODE FOR CARRYING OUT THE INVENTION

The following is a description with reference to the drawings of embodiments of the present invention.

First Embodiment

FIG. 1 to FIG. 12 show an external storage apparatus 10 of a first embodiment of the present invention.

Figure 1:
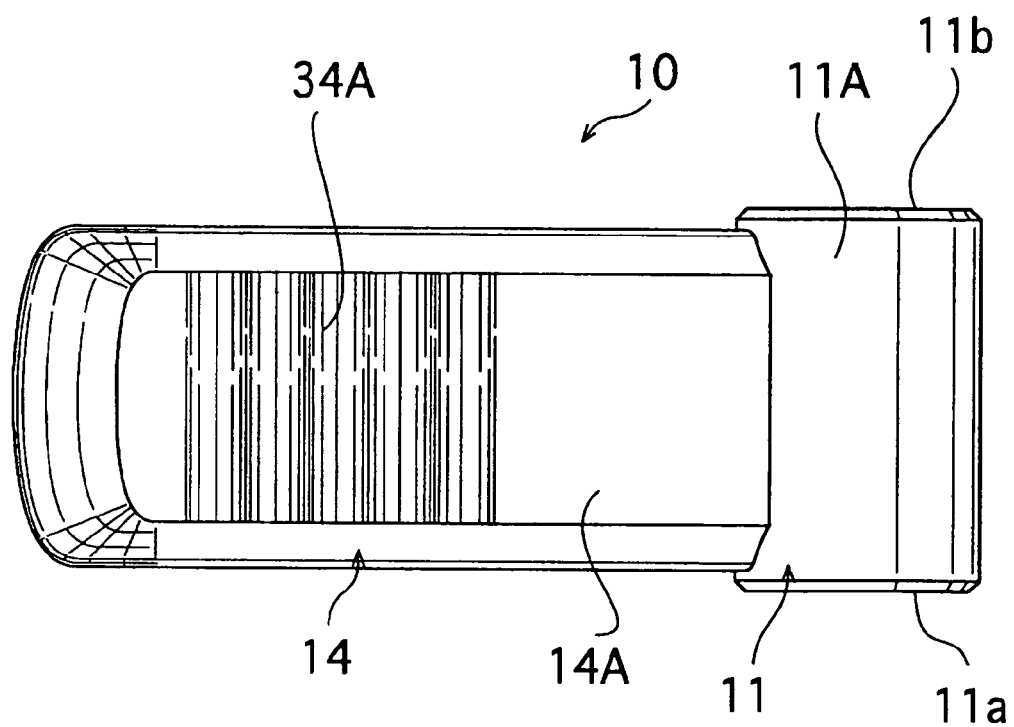
FIG. 1 is a plane view of an external storage apparatus 10 according to a first embodiment of the present invention.
Figure 2:
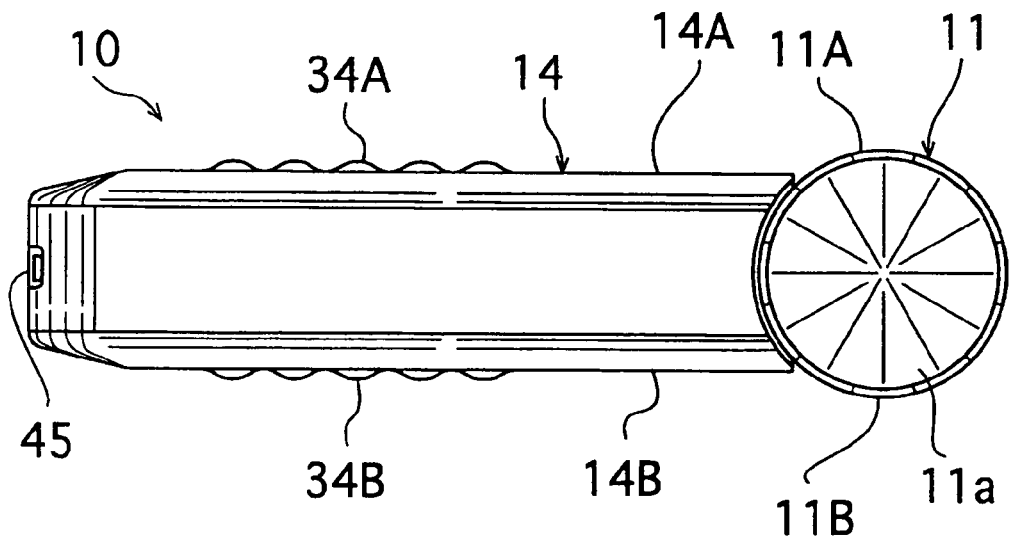
FIG. 2 is the side view of FIG. 1.
Figure 3:
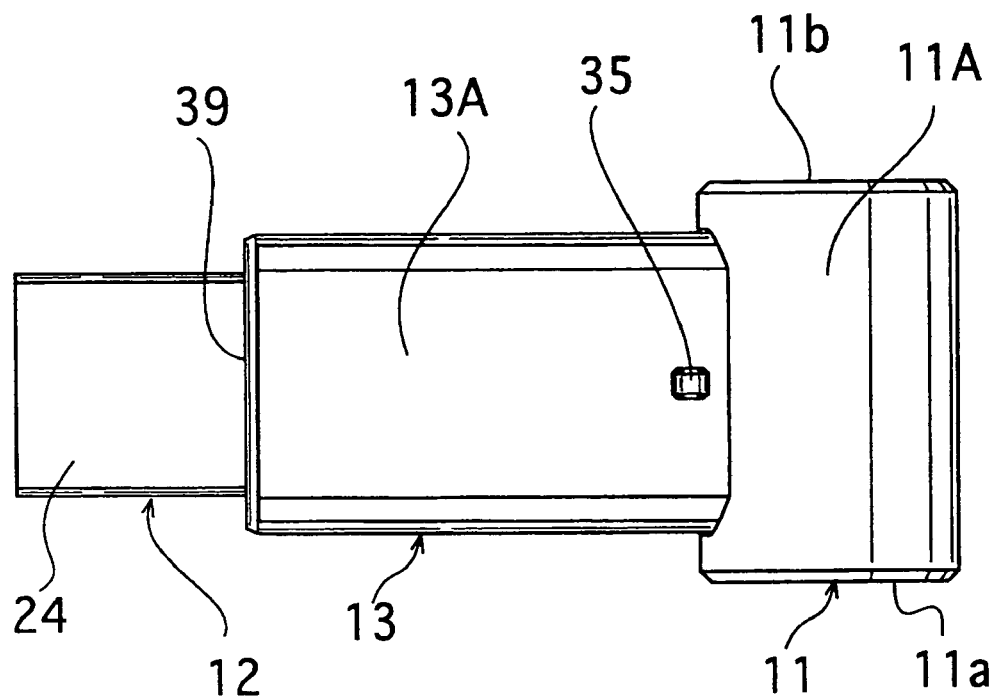
FIG. 3 is a plane view of an external storage apparatus 10 as viewed with a cap removed.
Figure 4:
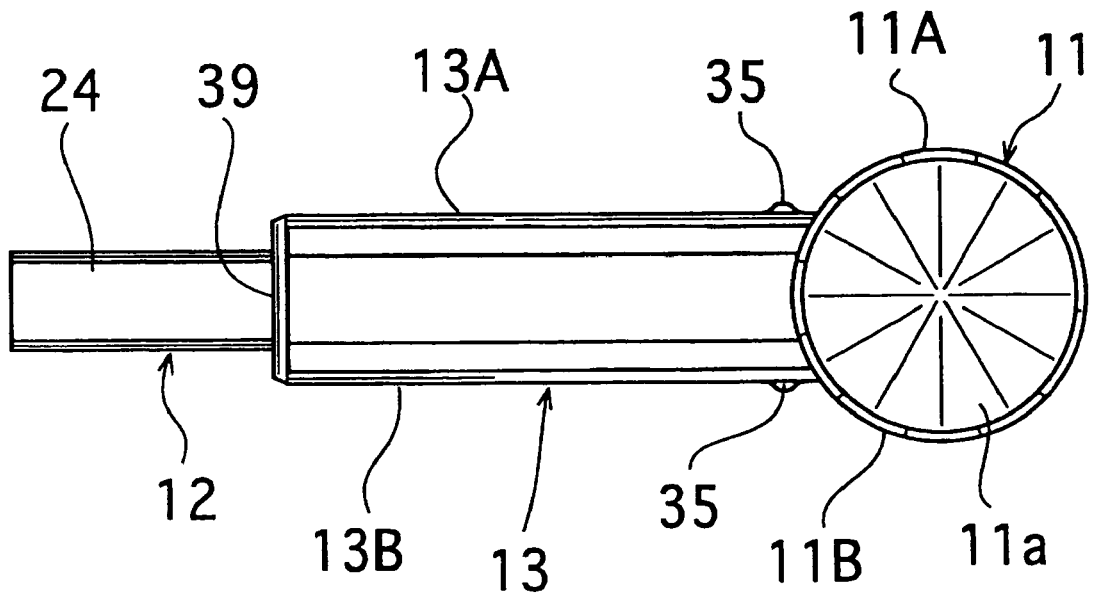
FIG. 4 is the side view of FIG. 2.
Figure 5:
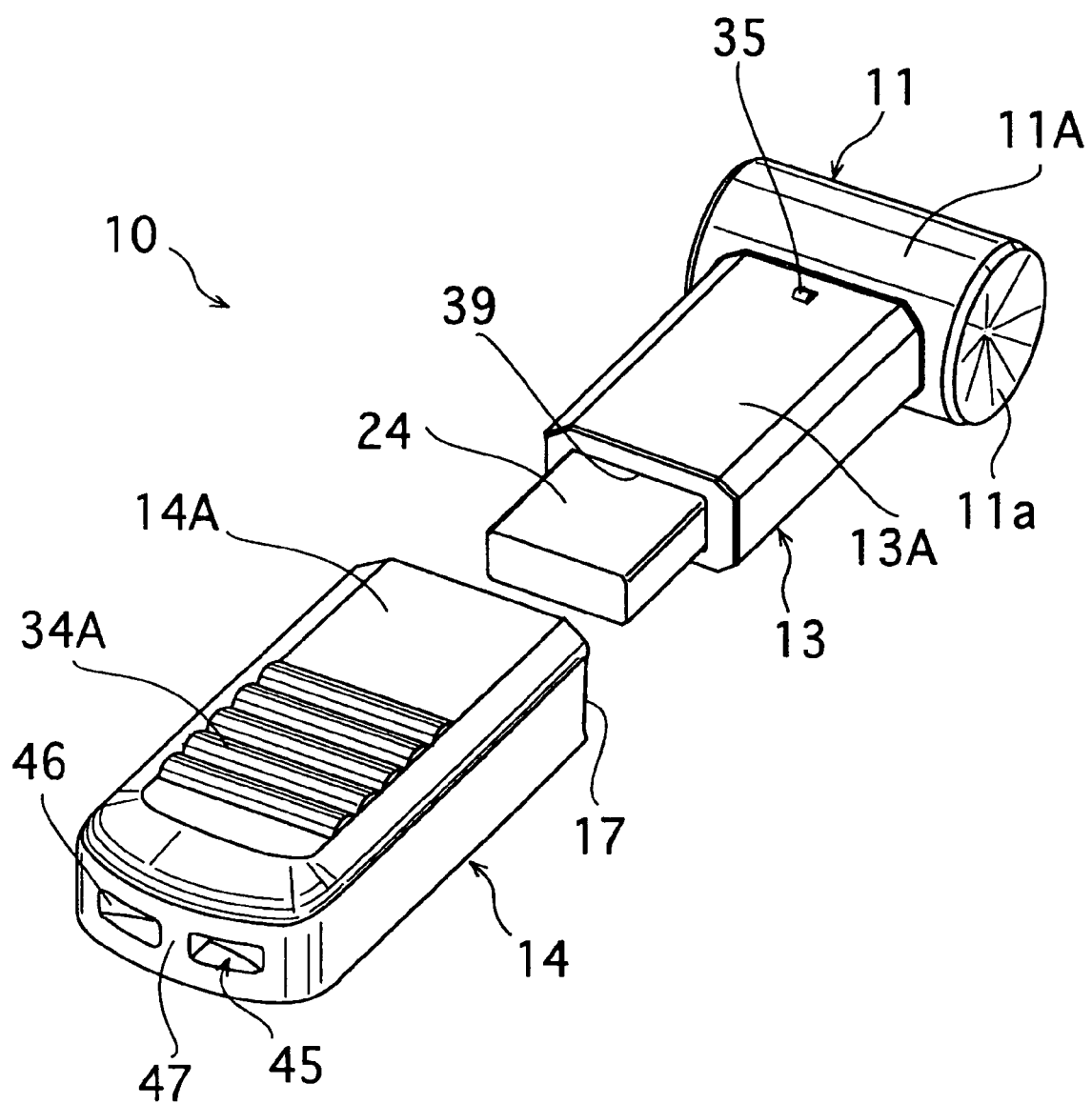
FIG. 5 is a perspective view showing a main body 11-side of an external storage apparatus 10 and a cap 14 separated.
Figure 7:
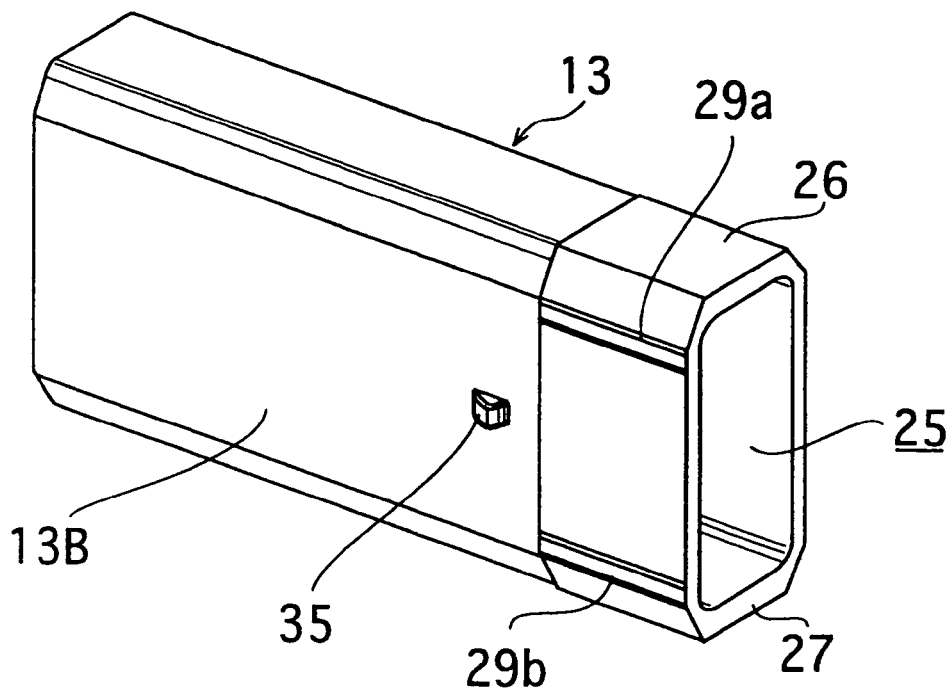
FIG. 7 is a perspective view of a rear surface 13B side of a substrate holder 13.
Figure 8:
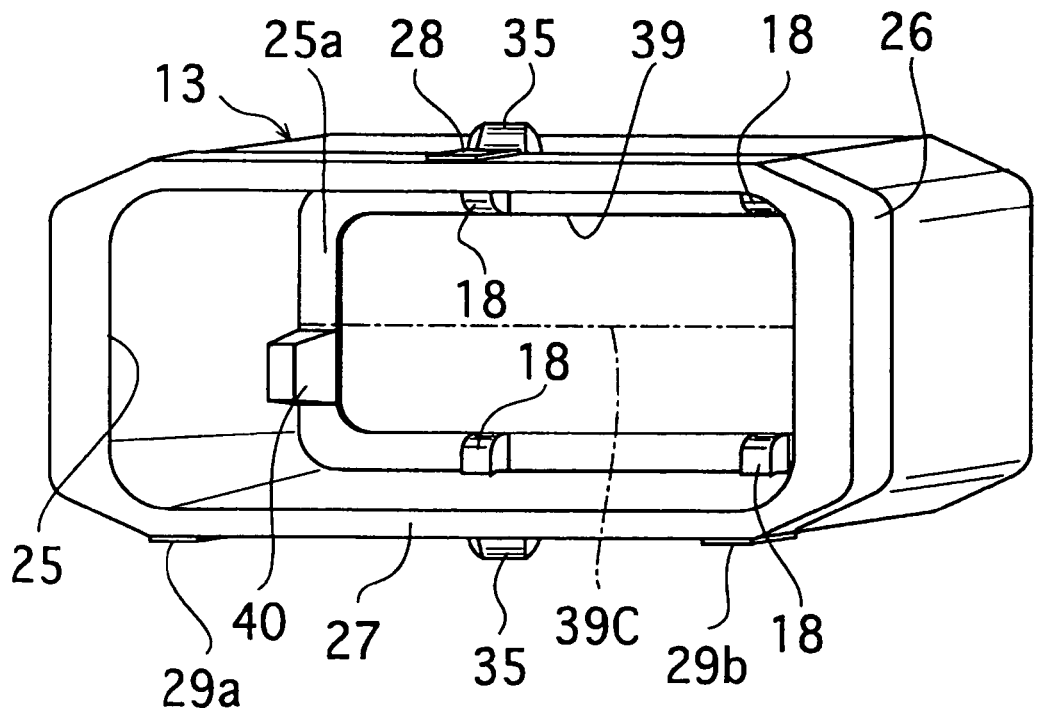
FIG. 8 is a perspective view showing a substrate insertion through-hole 25 of a substrate holder 13.
Figure 10:
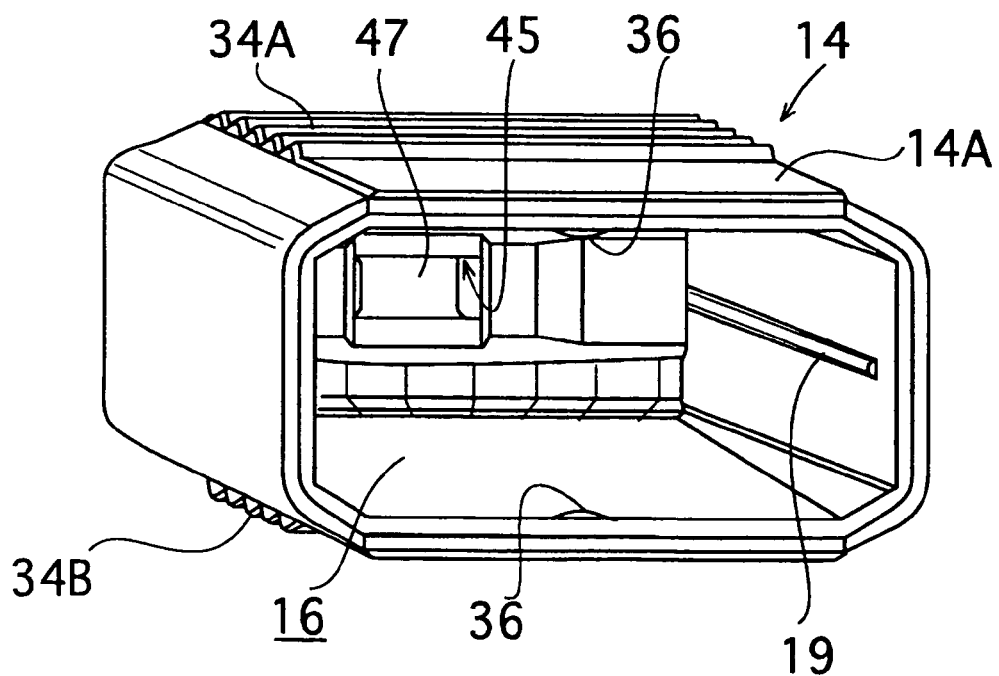
FIG. 10 is a perspective view showing an internal configuration of a cap 14.
Figure 11:
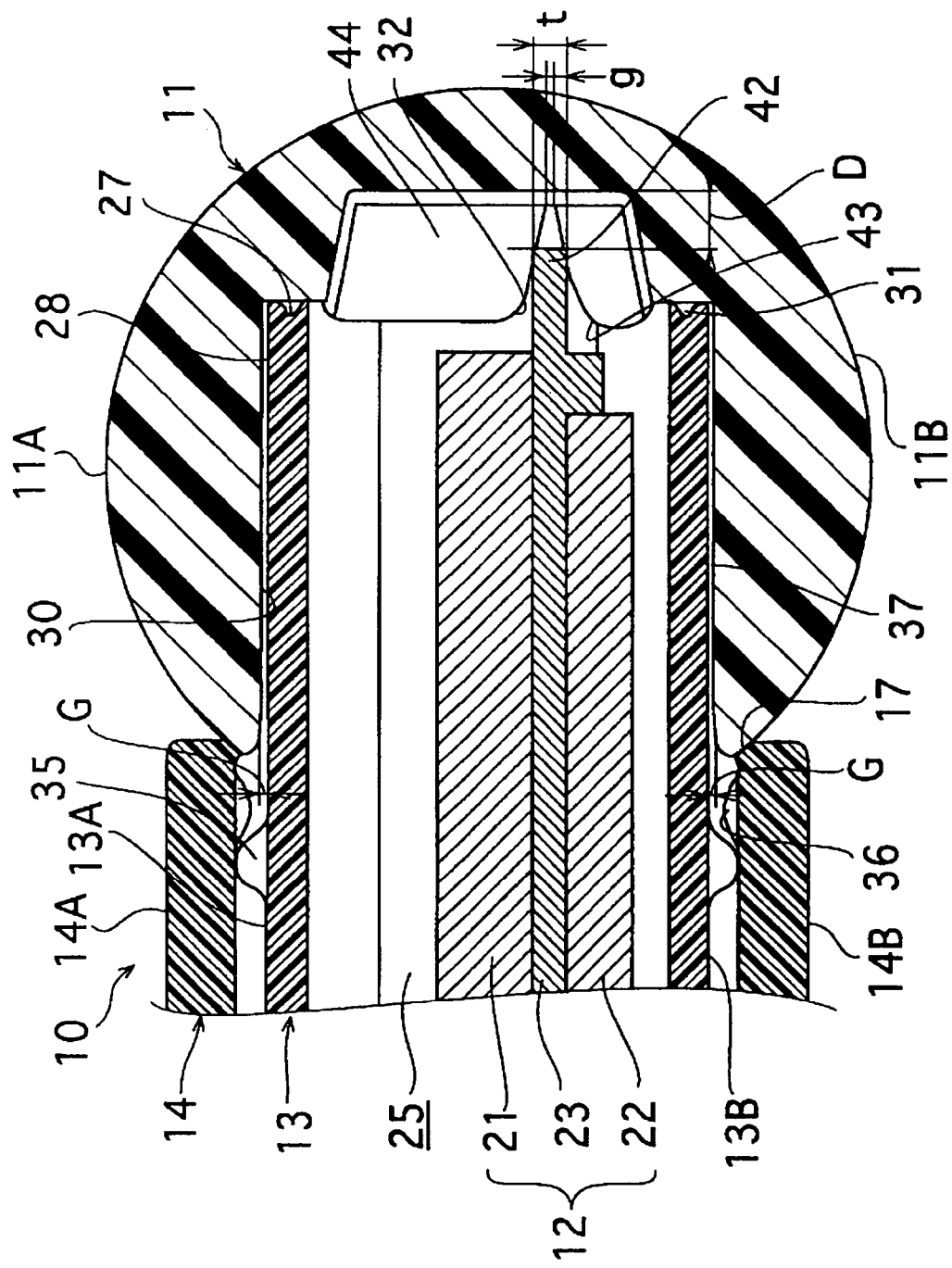
FIG. 11 is a side cross-sectional view of essential portion side of an external storage apparatus 10.
Figure 12:
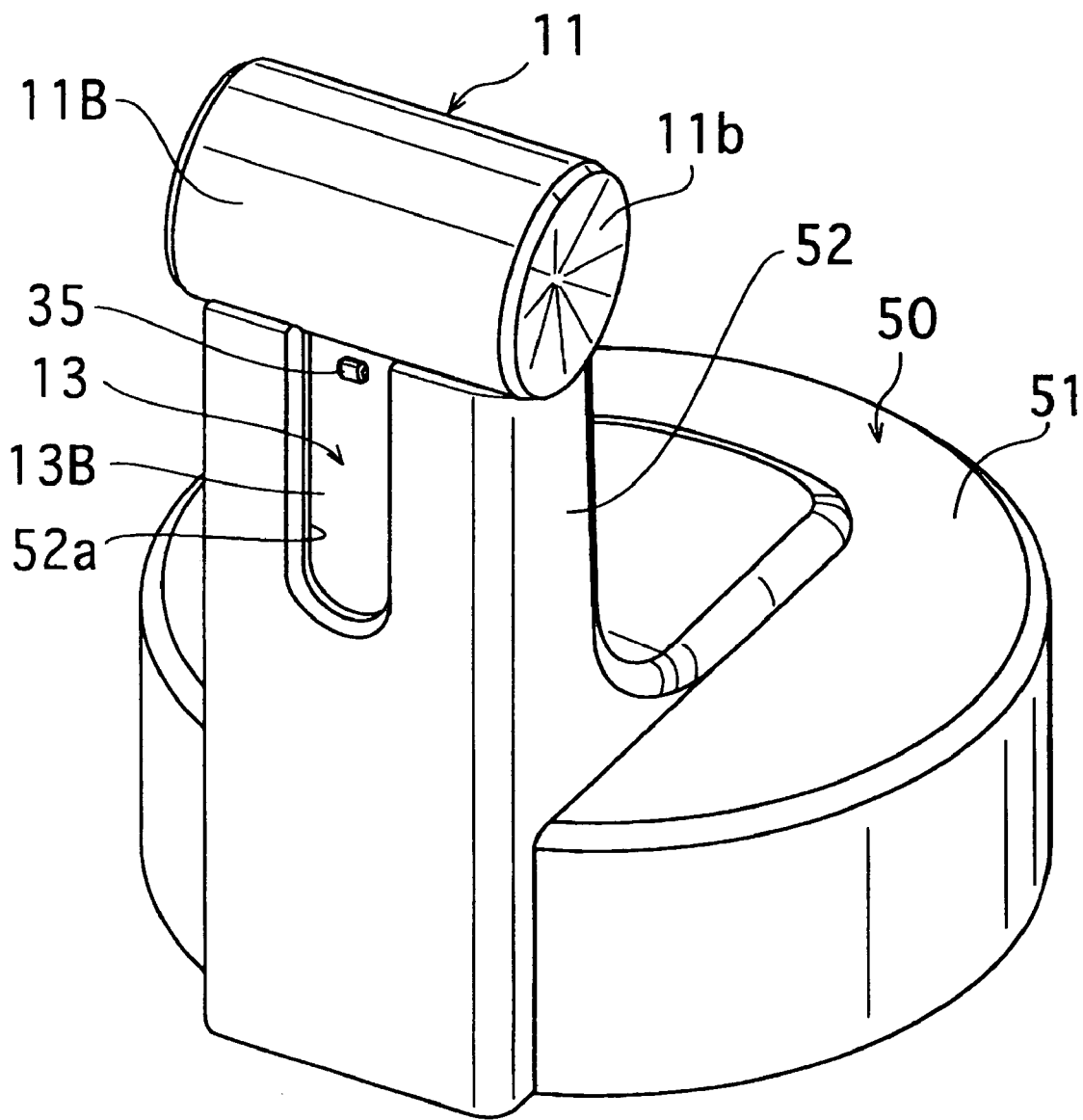
FIG. 12 is a perspective view showing an embodiment of an external storage apparatus 10.

Here, FIG. 1 is a plan view of the external storage apparatus 10 (As viewed from the front surface. Same in the following), FIG. 2 is a side view of the same, FIG. 3 is a plan view as viewed with a cap of the external storage apparatus 10 removed, FIG. 4 is a side view of the same, FIG. 5 is a perspective view showing the main body 11-side of the external storage apparatus 10 and a cap 14 separated, FIG. 6 is an exploded perspective view of the external storage apparatus 10, FIG. 7 is a perspective view of a rear surface side of the substrate holder 13, FIG. 8 is a perspective view showing a substrate insertion through-hole 25, FIG. 9 is a front view of the main body 11, FIG. 10 is a perspective view showing an internal configuration for the cap 14, FIG. 11 is a side cross-section of essential potion of the external storage apparatus 10, and FIG. 12 is a perspective view showing an embodiment of the external storage apparatus 10.

Figure 6:
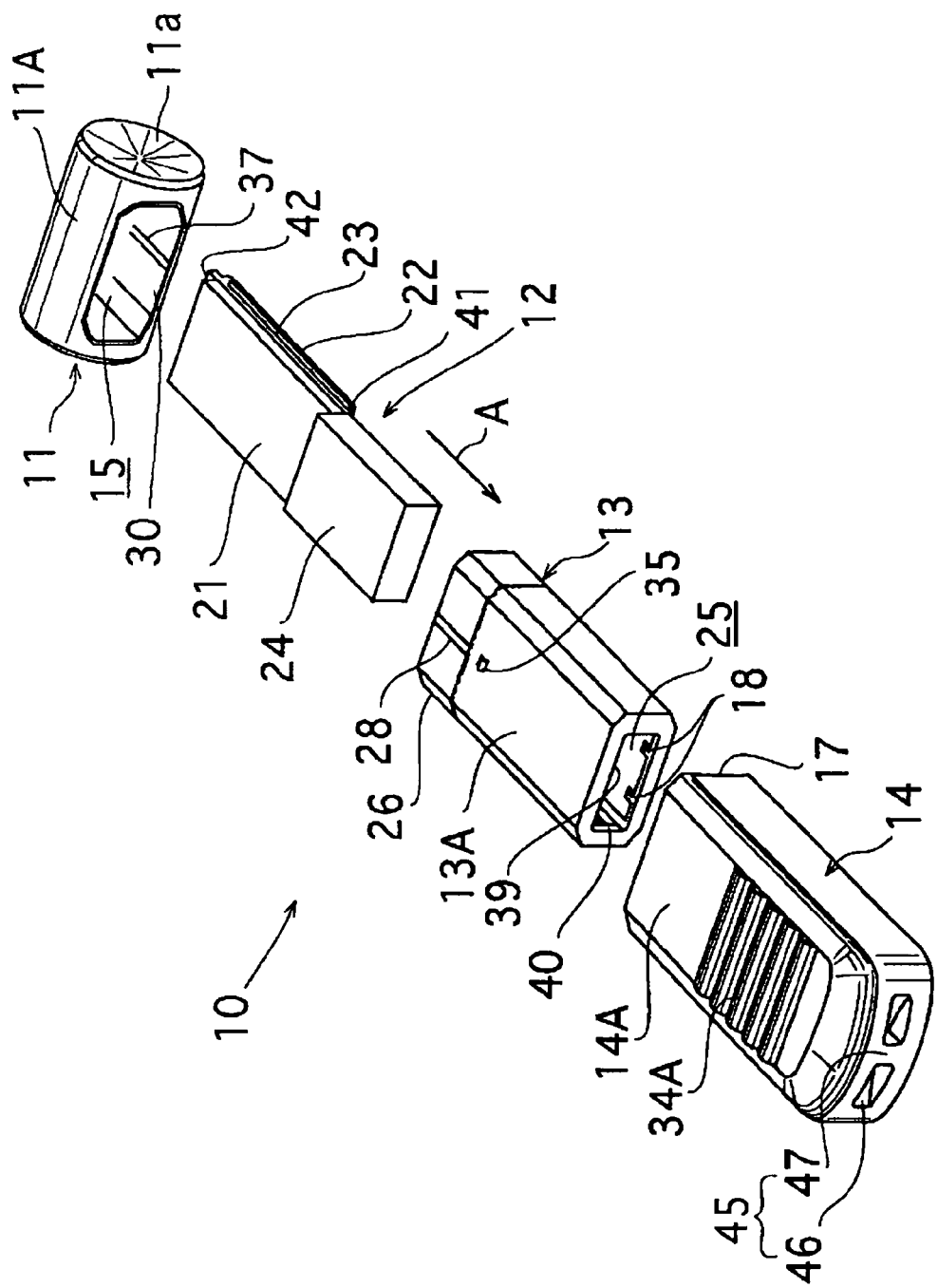
FIG. 6 is an exploded perspective view of an external storage apparatus 10.

The external storage apparatus 10 of this embodiment is comprised mainly of the main body 11, a memory substrate 12, the substrate holder 13 and the cap 14 (FIG. 6).

The main body 11 is an injection molding made of, for example, a colored, opaque polycarbonate resin and formed in a substantially columnar shape having a space 15 within for accommodating the substrate holder 13 (FIG. 6). The outer surface of the main body 11 is painted according to the recording capacity of the external storage apparatus 10 and a logo mark for a manufacturer name is printed at a surface 11A (not shown).

Figure 9:
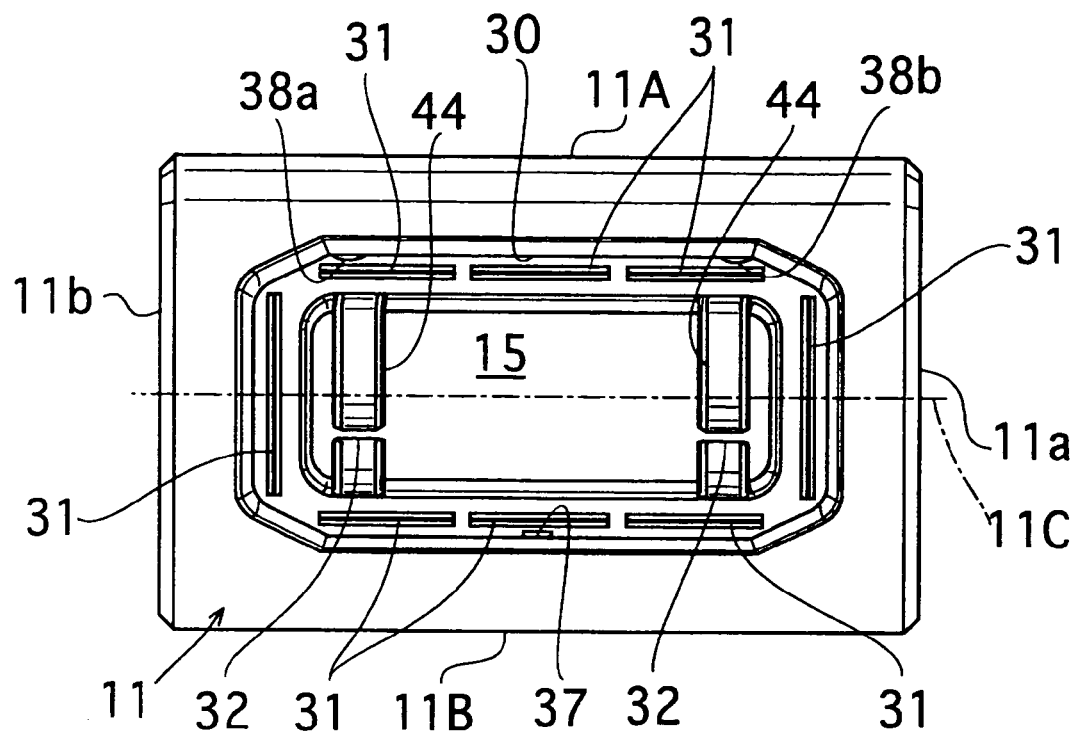
FIG. 9 is front view of a main body 11.

The main body 11 is configured symmetrically in FIG. 9, and a space 15 is opened in the peripheral surface. The shape of the opening of the space 15 is formed symmetrically with respect to the axial center 11C of the main body 11 in accordance with the cross-sectional shape of an end region 26 of the substrate 13 described later. A plurality of liner restricting ribs 37, 38a and 38b are provided at an inner-wall surface of the space 15. Further, the ends 11a and 11b of the main body 11 present a recess curving in the shape of a curved surface (FIG. 2, FIG. 4 to FIG. 6).

The memory substrate 12 is constructed from, for example, a printed circuit board 23 mounted with semiconductor memory 21 such as flash memory etc. on both sides of a glass epoxy substrate and electronic components 22 such as crystal oscillators and light-emitting diodes etc., and a connector 24 provided as an external connection terminal at one end edge of the surface side of the printed circuit board 23 (FIG. 6). In this embodiment, the side on which the semiconductor memory 21 is mounted is taken as the front surface of the memory substrate 12.

The connector 24 is comprised of metal such as stainless steel etc. for connecting a computer and peripheral equipment, and has a plurality of connection terminals arranged internally. In this embodiment, the connector 24 is configured to conform to a USB (Universal Serial Bus).

The substrate holder 13 is, for example, a smoke-colored, semi-transparent polycarbonate resin injection molding, having a shape that is substantially symmetrical in appearance from front to back (FIG. 4). The surface 13A of the substrate holder 13 is printed, for example, with the recording capacity of the semiconductor memory 21 etc. On the other hand, the back surface 13B of the substrate holder 13 is printed with, for example, a logo etc. conforming with the safety regulations of each country.

The substrate insertion through-hole 25 through which the memory substrate 12 is inserted is formed within the substrate holder 13 (FIG. 6 to FIG. 8). The overall length of the substrate holder 13 is shorter than the overall length of the memory substrate 12 and is formed so that connector 24 and edge 42 of the printed circuit board 23 of the memory substrate 12 project from the openings of the substrate insertion through-hole 25 when the memory substrate 12 is inserted through the substrate insertion through-hole 25 (FIG. 3 to FIG. 5, FIG. 11).

The memory substrate 12 is inserted along the direction of arrow A in FIG. 6 with respect to the substrate insertion through-hole 25 of the substrate holder 13. In this event, as shown in FIG. 3 to FIG. 5, the connector 24 positioned at the front end as viewed from the insertion direction of the memory substrate 12 projects by a predetermined projection amount outwards from an opening 39 at one end of the substrate holder 13. The shape of the opening 39 is formed to correspond with the shape of the connector 24. Further, a central axial line 39C (FIG. 8) in a widthwise direction of the opening 39 is positioned at the same height as the axial center 11C (FIG. 9) of the main body 11.

A stepped section 41 (FIG. 6) restricting the extent of projection of the connector 24 with respect to the opening 39 as a result of contact being made with a pair of left and right stoppers 40, 40 (FIG. 6, FIG. 8) formed in the vicinity of the opening 39 within the substrate insertion through-hole 25 is provided at the outer periphery of the memory substrate 12. In this embodiment, the stepped section 41 is formed at both corners of the edge of the side on which the connector 24 is provided of the printed circuit board 23 formed with a slightly broader width than the connecter 24.

In particular, as shown in FIG. 8, the stoppers 40, 40 are provided positioned so as to be offset to the side of the rear surface 13B with respect to the central axial line 39C in the width direction of the opening 39 of the substrate holder 13. The extent of the offset corresponds to the distance between each of the axial centers of the connector 24 and the printed circuit board 23.

When the memory substrate 12 is inserted through the substrate insertion through-hole 25 back to front, the stepped section 41 of the memory substrate 12 does not make contact with the stopper 40 within the substrate insertion hole 25 but does make contact with a bottom part 25a of the substrate insertion through-hole 25. In this event, it is possible to recognize that a worker has assembled in an erroneous manner as a result of the extent of projection of the connector 24 from the opening 39 substantially exceeding a predetermined amount.

A plurality of support sections 18 for supporting the connector 24 of the memory substrate 12 inserted through the substrate insertion through-hole 25 are provided within the opening 39 of the substrate holder 13, with inclination of connector 24 by external force acting in the direction of thickness of the connector 24 with respect to the opening 39 being suppressed by these support sections 18.

A plurality of liner ribs 28, 29a and 29b for uniformly maintaining a gap G with the inner wall surface 30 of the space 15 during insertion into the space 15 are provided at the end region 26 at the side of the substrate holder 13 that is fitted through insertion into the space 15 of the main body 11 (FIG. 6, FIG. 7, FIG. 11). The liner ribs 28, 29a and 29b are provided along the direction of insertion of the substrate holder 13 with respect to the space 15.

Of these, the liner rib 28 is provided on the surface 13A side of the substrate holder 13, and the liner rib 29a and liner rib 29b are provided at the rear surface 13B of the substrate holder 13 (FIG. 6, FIG. 7).

In particular, the liner rib 28 on the side of the substrate holder surface 13A corresponds to the position of forming the restricting rib 37 provided at the wall surface of the inner side of the rear surface 11B of the space 15 of the main body 11 shown in FIG. 9. The liner rib 29a and liner rib 29b on the side of the substrate holder rear surface 13B correspond to forming positions of the restricting rib 38a and restricting rib 38b provided at the inner wall surface at the side of the surface 11A of the space 15 of the main body 11 shown in FIG. 9.

In this embodiment, the heights of the liner ribs 28, 29a and 29b and the restricting ribs 37, 38a and 38b are each taken to be the same, and are set at, for example, 0.03 mm to 0.07 mm.

As shown in FIG. 9, a plurality of welding ribs 31 are provided at the bottom part of the space 15 of the main body 11 into which the end region 26 of the substrate holder 13 is fitted through insertion. These welding ribs 31 are arranged so as to be interspersed at a total of eight locations corresponding to opposing positions of the welding surfaces 27 so as to make contact with the welding surfaces 27 of the end region 26 of the substrate holder 13 (FIG. 7, FIG. 8).

Substantially V-shaped holding grooves 32 for holding the edge section 42 of the memory substrate 12 through sandwiching are provided at a portion facing the other end edge (the edge of the printed circuit board 23 on the opposite side to the connector 24) 42 of the memory substrate 12 (FIG. 9, FIG. 11). The ends 43 of the open sides of the holding grooves 32 are implemented through R-processing to enable the memory substrate 12 to advance more easily.

The holding grooves 32 are formed in a mortar shape as shown in FIG. 11 with respect to a pair of ribs 44, 44 formed integrally at the bottom part of the space 15 so as to extend in a direction intersecting the edge section 42 of the memory substrate 12, so as to form a shape such that a gap gradually becomes smaller along the direction of advancement of the edge section 42 of the memory substrate 12. While the welding surface 27 of the substrate holder 13 is being fixed to the bottom part of the space 15 via the welding ribs 31, a predetermined clearance D is formed between the bottom part of the holding grooves 32 and the edge section 42 of the memory substrate 12 held by sandwiching at the bottom parts of the holding grooves 32 and the holding grooves 32 (FIG. 11).

Here, the memory substrate 12 is formed by punch processing etc. employing a press, but cases where the precision of dimension is poor because of gradual changes in the cross-sectional shape due to abrasion of the punches and dies, and in this embodiment, variation in dimensions in the longitudinal direction of the memory substrate 12, is approximately, for example, ±0.1 mm. Further, variation in welding depth of the welding ribs 31 on the side of the main body 11 with respect to the welding surface 27 of the substrate holder 13 is also approximately, for example, ±0.05 mm, and as the variation in dimensions of the main body 11 and the substrate holder 13 constituting injection molded components is approximately, for example, ±0.05 mm, so as to give a total variation in dimensions of ±0.25 mm or more.

In this embodiment, the variation in dimensions is absorbed by the holding grooves 32 in the above configuration. As a result, if the size of the clearance D is, for example, set to 0.5 mm in a situation where there is no variation in dimension, the magnitude of the variation in dimensions therefore changes between 0.25 mm to 0.75 mm.

Namely, referring to FIG. 11, a size g of a gap occurring at the bottom parts of the holding grooves 32 formed in mortar shapes is formed so to be smaller than a thickness t of the memory substrate 12, so that the memory substrate 12 is supported through sandwiching with the holding grooves 32 in a plastically deformed state as shown in the drawings. Further, even case that the memory substrate 12 incurring the influence of the variations in dimensions advances in a shallow manner with respect to the holding grooves 32, the memory substrate 12 causes the holding grooves 32 to undergo plastic deformation so as to be supported through sandwiching.

The holding grooves 32 are formed at positions offset to the side of the rear surface 11B with respect to the axial center 11C of the main body 11 as shown in FIG. 9. The extent of the offset corresponds to the distance between each of the axial centers of the connector 24 and the printed circuit board 23 at the memory substrate 12.

Therefore, when the memory substrate 12 is inserted into the space 15 of the main body 11 back to front, the edge section 42 of the memory substrate 12 comes into contact with the top part of the rib 44. In this event, as a result of the edge section 42 of the memory substrate being held sandwiched by the holding grooves 32, the advancement of the memory substrate 12 into the space 15 is restricted, and it is possible for erroneous assembly to be identified by a worker.

Further, even if this erroneous assembly is overlooked, the welding surface 27 of the substrate holder 13 does not reach the bottom part of the space 15 because the memory substrate 12 does not advance within the holding grooves 32. As a result, this may cause defects in welding of the main body 11 and the substrate holder 13 and there is the possibility that completion of the product with the erroneous assembly may be hindered.

In the above, "erroneous assembly restricting means" of the present invention is constructed, which restricts the assembly if the assembly posture of the memory substrate 12 with respect to the main body 11 is not appropriate.

Next, a description is given of a configuration of a cap 14 for protecting the connector 24 from damage and from dust etc. becoming attached when the external storage apparatus 10 is not in use.

The cap 14 is formed of, for example, an opaque polycarbonate resin injection molding. The cap 14 is substantially symmetrical in appearance from front to rear as shown in FIG. 2. Wave-shaped finger grips 34A and 34B performing a slip prevention function during the operation of attachment to and detachment from the substrate holder 13 are formed at the surface 14A and rear surface 14B of the cap 14.

A space 16 for housing the substrate holder 13 is formed within the cap 14. An opening inner edge 17 of the space 16 provides a shape corresponding to the peripheral surface of the main body as shown in FIG. 11, and is provided with a seal section tightly sealing the outer periphery of the main body at the time of installation to the substrate holder 13 so as to prevent penetration of dust and dirt to within.

Further, although only one side is shown in FIG. 10, guide ribs 19 for providing smooth connecting at the side sections of the substrate holder so as to guide attachment and detachment of the cap 14 are provided at the left and right side surfaces of the space 16.

Moreover, mutually engaging first and second engaging projections 35 and 36 are provided at the inner surfaces of the surface 13A and rear surface 13B of the substrate holder and the surface 14A side and rear surface 14B side of the cap 14 in order to provide a clicking feeling in the operation of attaching or detaching the cap 14 to or from the substrate holder 13 (FIG. 3 to FIG. 6, FIG. 10, FIG. 11). In this embodiment, the first and second engaging projections 35 and 36 are provided respectively at two locations.

A through-hole 45 for passing a strap through is formed at the tip of the cap 14 (FIG. 5, FIG. 6). The through-hole 45 is comprised of a groove 46 formed at the tip of the cap 14 and a bridging section 47 bridging with the groove 46. The strap can therefore be fastened using the bridging section 47.

Next, a description is given of a method for assembling the external storage apparatus 10 of this embodiment configured in the above manner.

First, after the surfaces of the memory substrate 12 and the substrate holder 13 are made to face each other in the same direction with appropriate assembly postures, as shown in FIG. 6, the memory substrate 12 is inserted through the substrate insertion through-hole 25 of the substrate holder 13 along the direction of arrow A. When the connector 24 of the memory substrate 12 is passed through the opening 39 of the substrate insertion through-hole 25 a predetermined amount, the stepped section 41 of the memory substrate 12 comes into contact with the stopper 40 within the substrate insertion through-hole 25, so as to restrict advancement of the memory substrate 12 beyond this point.

Next, the surface 13A of the substrate holder 13 housing the memory substrate 12 and the surface 11A of the main body 11 are arranged so as to face in the same direction with appropriate assembly postures. The substrate holder 13 is then inserted into the space 15 of the main body 11, and the welding surface 27 of the substrate holder 13 and the welding ribs 31 of the bottom section of the space 15 are welded using ultrasonic welding techniques. As a result, the main body 11 and the substrate holder 13 are fixed together with the connector 24 projecting outwards from the opening 39 of the substrate insertion through-hole 25.

At this time, the assembly posture of the substrate holder with respect to the main body 11 is correct, and as there is no mutual contact between the liner ribs 28, 29a and 29b and the restricting ribs 37, 38a and 38b, the advancement of the substrate holder 13 to within the space 15 of the main body 11 is not restricted.

At this time, the edge section 42 at the other end of the memory substrate 12 is held sandwiched by the holding grooves 32 provided at the bottom part of the space 15 of the main body 11. Because the holding grooves 32 exhibit substantially V-shapes, even if variation (variation in the dimensions of the printed circuit board 23 itself, variations in the ultrasonic welding conditions themselves, etc.) in the extent of the advancement of the memory substrate occurs, the extent of plastic deformation of the holding grooves 32 changes accordingly so as to absorb the variation. As a result, the memory substrate 12 can be reliably positioned between the stopper 40 of the substrate insertion through-hole 25 of the substrate holder 13 and the holding grooves 32 within the main body 11.

The memory substrate 12 is therefore prevented from making a rattling sound at the time of carrying the external storage apparatus 10, and the user is not subjected to anxiety or unpleasantness with regards to functionality. Further, peeling of the joining material (solder) for the substrate-mounted components due to vibration at the time of welding and damage to the semiconductor memory 21 and liquid crystal oscillators etc. being precision electronic components is prevented, and accurate functions for recording/storing various types of data and sound/images etc. can be ensured.

Next, the main body 11 and cap 14 integrated with the substrate holder 13 are made to face each other. At this time, there are no restrictions placed on the assembly postures of both items. The substrate holder 13 is then housed in the space 16 of the cap 14 through a sliding action between the guide ribs 19 and the side surfaces of the substrate holder 13 in order to install the cap 14 at the substrate holder 13.

When the slide length of the cap 14 with respect to the substrate holder 13 reaches a predetermined amount, the first and second engaging projections 35 and 36 engage. Namely, the first engaging projection 35 on the side of the substrate holder 13 rides over the second engaging projection 36 so as to push the cap 14 outwards so as to become broader, so that the first and second engaging projections 35 and 36 engage with each other as shown in FIG. 11. As a result, the operation of installing the cap 14 to the substrate holder 13 is complete.

According to the external storage apparatus 10 of this embodiment, even if attempts are made to assemble with an erroneous (inappropriate) assembly posture where the substrate holder 13 is mistakenly the wrong way around with respect to the main body 11, it is possible for the liner rib 28 on the side of the substrate holder 13 and restricting ribs 37 on the side of the main body 11 and the liner ribs 29a and 29b on the side of the substrate holder 13 and the restricting ribs 38a and 38b on the side of the main body 11 to come into contact with each other so as to enable prevention of assembly of the substrate holder 13 to the main body 11.

Further, even when the assembly posture between the main body 11 and the substrate holder 13 is appropriate, it is assumed that there may also be cases where the assembly posture between the substrate holder 13 and the memory substrate 12 is not appropriate. In this event, it is possible to restrict the advancement of the memory substrate 12 to the main body 11 using the ribs 44 of the bottom section of the space 15 so as to make it possible to avoid erroneous assembly of the memory substrate 12 to the main body 11.

As a result, erroneous assembly of components is prevented, and degradation of products due to erroneous assembly and variation in the quality of products can be avoided. With this configuration, particularly striking results are demonstrated for the external storage apparatus 10 of this embodiment that is small compared to the external storage apparatus 1 of the related art (FIG. 23), the occurrence of erroneous assembly caused by the smallness of the components is reliably avoided, and reliability of the product is increased.

There is a tendency for the operation of attaching and detaching the cap to and from the main body (substrate holder) to become more difficult as the components become smaller. However, according to this embodiment, as a result of forming recessed curved surfaces at the left and right ends 11a and 11b of the main body 11 and providing wave-shaped finger grips 34A and 34B at the front and rear surfaces 14A and 14B of the cap 14, it is possible to suppress deterioration of the ease with which the cap 14 is attached and detached.

Further, as the components become smaller, there is the fear that the strength of connections is insufficient due to the lowering of the soldering surface area between the main body and the substrate holder. However, according to this embodiment, not only is there a welding action between the welding surface 27 of the substrate holder 13 and the welding ribs 31 within the main body 11, but also at least part of the restricting ribs 37, 38a and 38b constituting the "restricting sections" of the present invention or at least part of the liner ribs 28, 29a and 29b on the side of the substrate holder 13 can be made to function as welding ribs so as to prevent a reduction in connection strength.

Further, the liner ribs 28, 29a and 29b on the substrate holder side 13 are formed with one on the surface 13A of the substrate holder 13 and two on the rear surface 13B. The number of liner ribs formed can therefore be used to confirm the front and rear through visual confirmation. This is effective in identifying the front and rear when the surface 13A and rear surface 13B of the substrate holder 13 is subjected to different painting or printing, so as to improve operability.

FIG. 12 shows an example of applying the external storage apparatus 10 of the above configuration to an auxiliary holder 50 equipped with a USB cable extension function referred to as a "cradle".

The auxiliary holder 50 is equipped with a USB cable (not shown) for connecting to a USB port of a personal computer, a drum 51, and an insertion section 52 installed erect with respect to the drum 51, into which the external storage apparatus 10 is inserted with the cap removed. Terminals connecting with the connector of the external storage apparatus 10 are provided within the insertion section 52. A window 52a is provided at the peripheral surface of the insertion section 52, so as to partially expose the surface 13A of the substrate holder 13 to the outside.

By employing this auxiliary holder 50, use of the external storage apparatus 10 and a personal computer is possible without providing a direct connection between the external storage apparatus 10 and the personal computer.

Second Embodiment

FIG. 13 to FIG. 17 show a second embodiment of the present invention. In the drawings, portions corresponding to the first embodiment described above are given the same numerals and a detailed description thereof is omitted.

Figure 13:
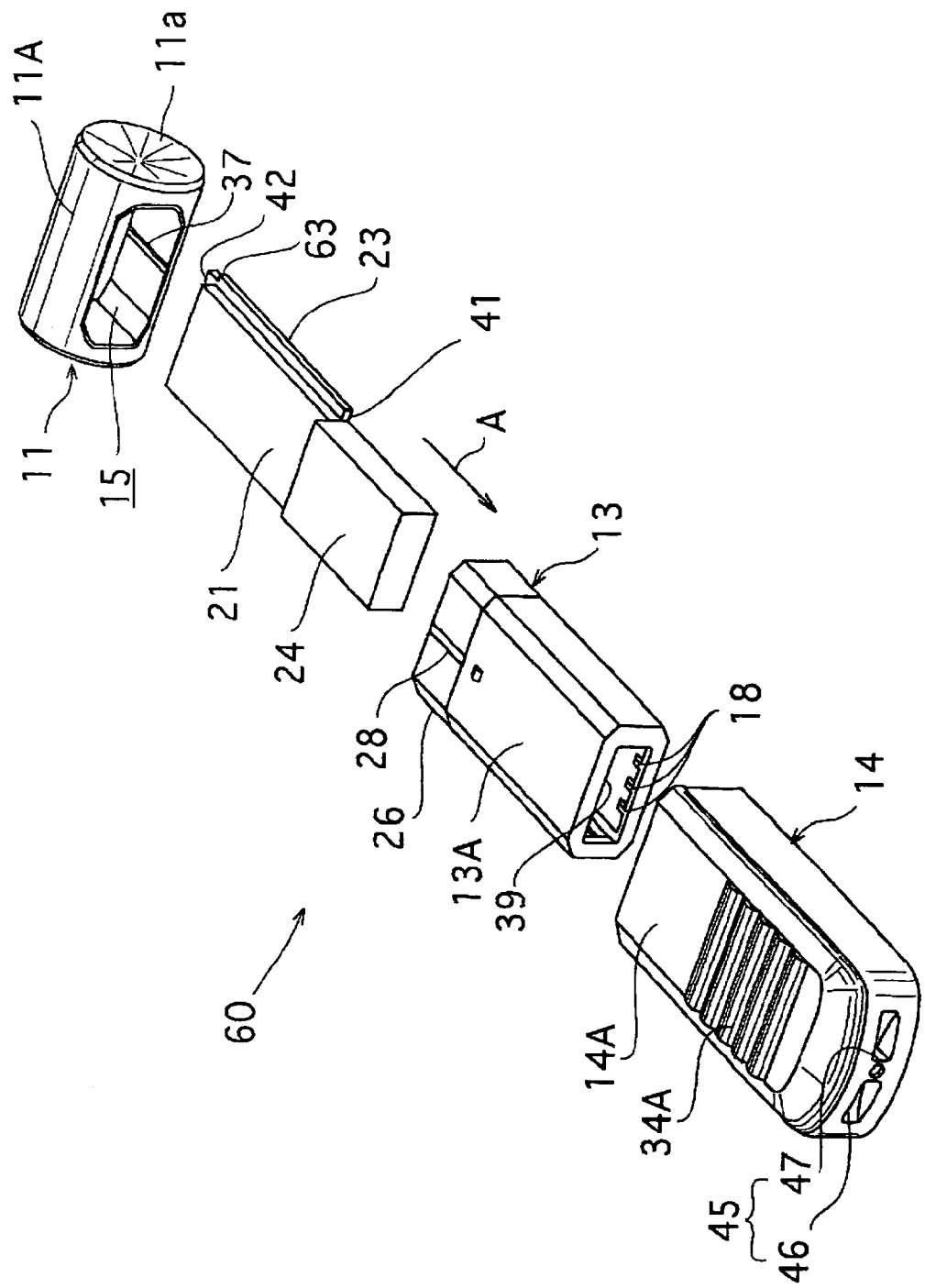
FIG. 13 is an exploded perspective view of an external storage apparatus 60 according to a second embodiment of the present invention.

As with the external storage apparatus 10 of the first embodiment described above, an external storage apparatus 60 of this embodiment is comprised of a main body 11, memory substrate 12, substrate holder 13, and cap 14, and the memory substrate is comprised of a printed circuit board 23 mounted with a semiconductor memory 21 etc. and a connector 24 as an external terminal connector (FIG. 13).

In particular, in this embodiment, the printed circuit board 23 is formed so as to be broader widthwise than that of the first embodiment described above.

Figure 14:
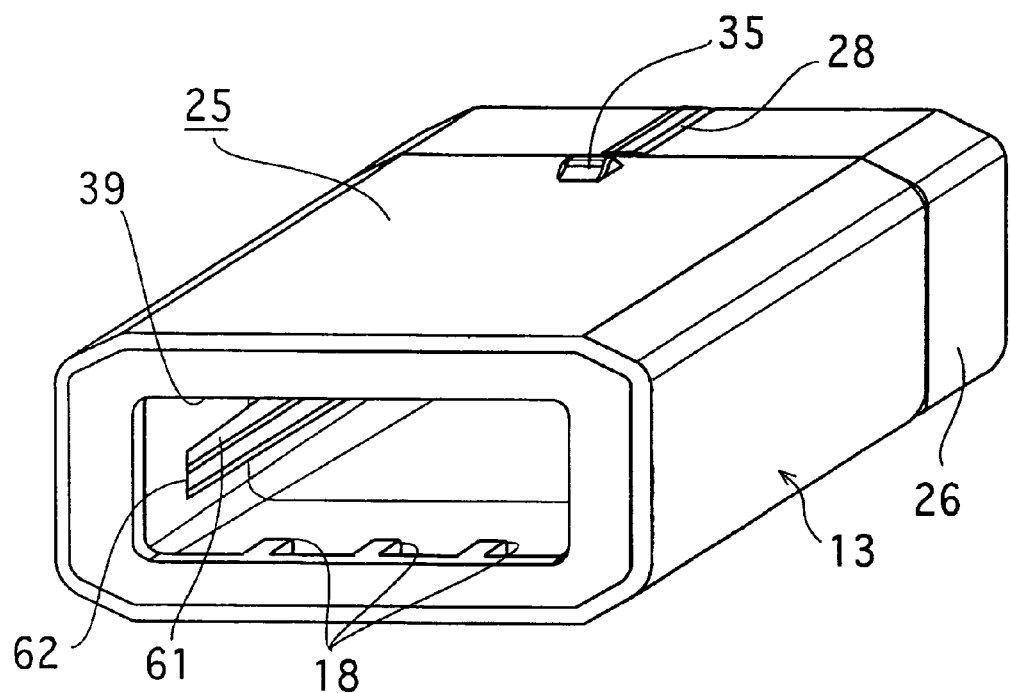
FIG. 14 is a perspective view showing a substrate holder 13 of an external storage apparatus 60 as viewed from an opening 39 at one end side.
Figure 15:
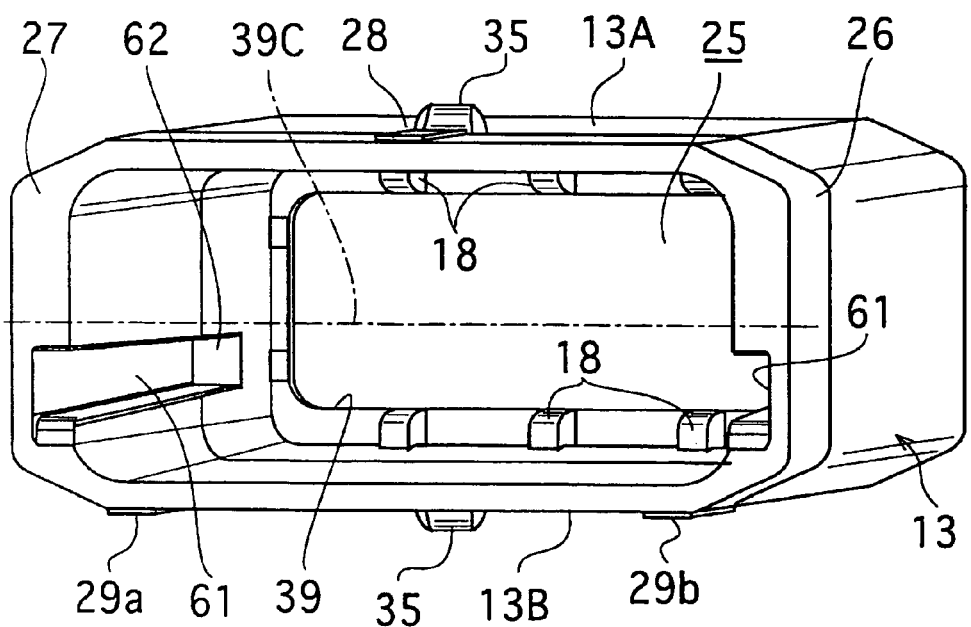
FIG. 15 is a perspective view showing of a substrate holder 13 as viewed from an opening at the other end side.

On the other hand, guide sections 61, 61 with which the left and right edges of the printed circuit board 23 of the memory substrate 12 engage are formed at the left and right side surfaces of the substrate insertion through-hole 25 of the substrate holder 13 (FIG. 14, FIG. 15). The guide sections 61, 61 are formed as liner grooves formed at positions offset to the rear surface 13B with respect to the central axial line 39C (FIG. 15) in a width direction of opening 39 at one end of the substrate holder 13. The extent of the offset corresponds to the distance between each of the axial centers of the connector 24 and the printed circuit board 23.

The guide sections 61, 61 have a function for guiding the advancement of the memory substrate 12 towards the substrate holder 13 in the case that the assembly posture of the memory substrate 12 is appropriate with respect to the substrate holder 13. Therefore, even if the memory substrate 12 is inserted into the substrate insertion through-hole 25 back to front, it is possible for a worker to identify that assembly is erroneous because engaging of the memory substrate 12 and the guide sections 61, 61 is not possible.

Open ends of the guide sections 61, 61 are formed with comparatively broad widths and ease of assembly with the memory substrate 12 is ensured. On the other hand, the guide sections 61, 61 are formed with widths that become gradually narrower, with the stepped section 41 (FIG. 13) of the printed circuit board 23 coming into contact with a closed end 62 so as to restrict the memory substrate 12 from advancing further. As a result, the extent of projection of the connector 24 from the opening 39 at one end of the substrate holder 13 is restricted.

In this embodiment, the connector 24 is assembled to the opening 39 by press-fitting. The magnitude of the pressure for press-fitting is taken to be, for example, about enabling assembly by the manual operation of a worker. As a result, after the memory substrate 12 is assembled to the substrate holder 13 in an appropriate manner, the memory substrate 12 and substrate holder 13 become integral due to the press-fitting action of the connector 24 with respect to the opening 39.

Support sections 18 for supporting the outer peripheral surface of the connector 24 are formed at a plurality of locations (in this example, three on the top and bottom) at the inside edge of the opening 39 so as to restrict inclination of the connector 24 with respect to the opening 39. These support sections 18 are formed in a straight shape (draft angle 0) so as to fit tightly with the outer peripheral surface of the connector 24.

Figure 16:
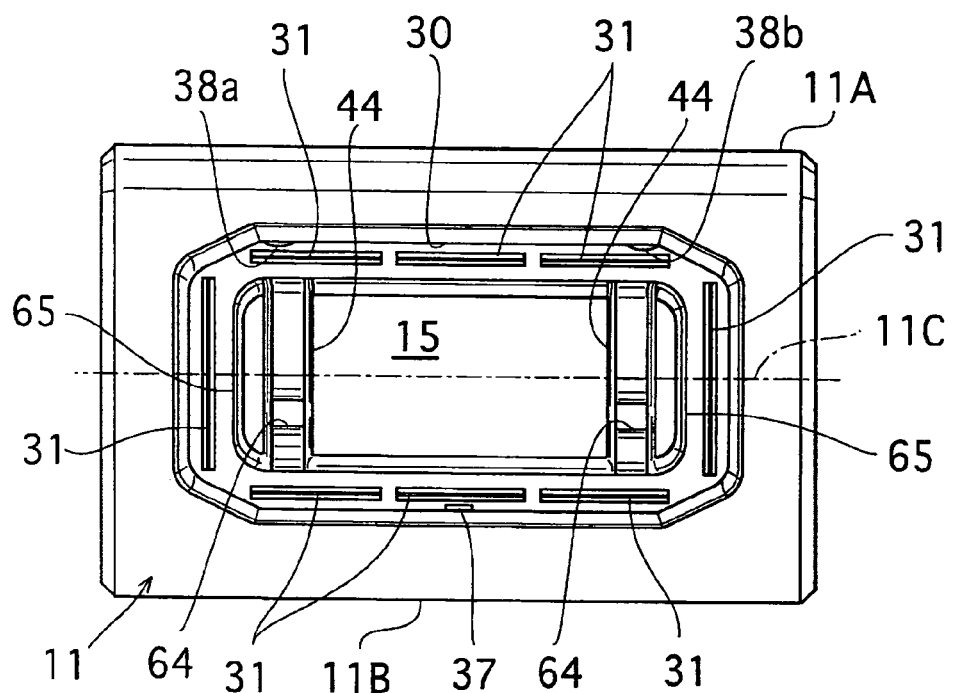
FIG. 16 is front view of a main body 11 of an external storage apparatus 60.
Figure 17:
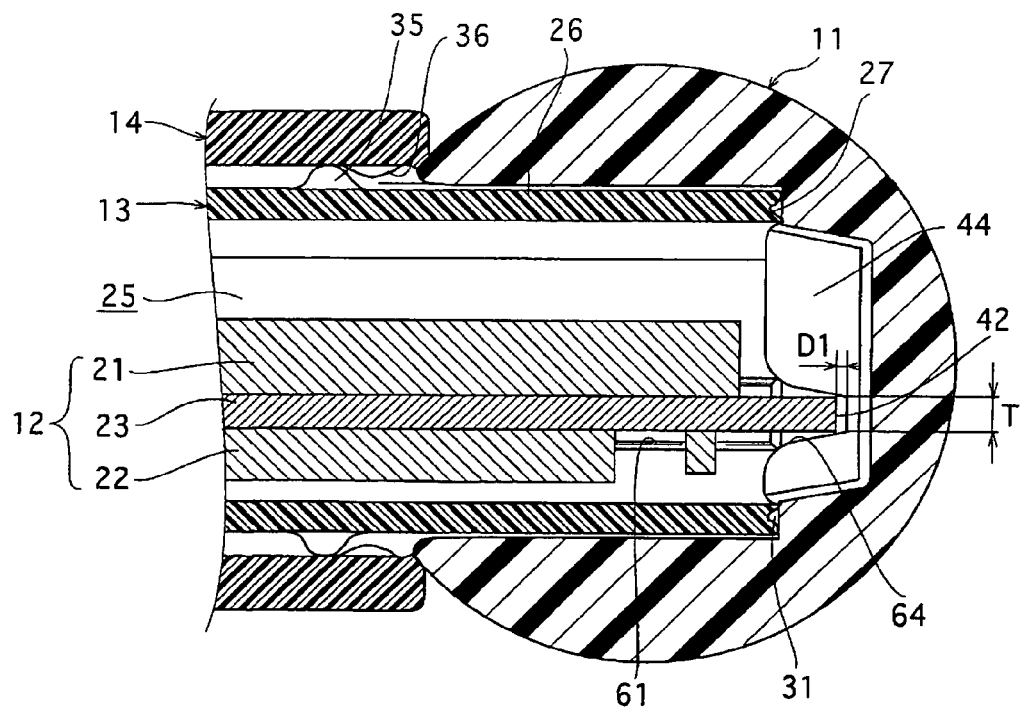
FIG. 17 is a cross-sectional view of essential portion of an external storage apparatus 60.

On the other hand, the edge section 42 at the side of the other end of the memory substrate 12 is formed at the bottom part of the space 15 of the main body 11 so as to advance to slots 64, 64 of the ribs 44 constituting the "erroneous assembly restricting means" of the present invention (FIG. 16, FIG. 17). A stepped section 63 (FIG. 13) formed at both corners of the edge 42 constitutes "clearance" for preventing interference from a stepped section 65 formed between the bottom part of the space 15 of the main body 11 and the surface of forming the welding ribs 31.

As with the holding grooves 32 of the first embodiment above, the slots 64, 64 are provided positioned offset more towards the side of the rear surface 11B than the axial center 11C of the main body 11 and are configured to have the substantially V-shapes but does not support the edge sections 42 of the memory substrate 12 through sandwiching.

Namely, as shown in FIG. 17, groove width T of the bottom parts of the grooves 32 is formed equal to the thickness of the printed circuit board 23. After the substrate holder 13 and the main body 11 are welded, a fixed clearance (gap) D1 is formed between the edge sections 42 of the memory substrate 12 and the bottom part of the grooves 32. The size of the gap D1 is not particularly limited but in this example is to be approximately 0.1 mm.

As a result, change in the length of the memory substrate 12 due to heating at the time of use is permitted to a certain extent so as to enable stress of the memory substrate 12 to be alleviated. Further, there is no rattling of the memory substrate 12 because the connector 24 is supported by the opening 39 at one end of the substrate holder 13 through press-fitting. It is also possible to alleviate stress of the memory substrate 12 when external force is acting on the connector 24 because change in curvature of the memory substrate 12 within the groove width of the guide sections 61 of the substrate holder 13 is permitted. Damage to the substrate mounted components and destruction of connecting portions can therefore be prevented, and protection of recorded information is achieved.

There is possibility of back and forth movement of the memory substrate 12 within the range of the gap D1 while connecting the connector 24 to a USB port of a computer etc. However, the gap D1 is extremely small approximately 0.1 mm, and is accompanied by a sliding action due to press-fitting of the connector 24 and the opening 39. Rattling of the memory substrate 12 during handling and an unnatural feeling during attachment and detachment is not conveyed to the user.

Third Embodiment

FIG. 18 to FIG. 33 show an external storage apparatus 110 of a third embodiment of the present invention.

Figure 18:
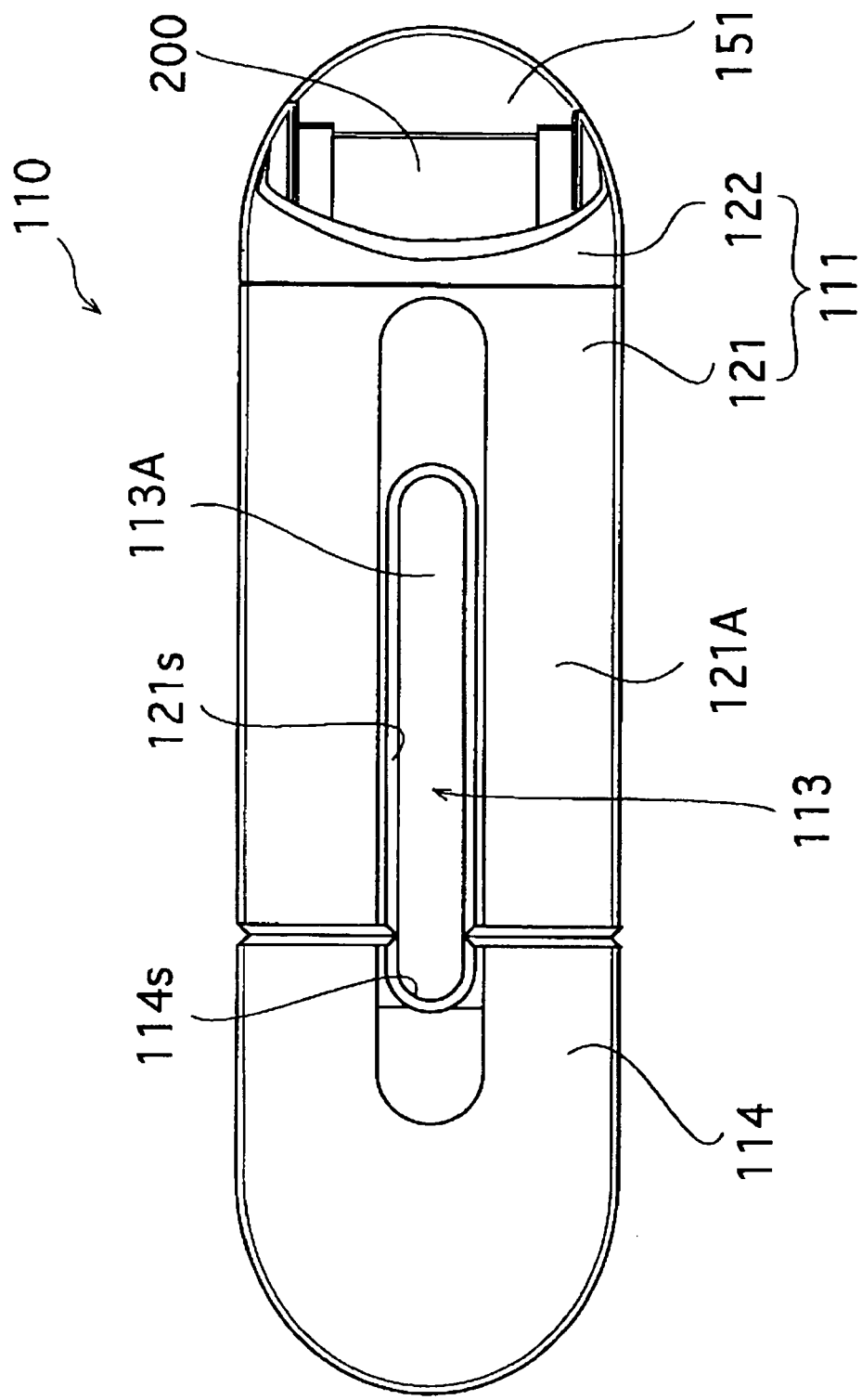
FIG. 18 is a plane view showing an external storage apparatus 110 according to a third embodiment of the present invention.
Figure 19:
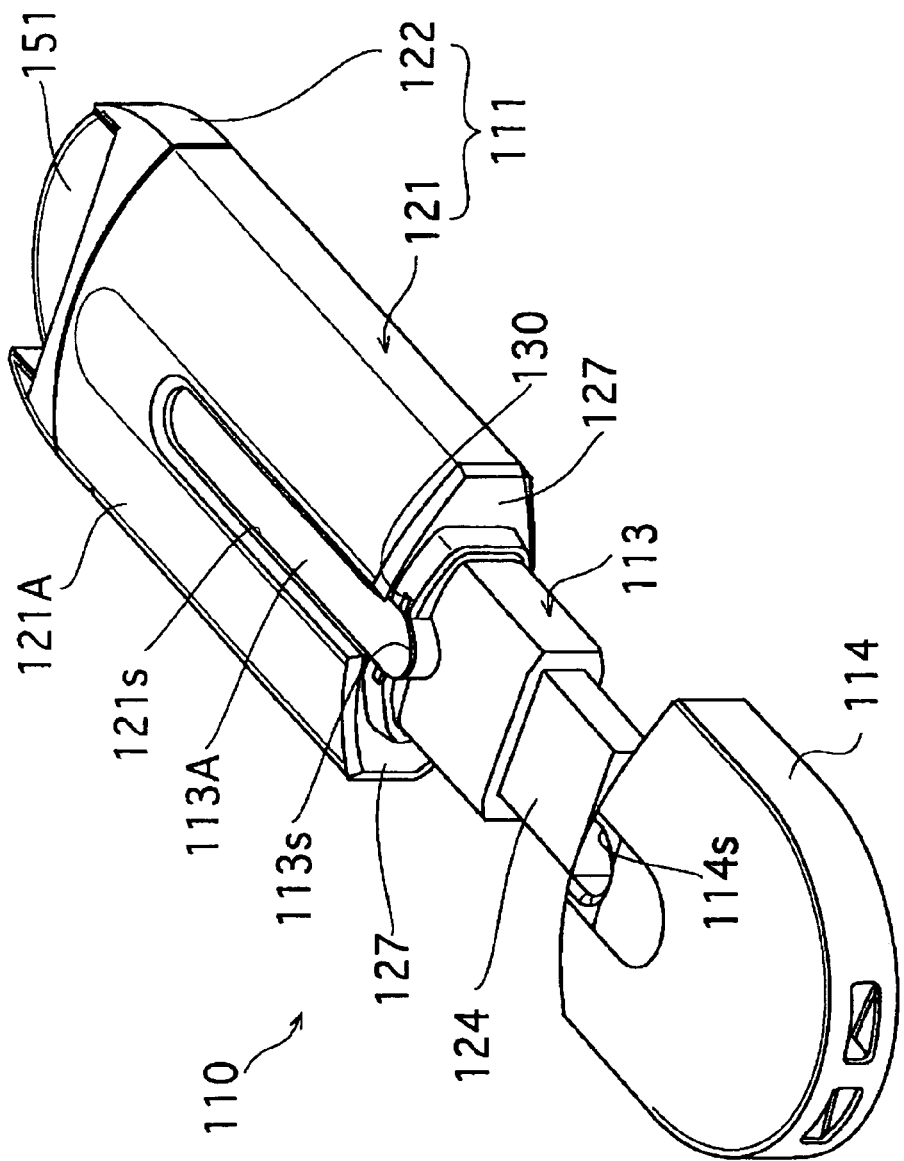
FIG. 19 is a perspective view showing an external storage apparatus 110 as viewed with a cap removed.
Figure 20:
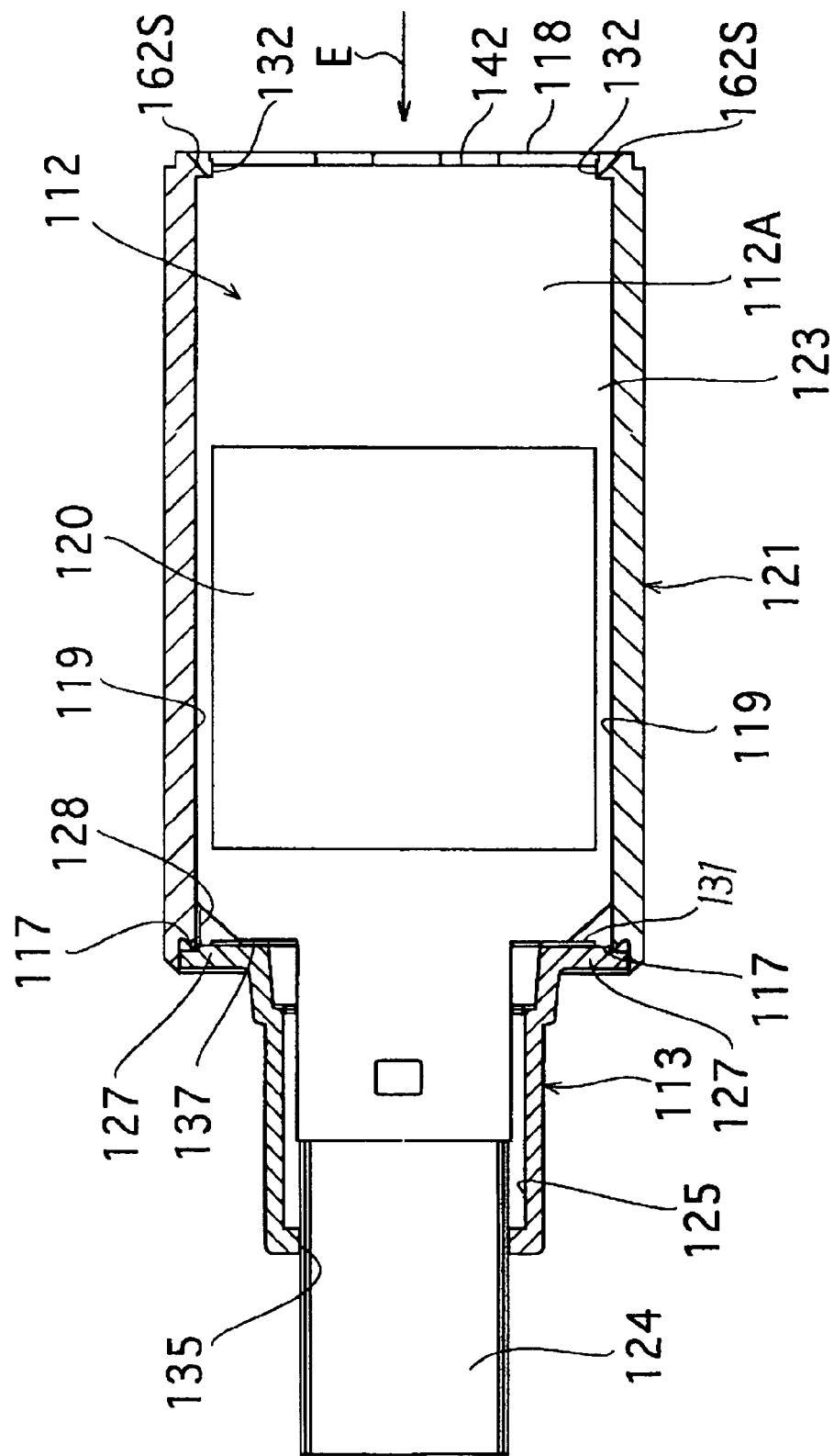
FIG. 20 is a cross-sectional view showing a structure for supporting a memory substrate 112 with respect to a first main body 121.
Figure 21:
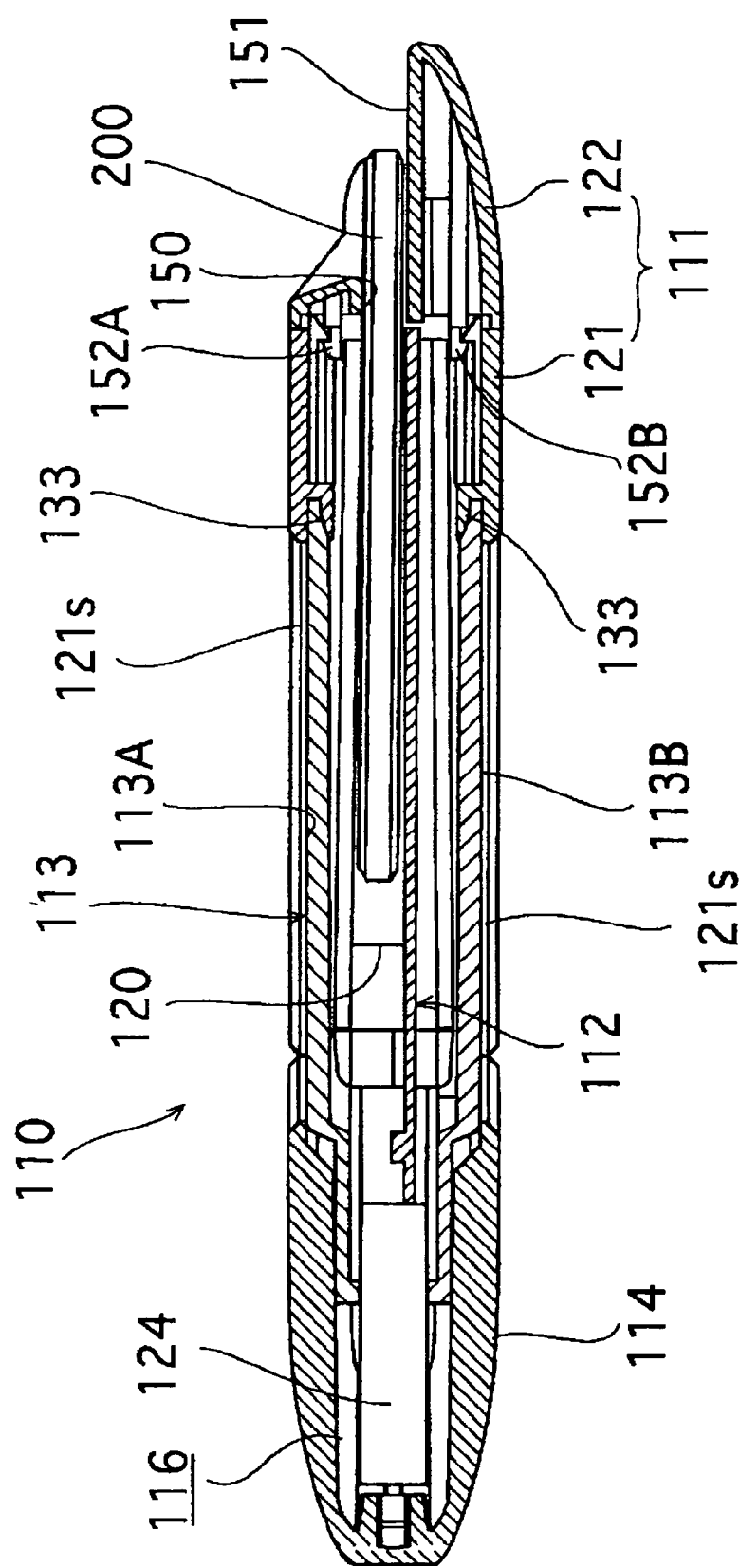
FIG. 21 is a side cross-sectional view of an external storage apparatus 110.
Figure 22:
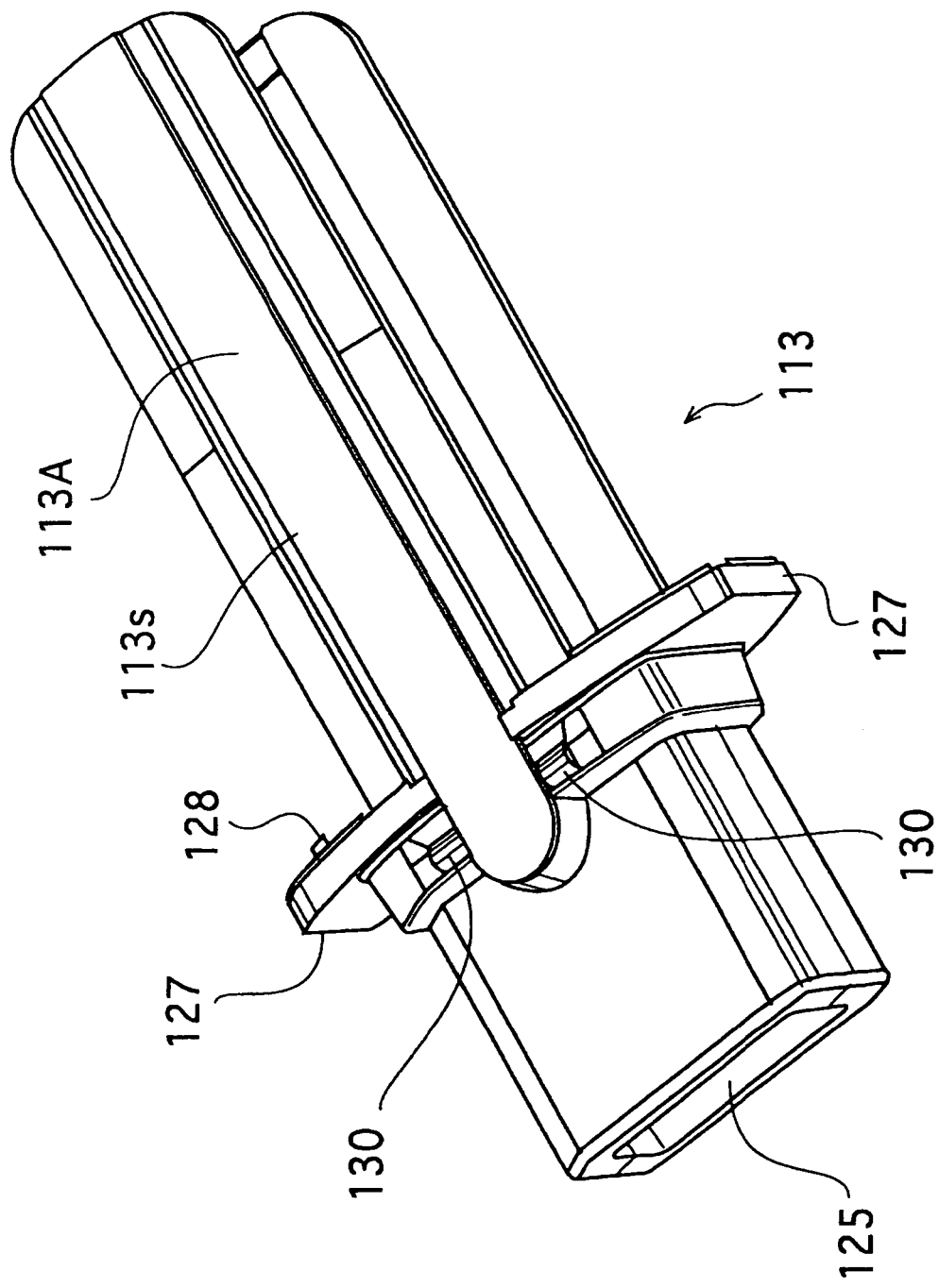
FIG. 22 is a perspective view showing a substrate holder 113 as viewed from the front side.
Figure 23:
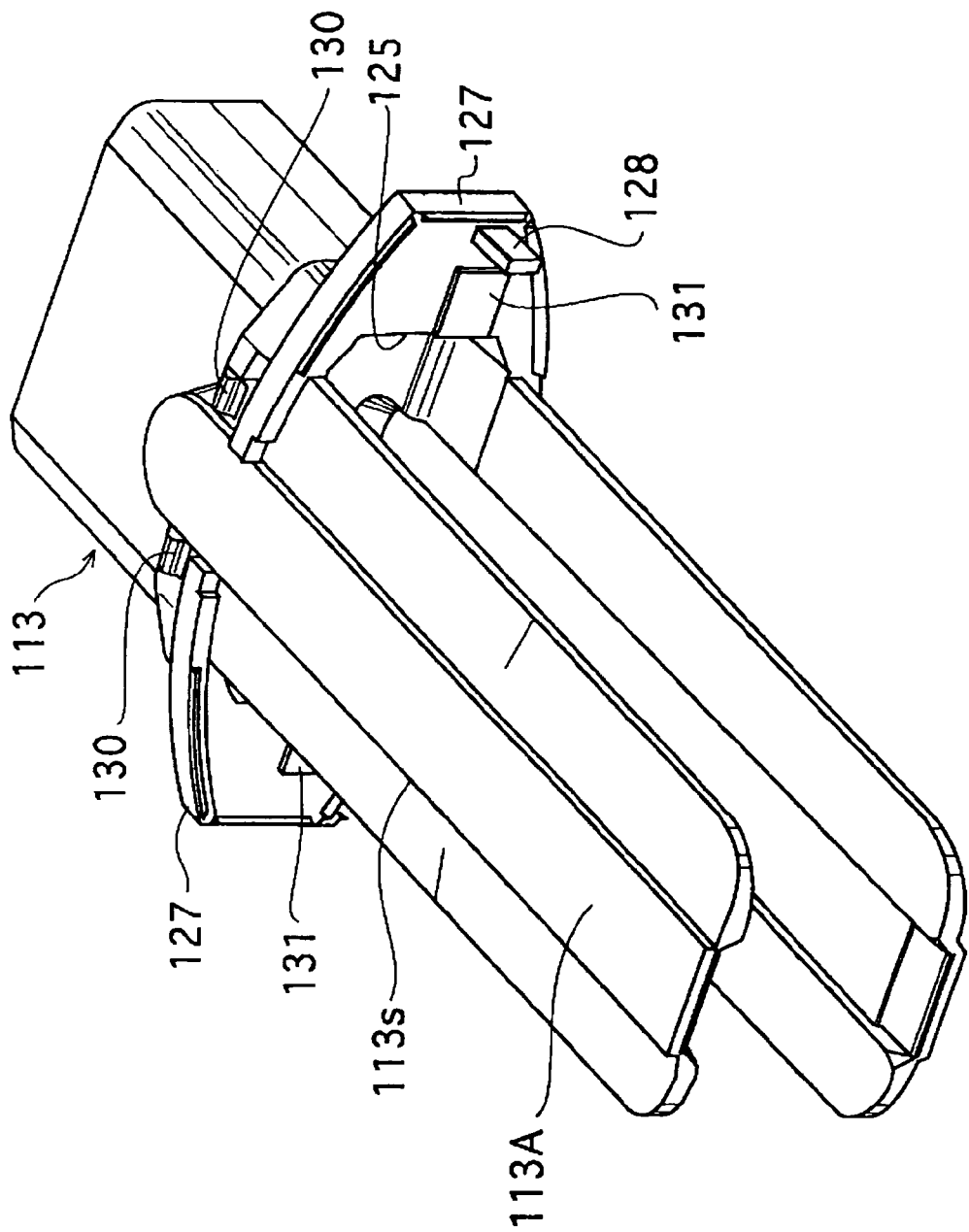
FIG. 23 is a perspective view showing a substrate holder 113 as viewed from the rear side.
Figure 24:
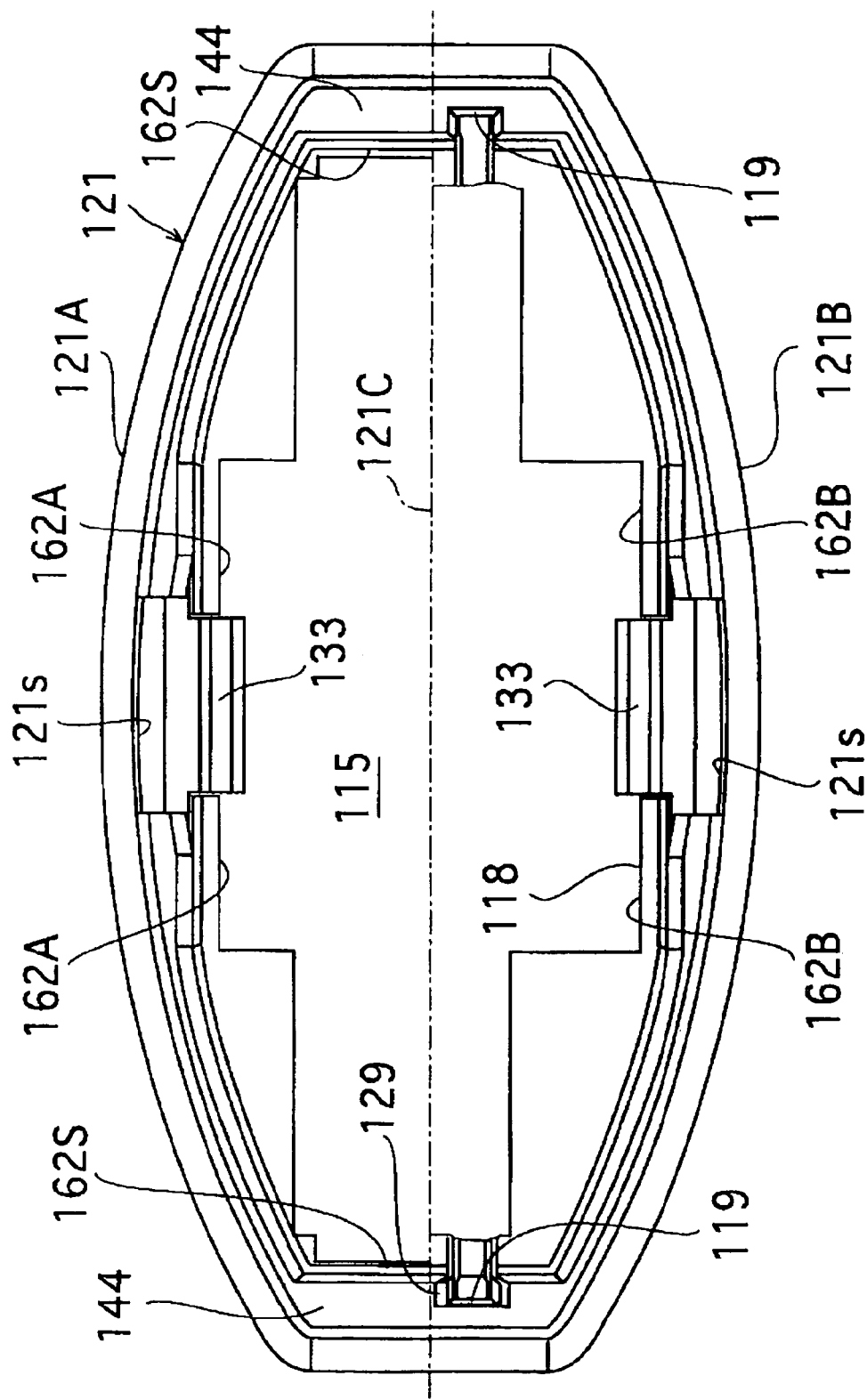
FIG. 24 is a front view of a first main body 121.
Figure 25:
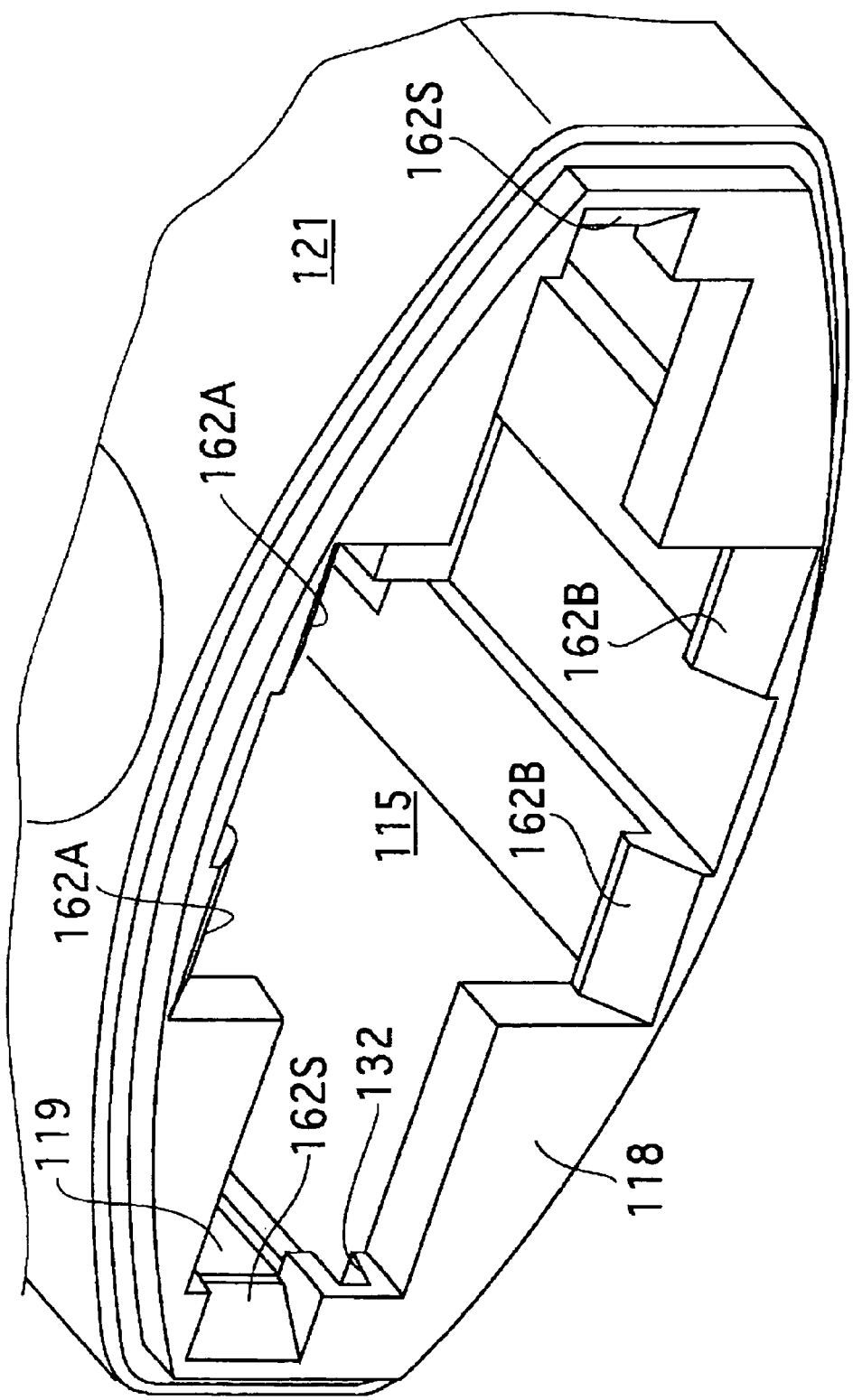
FIG. 25 is a perspective view showing essential portion of a first main body 121 as viewed from the rear side.
Figure 26:
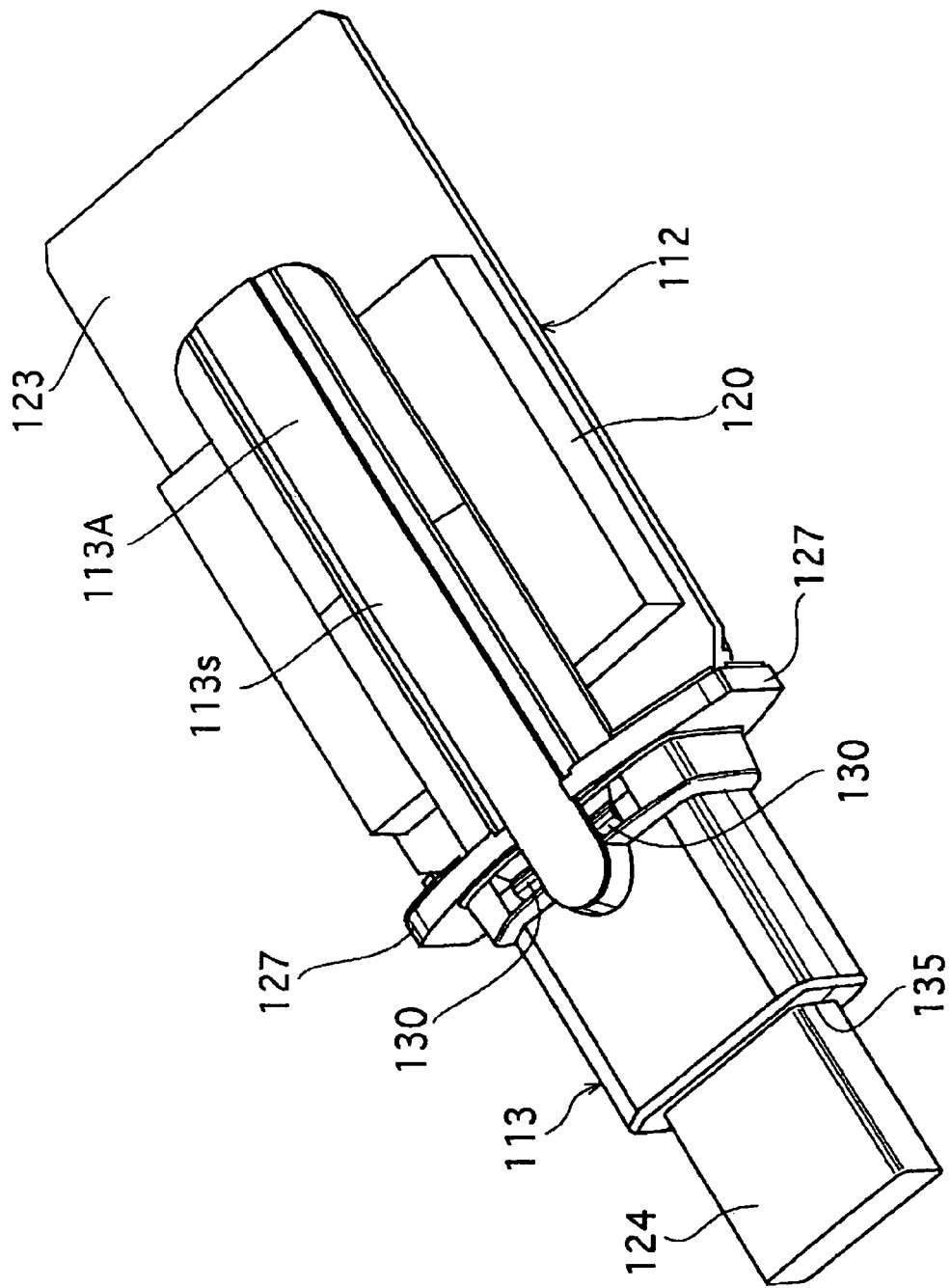
FIG. 26 is a perspective view showing a memory substrate 112 and a substrate holder 113 in an assembly state as viewed from the front side.
Figure 27:
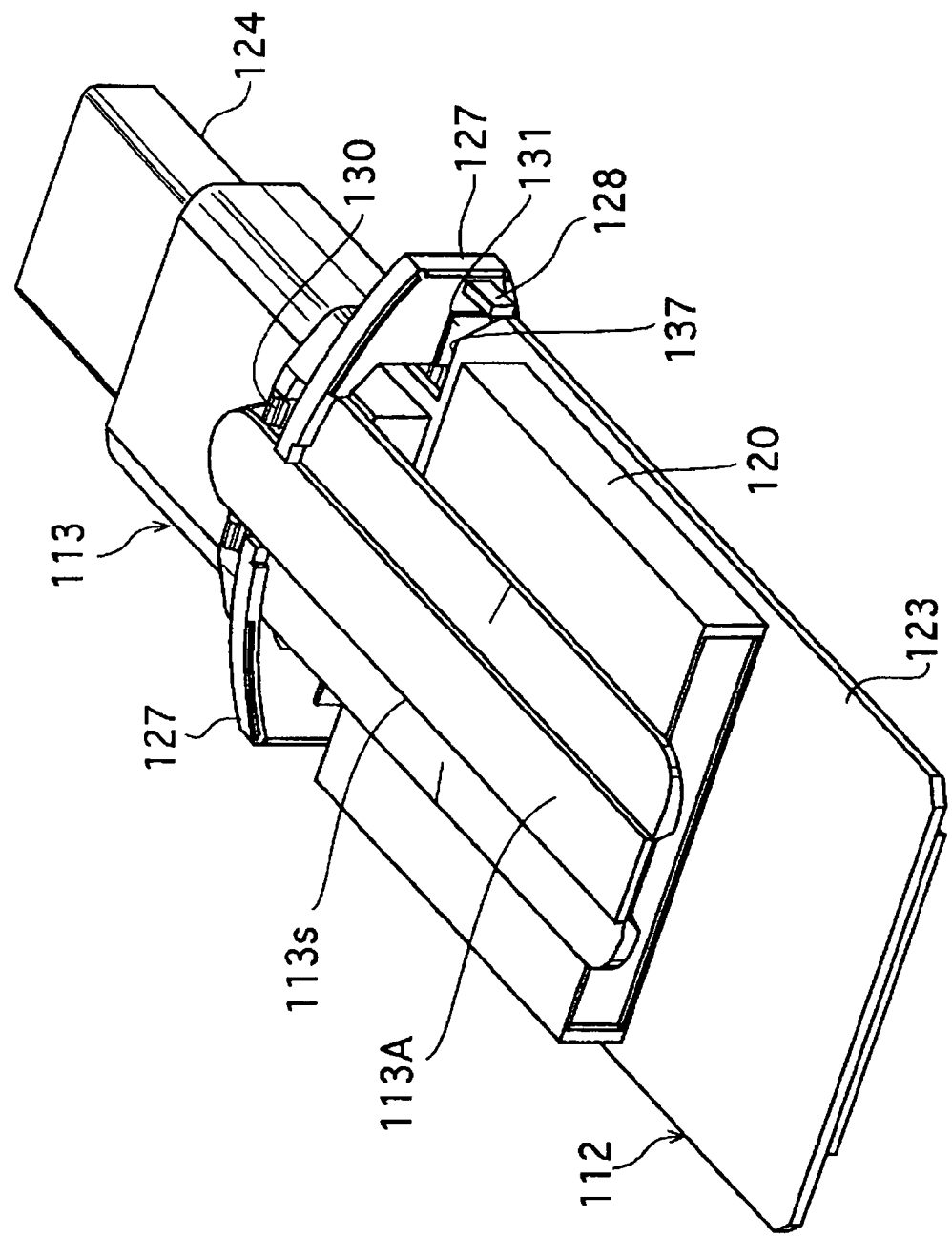
FIG. 27 is a perspective view showing a memory substrate 112 and a substrate holder 113 in an assembly state as viewed from the rear side.
Figure 28:
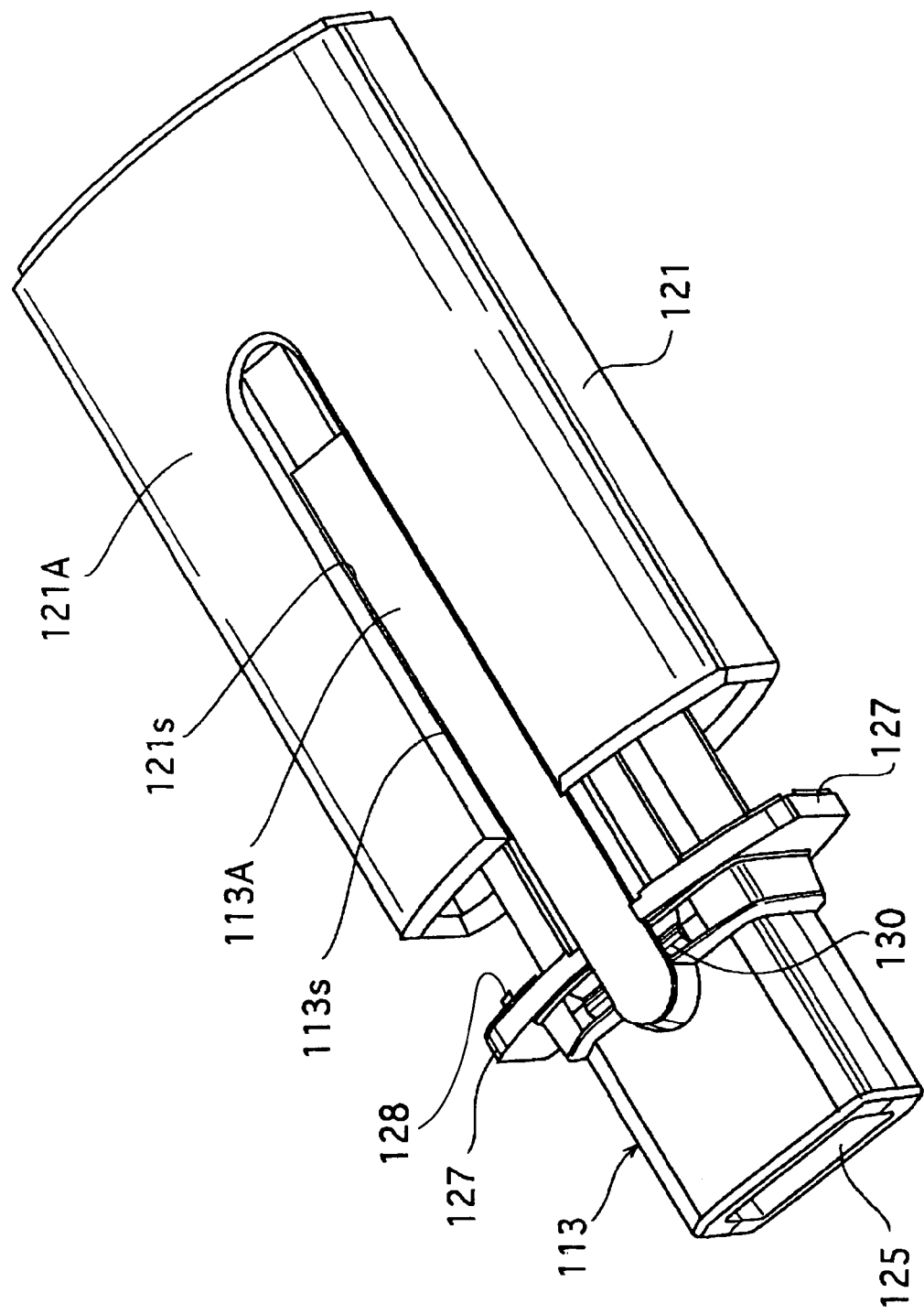
FIG. 28 is a perspective view showing a substrate holder 113 and a first main body 121 separated.
Figure 29:
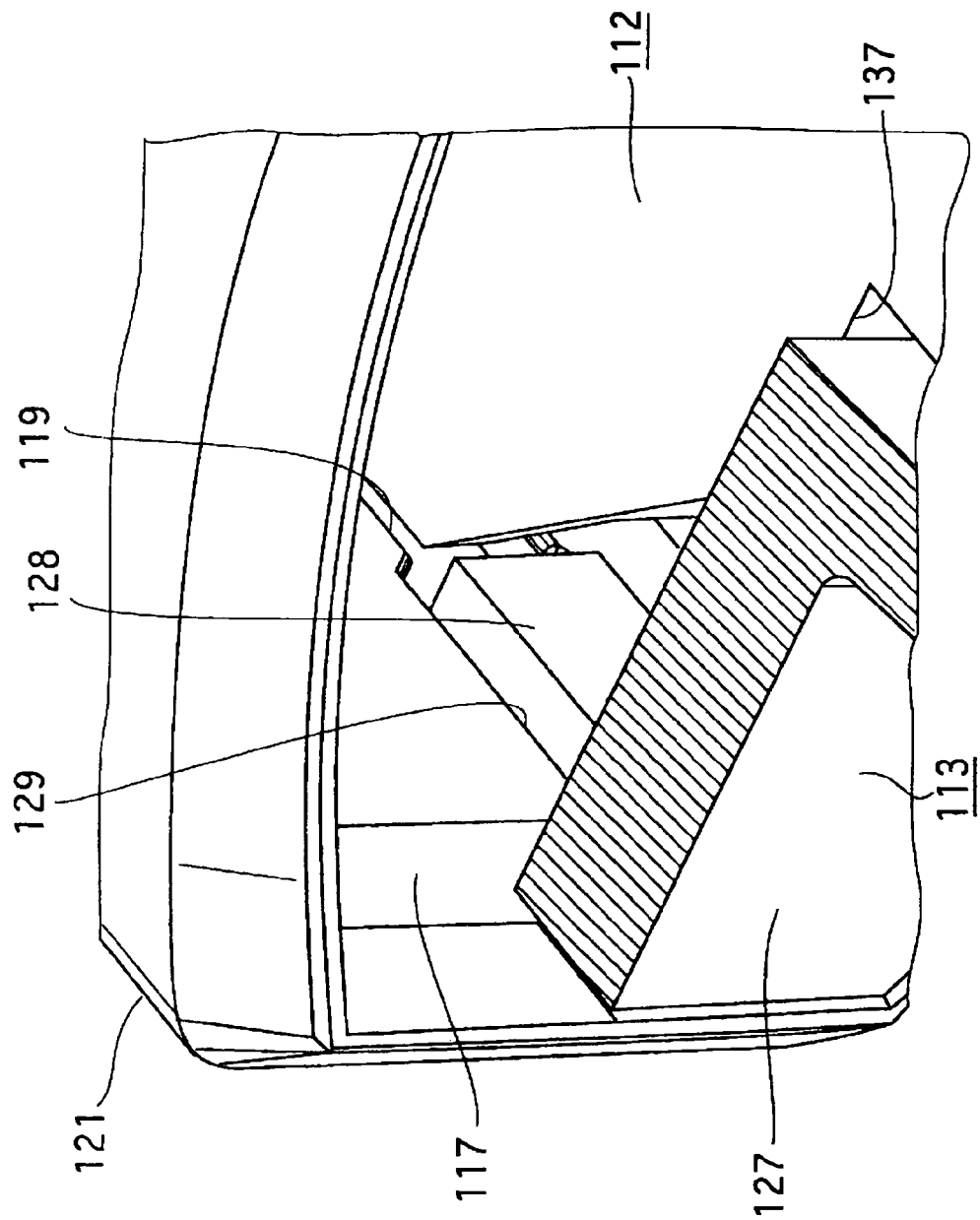
FIG. 29 is a partially broken perspective view showing essential portion of a substrate holder 113 and a first main body 121 in an assembly state.
Figure 30:
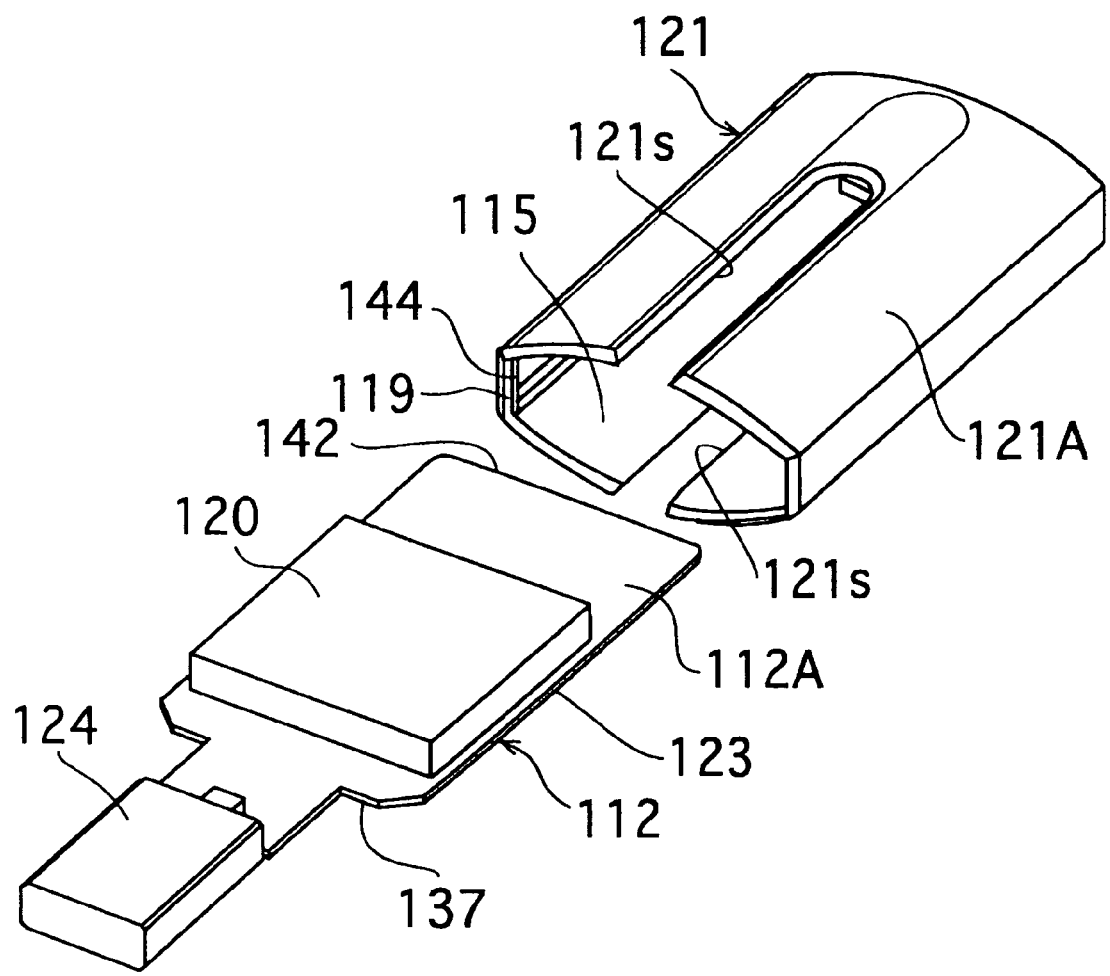
FIG. 30 is a perspective view showing a first main body 121 and memory substrate 112 separated.
Figure 31:
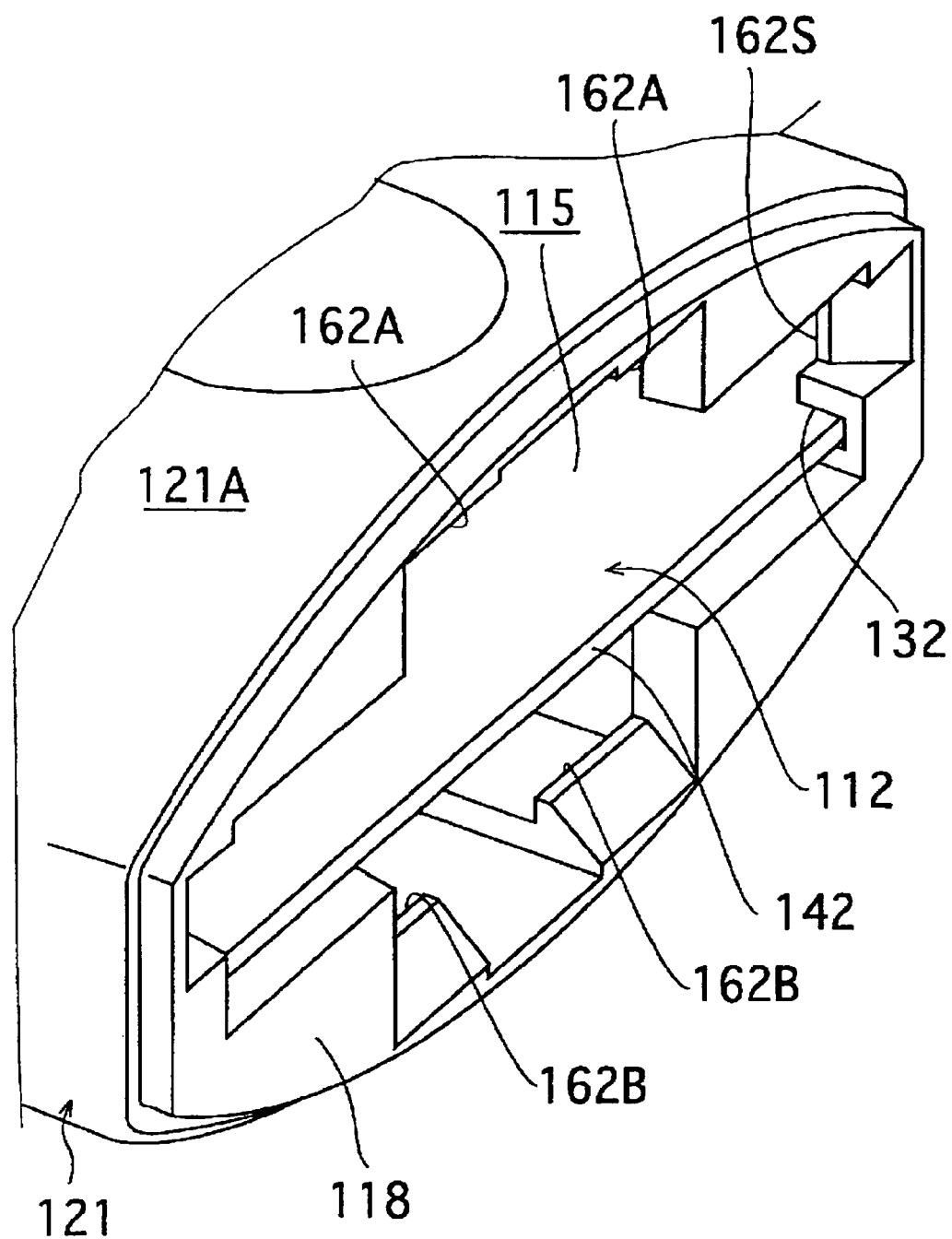
FIG. 31 is a perspective view of essential portion of the rear side of a first main body 121 shown with a memory substrate 112 fixed to the first main body 121.
Figure 32:
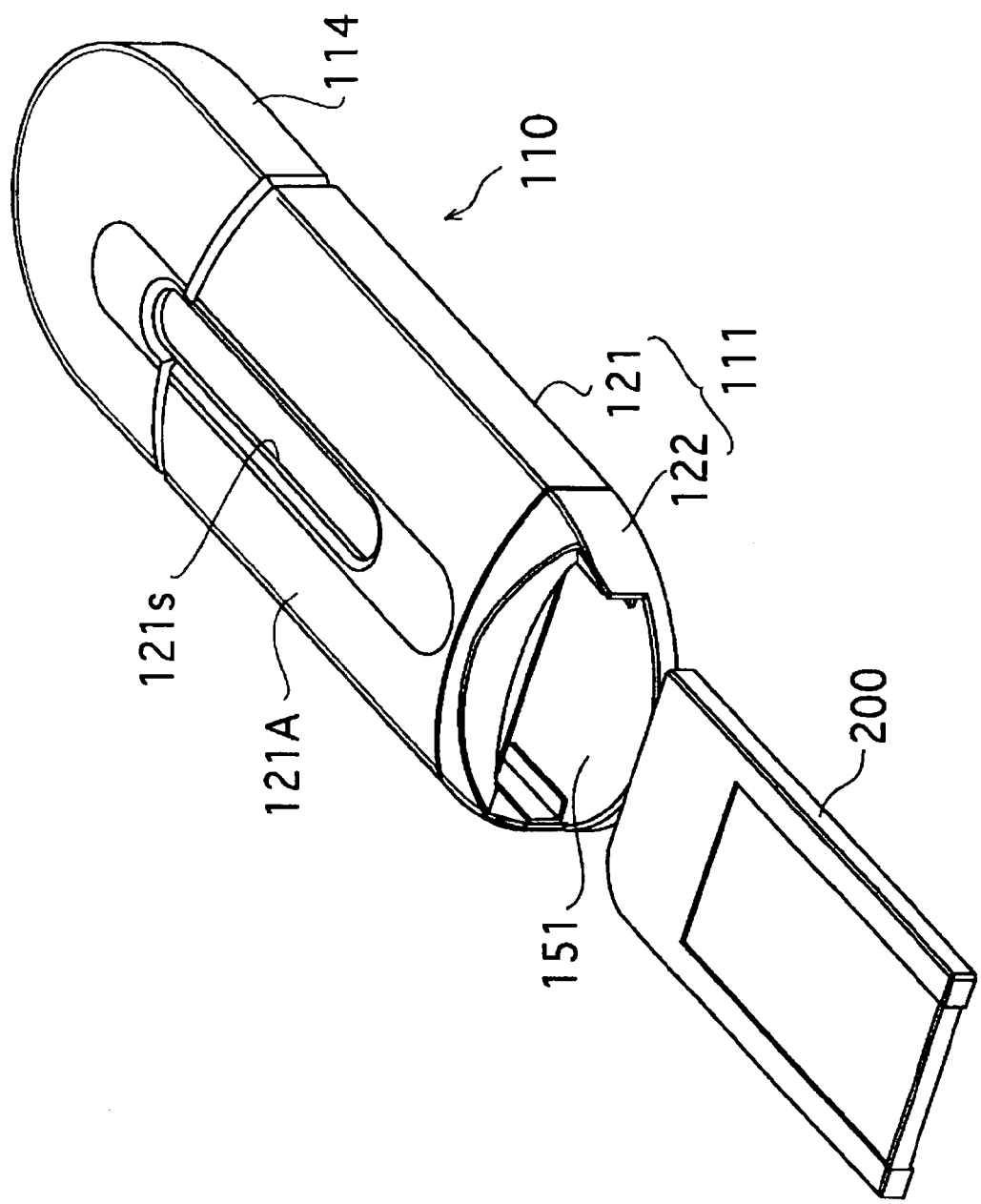
FIG. 32 is perspective view illustrating an operation of inserting and removing a memory card 200 to and from an external storage apparatus 110.
Figure 33:
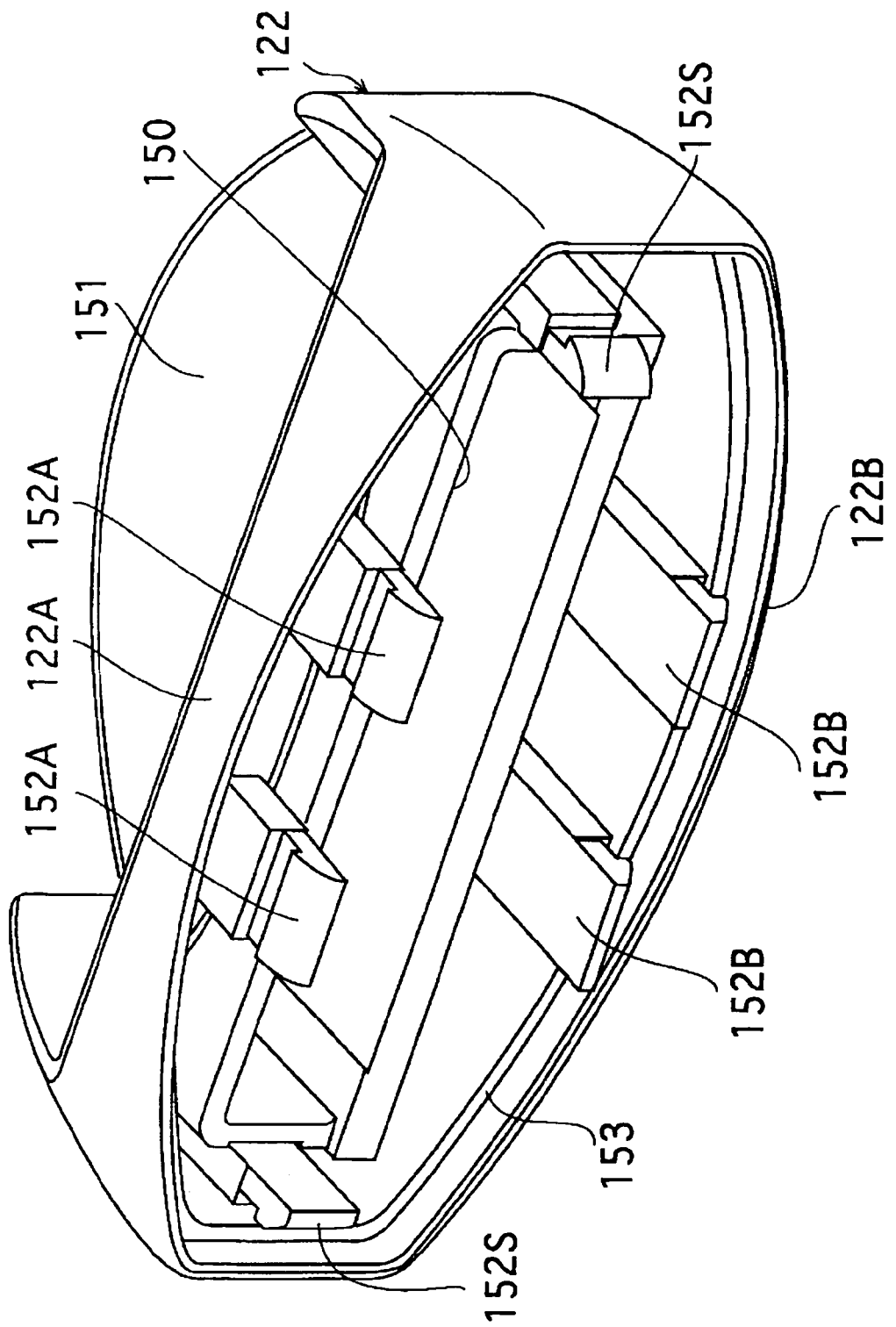
FIG. 33 is a perspective view showing a second main body 122 as viewed from the front side.

Here, FIG. 18 is a plan view of the external storage apparatus 110, FIG. 19 is a perspective view of the external storage apparatus 110 when viewed with a cap 114 removed, FIG. 20 is a cross-sectional view showing a structure for supporting a memory substrate 112 with respect to a first main body 121, FIG. 21 is a side cross-section of the external storage apparatus 110, FIG. 22 is a perspective view of the substrate holder 13 as viewed from the front, FIG. 23 is a perspective view of the same as viewed from the back, FIG. 24 is a front view of the first main body 121, FIG. 25 is a perspective view of essential portion of the first main body 121 as viewed from the back, FIG. 26 is a perspective view of a memory substrate 112 and substrate holder 113 in an assembled state as viewed from the front, FIG. 27 is a perspective view of the same as viewed from the back, FIG. 28 is a perspective view showing a substrate holder 113 and the first main body 121 separated, FIG. 29 is a partially broken perspective view of the essential portion of the substrate holder 113 and the first main body 121 in an assembled state, FIG. 30 is a perspective view showing the first main body 121 and the memory substrate 112 separated, FIG. 31 is a perspective view of the essential portion of the back of the first main body 121 shown with the memory substrate 112 fixed to the first main body 121, FIG. 32 is a perspective view illustrating the operation of inserting and removing a memory card 200 to and from the external storage apparatus 110, and FIG. 33 is a perspective view of a second main body 122 viewed from the front.

The external storage apparatus 110 of this embodiment is comprised mainly of a main body 111, a memory substrate 112, a substrate holder 113 and a cap 114, with the main body 111 being comprised of a combination of the first main body 121 and second main body 122 (FIG. 18 to FIG. 21).

The main body 111 and the cap 114 are formed from an injection molding made, for example, of colored opaque polycarbonate resin. The first main body 121 has a space 115 for internally housing the memory substrate 112 and the substrate holder 113 (FIG. 24, FIG. 25, FIG. 31). The cap 114 has a space 116 for internally housing the connector 124 (FIG. 21).

The memory substrate 112 is comprised of a printed circuit board 123 and a connector 124 provided at an edge portion of one end as an external connection terminal (FIG. 20, FIG. 30). A connector 120 for card use to which a memory card 200 described later is connected is mounted at a surface 112A of the memory substrate 112. Electronic components such as semiconductor memory of flash memory etc. and crystal oscillators etc., which are not shown, are mounted on the rear surface side of the memory substrate 112. The connector 124 is comprised of metal such as stainless steel etc. for connecting a computer and peripheral equipment, with a plurality of connection terminals arrayed internally. In this embodiment, the connector 124 is configured to conform to a USB (Universal Serial Bus).

The substrate holder 113 is formed of, for example, a colored or colorless transparent polycarbonate resin injection molding. In this embodiment, the substrate holder 113 is formed in a shape that is substantially symmetrical in appearance from front to back. A substrate insertion through-hole 125 for inserting through the memory substrate 112 is formed within the substrate holder 113 (FIG. 20, FIG. 22, FIG. 23). The overall length of the substrate holder 113 is shorter than the overall length of the memory substrate 112 containing the connector 124 and is formed so that the connector 124 and an end of the printed circuit board 123 of the memory substrate 112 project from the openings of the substrate insertion through-hole 125 under the state that the memory substrate 112 is inserted through the substrate insertion through-hole 125 (FIG. 21, FIG. 26, FIG. 27).

Further, a flange 127 is formed about the periphery of the central portion of the substrate holder 113 (FIG. 20, FIG. 22, FIG. 23, FIG. 26 to FIG. 29). The flange 127 is configured as a welding rib to be integrated with an open end 117 of the first main body 121 by ultrasonic welding (FIG. 20, FIG. 29).

A cut-out section 121s and cut-out section 114s formed at the front and rear surfaces of the first main body 121 and the cap 114 partially expose the surface of the substrate holder 113 to the outside so as to form a window enabling viewing of the internal memory substrate 112 from outside (FIG. 18, FIG. 19, FIG. 24, FIG. 28, FIG. 30). First engaging projections 130 are provided at a plurality of locations at the outer surface of the substrate holder 113 (FIG. 19, FIG. 22, FIG. 23, FIG. 26 to FIG. 28), and second engaging projections (not shown) corresponding to the first engaging projections 130 are provided at the inside surface of the cap 114. The first and second engaging projections then engage with each other at the time of installing the substrate holder 113 and the cap 114.

Next, a description is given of a mechanism for positioning the memory substrate 112 with respect to the first main body 121.

The memory substrate 112 is inserted along the direction of arrow E in FIG. 20 with respect to the substrate insertion through-hole 125 of the substrate holder 113. In this event, the connector 124 positioned at the front end as viewed from the insertion direction of the memory substrate 112 projects by a predetermined projection amount outwards from an opening 135 at one end of the substrate holder 113 (FIG. 20, FIG. 26, FIG. 27). A stepped section 137 for restricting the extent of projection of the connector 124 with respect to the opening 135 as a result of making contact with the flange 127 of the substrate holder 113 is provided at the outer periphery of the memory substrate 112 (FIG. 20, FIG. 27).

Projecting surfaces 131 are formed at the rear surface (the surface on the side facing the stepped section 137 of the memory substrate 112) of the flange 127 of the substrate holder 113. The projecting surfaces 131 are formed in positions so as to make contact with the stepped section 137 if the direction of assembly of the memory substrate 112 with respect to the substrate holder 113 being appropriate (FIG. 27) and not make contact with the stepped section 137 if the direction of assembly being erroneous (a direction where the front and back are reversed).

On the other hand, guide grooves 119, 119 making slidable contact with the outer periphery of the memory substrate 112 housed in the substrate holder 113 so as to guide the advancement of the memory substrate 112 are provided at the inner surface of the first main body 121 (FIG. 24, FIG. 30). The guide grooves 119 are formed at ribs 144, 144 formed in the vicinity of the open end 117 of the first main body 121 and are formed at positions offset to the side of the rear surface 121B from a central axial line 121C of the first main body 121 (FIG. 24). The extent of the offset corresponds to the distance between each of the axial centers of the connector 124 and the printed circuit board 123.

When the memory substrate 112 is assembled to the first main body 121 back to front, the other end edge (the end on the opposite side to the side of the connector 124) 142 of the memory substrate 112 makes contact with the rib 144 so that advancement to within the first main body 121 of the memory substrate 112 is restricted so that a worker can recognize erroneous assembly.

In the above, "erroneous assembly restricting means" of the present invention is constructed which restricts the assembly if the assembly posture of the memory substrate 112 with respect to the first main body 121 is not appropriate.

Further, in this embodiment, the assembly direction of the substrate holder 113 with respect to the first main body 121 is restricted by making each of the bonding surfaces of the substrate holder 113 and the first main body 121 asymmetrical respectively.

More specifically, at one of the ribs 144 of the pair of ribs 144 of the first main body 121, a fitting section (clearance) 129 that a projection 128 formed so as to project only at one side of the rear surface of the flange 127 of the substrate holder 113 fits into is formed at a starting end of this guide groove 119 (FIG. 24, FIG. 29). The fitting section 129 is formed by broadening (for example, approximately 0.5 mm) the groove width of the starting end of one of the guide grooves 119. As a result, when the substrate holder 113 is such that the surface 113A is facing upwards with respect to the first main body 121 with the surface 121A facing upwards as shown in FIG. 28, attachment by insertion is possible, and when the surface 113A faces downwards, attachment by insertion is not possible.

In this example, the rib 144 on the side that does not have the fitting section 129 constitutes the "restricting section" of the present invention.

When the memory substrate 112 is assembled using an appropriate assembly posture with respect to the first main body 121, a guide function for the memory substrate 112 is obtained with the guide groove 119 as described above, so that the memory substrate 112 and the substrate holder 113 are inserted through the space 115 of the first main body 121. The guide mechanism of the substrate holder 113 with respect to the first main body 121 is obtained from the sliding action between the cut-out section 121s of the first main body 121 and ridge sections 113s formed at the front and rear surfaces of the substrate holder 113 (FIG. 28).

First holding sections 132 for holding the edge sections 142 of the memory substrate 112 are provided at the rear ends of the guide grooves 119 (FIG. 25, FIG. 31). The first holding sections 132 are comprised, for example, in an approximate V-shape groove, and have the same configuration as the holding grooves 32 described in the first embodiment described above. At the time of ultrasonic welding between the flange 127 of the substrate holder 113 and the open end 117 of the first main body 121, the first holding sections 132 sandwich the edge sections 142 of the memory substrate 112 in accompaniment with plastic deformation as the memory substrate 112 advances (FIG. 31). As a result, variation in dimensions in the lengthwise direction within the first main body 121 are absorbed. In particular, in this embodiment, the sides of the memory substrate 112 make contact with the guide grooves 119 so that the memory substrate 112 is supported over its entire periphery by the first main body 121 and the substrate holder 113.

In the case of welding the substrate holder 113 and the first main body 121, an opening 136 at the other end of the substrate holder is sandwiched by second holding sections 133, 133 (FIG. 21, FIG. 24) formed at the ends of the cut-out sections 121s, 121s of the first main body 121.

The substrate holder 113 is fitted by insertion to the first main body 121, so that the memory substrate 112 is supported between the substrate holder 113 and the first main body 121 with the connector 124 projecting outwards from the opening 135 of the substrate holder 113 (FIG. 20).

Next, a description is given of a configuration for the second main body 122.

The second main body 122 is fitted so as to cover an opening 118 (FIG. 24, FIG. 25, FIG. 31) at the rear end with respect to the fist main body 121. A slot 150 for inserting and removing the memory card 200 is formed at the second main body 122, with a supporting surface 151 for supporting the lower surface side of the inserted memory card 200 being provided (FIG. 18, FIG. 21) next to the slot 150.

The memory card 200 corresponds to a card-shaped semiconductor memory device with semiconductor memory built in, and in this embodiment, for example, a "memory stick (trademark)" may be used. The memory card 200 inserted into the slot 150 is directly guided to a card connector 120 of the memory substrate 112 via an open end 118 of the first main body 121.

The information recording capacity of the external storage apparatus 110 of this embodiment can be dramatically increased as a result of having this memory card 200. Further, while on the one hand this type of memory card 200 requires a dedicated drive device, an external storage apparatus 110 can be used simply by connection to a USB port that comes as standard on personal computers, and this is therefore highly flexible. It is therefore possible to use the memory card 200 via the external storage apparatus 110 even with computers that are not equipped with a dedicated driver for the memory card 200, which enlarges the range of utilization of the external storage apparatus 110.

With the external storage apparatus 110 of this embodiment constructed taking the above as a main point, it is difficult to form the main body 111 comprised of the first main body 121 and the second main body 122 by molding in one time. These are therefore formed as separate members and connected together afterwards. Usually, in the case of joining injection molds of synthetic resin, cases employing ultrasonic welding giving highly-reliable strong bonds at low cost are common but this cannot be adopted in this example for the following reasons.

Namely, the peripheral surface of the second main body 122 is a curved surface as shown in the drawings, and it is necessary to make an ultrasonic welding horn for this use separately. Further, even if a welding horn corresponding to the external shape of the second main body 122 is made, it is difficult to apply ultrasonic vibrations equally over the whole of the pressed surface of the second main body 122, resulting in a substantially localized vibrational strength being applied. Therefore, in the case that, for example, the outer surface of the second main body 122 is subjected to a matt process, gloss referred to as "sheen" occurs partially at the outer surface of the product due to application of ultrasonic vibration in an uneven manner, which is damaging to the quality of the appearance.

In this embodiment, joining of the first main body 121 and the second main body 122 is carried out using a snap connection. This enables the second main body 122 to be joined to the first main body 121 without damaging the quality of the appearance.

Specifically, as shown in FIG. 31, engaging pawls 152A, 152A, 152B, 152B, 152S, 152S are erected at the surface 122A, rear surface 122B and left and right sides surrounding the periphery of the slot 150 on the inside of the second main body 122. These pawls project more to the side of the first main body 121 than a bonding surface 153 formed corresponding to the open end 118 of the first main body 121.

The engaging pawls 152A, 152A engage with engaged sections 162A, 162A formed at the open end 118 of the first main body 121, and the engaging pawls 152B, 152B similarly engage with engaged sections 162B, 162B (FIG. 24, FIG. 25). The engaging pawls 152S, 152S engage with engaged sections 162S, 162S (FIG. 25, FIG. 31).

In particular, the engaged sections 162S, 162S are both provided at a position offset to the side of the surface 121A from the central axial line 121C orthogonal to the axial center of the first main body 121 (FIG. 24) and are formed at positions corresponding to the engaging pawls 152S, 152S.

In the case that the second main body 122 is assembled with an appropriate assembly posture that is the same in a direction from front to back with respect to the first main body 121, each of the pawls 152A, 152B and 152S engage with the engaged sections 162A, 162B and 162S, so as to attain a connected state where the bonding surface 153 of the second main body 122 comes into contact with the open end 118 of the first main body 121.

On the other hand, in the case that the second main body 122 is assembled with an inappropriate assembly posture that is back to front with respect to the first main body 121, the engaging pawls 152S, 152S make contact with the open end 118 of the first main body 121, and advancement to within the first main body 121 is restricted. As a result, erroneous assembly of the second main body 122 to the first main body 121 is prevented, and it is possible to ensure an appropriate assembly state where a confronting relationship between the slot 150 of the second main body 122 and the connector 120 for card use within the first main body 121 is fulfilled.

In this example, the open end 118 constitutes the "wall section" of the present invention.

According to this embodiment, as with the first embodiment described above, it is possible to prevent erroneous assembly of the memory substrate 112 with respect to the main body 111, and it is possible to prevent falling quality due to erroneous assembly and variation in quality between products.

In the case that different types of recording medium are used, respective dedicated interfaces are normally necessary. However, for example, providing a plurality of types of interface at a single computer terminal has the limitation such that the equipment will become large. There are also limits with regard to giving a recording medium of a fixed size a high recording capacity.

The external storage apparatus 110 of this embodiment is provided with a plurality of various different codes and standards such as the USB port connector 124 and the connector 120 for use with the memory card 200 so as to provide compatibility with connected recording mediums. It is therefore possible to increase recording medium flexibility and improve usefulness without having to provide more interfaces than are necessary at the computer terminal etc., and to increase recording capacity.

Further, the connector 120 for card use is mounted on a common memory substrate 112. It is therefore possible to reduce the number of components, make the overall apparatus smaller, and contribute to miniaturization.

The direction of attaching and detaching the memory card 200 to and from the connector 120 for card use is the same direction as for attaching and detaching the connector 124 to and from the USB port. The burden placed on portions for connecting the connector 124 and the USB port with regards to the operation of attaching and detaching the memory card 200 when the external storage apparatus 110 is used can therefore be reduced. Handling can also be improved because connection openings for the connector 124 and the connector 120 for card use face in opposing directions.

Fourth Embodiment

FIG. 34 to FIG. 57A and FIG. 57B show an external storage apparatus 210 of a fourth embodiment of the present invention.

Figure 34:
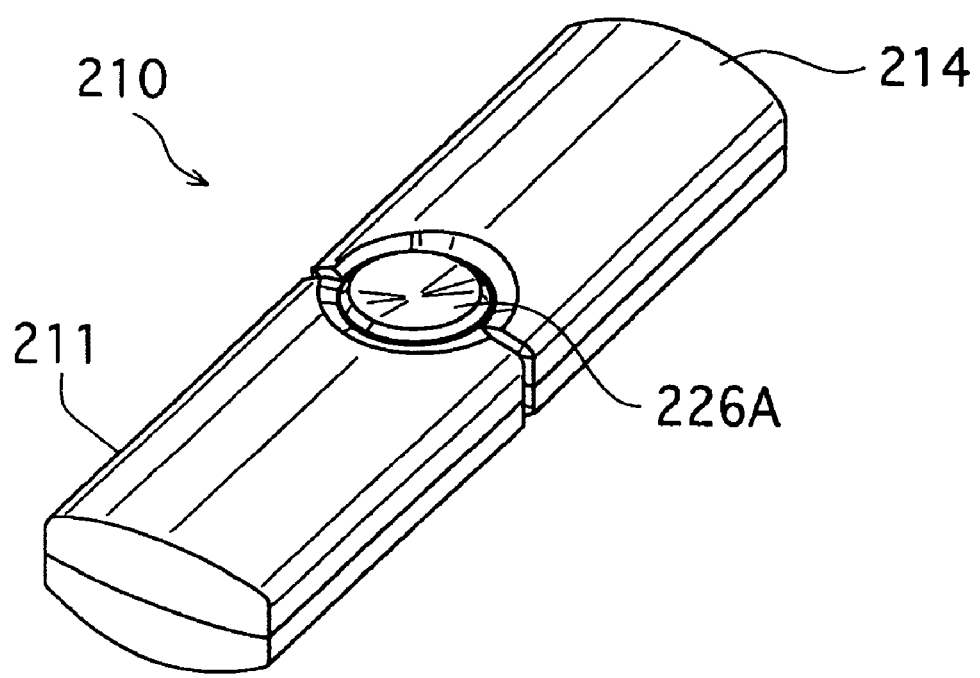
FIG. 34 is a perspective view of an external storage 210 according to a fourth embodiment of the present invention.
Figure 35:
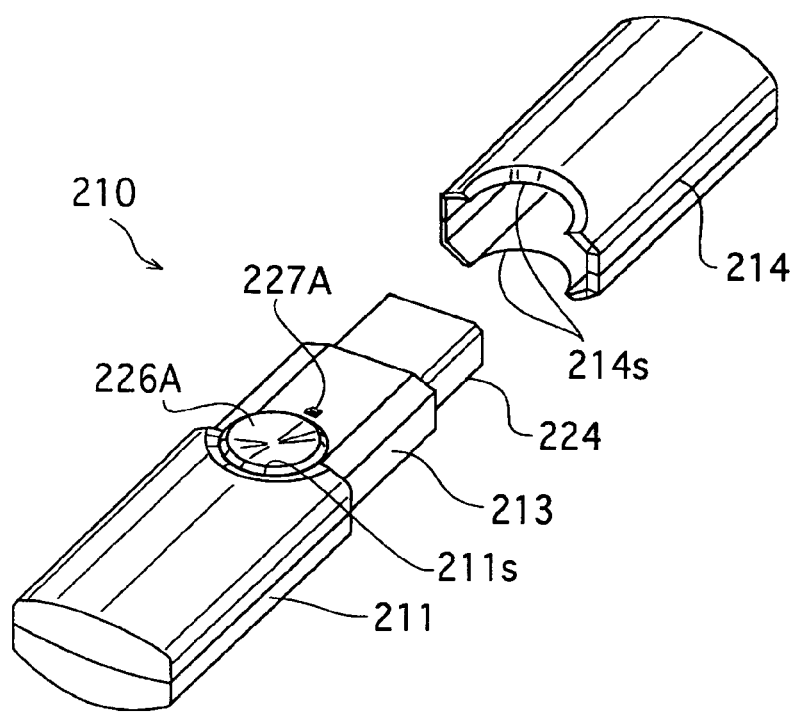
FIG. 35 is a perspective view showing an external storage apparatus 210 as viewed with a cap 214 removed.
Figure 36:
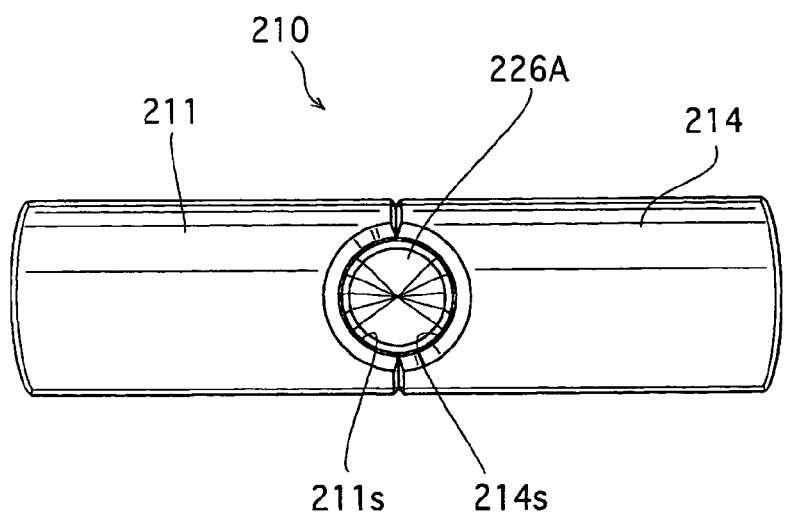
FIG. 36 is a plane view of an external storage apparatus 210.
Figure 37:
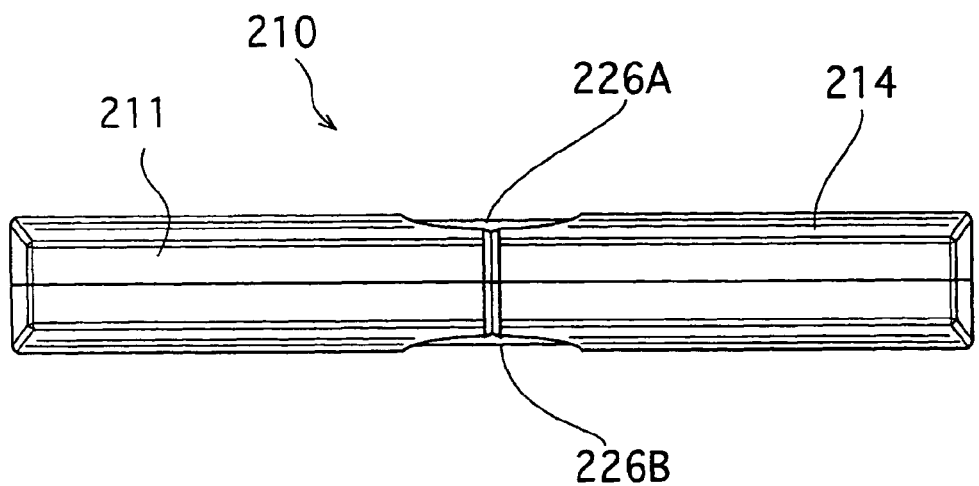
FIG. 37 is a side view of an external storage apparatus 210.
Figure 38:
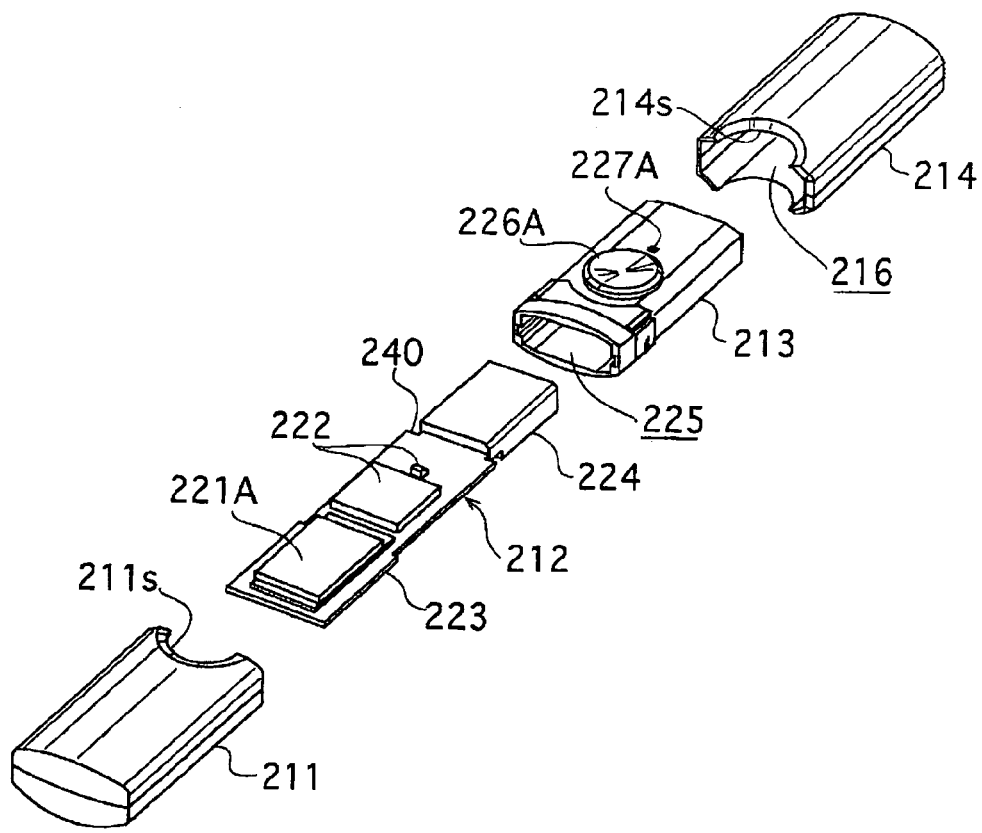
FIG. 38 is an exploded perspective view of an external storage apparatus 210.

Here, FIG. 34 is an overall perspective view of the external storage apparatus 210, FIG. 35 is a perspective view of the external storage apparatus 210 with a cap 214 removed, FIG. 36 is a plan view of the external storage apparatus 210, FIG. 37 is a side view of the external storage apparatus 210 and FIG. 38 is an exploded perspective view of the external storage apparatus 210.

Figure 39:
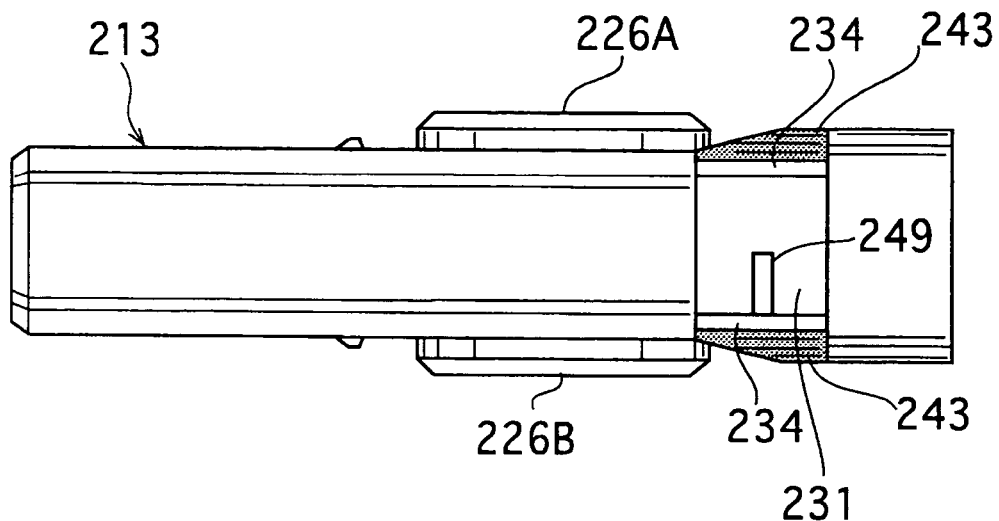
FIG. 39 is a side view of a substrate holder 213.
Figure 40:
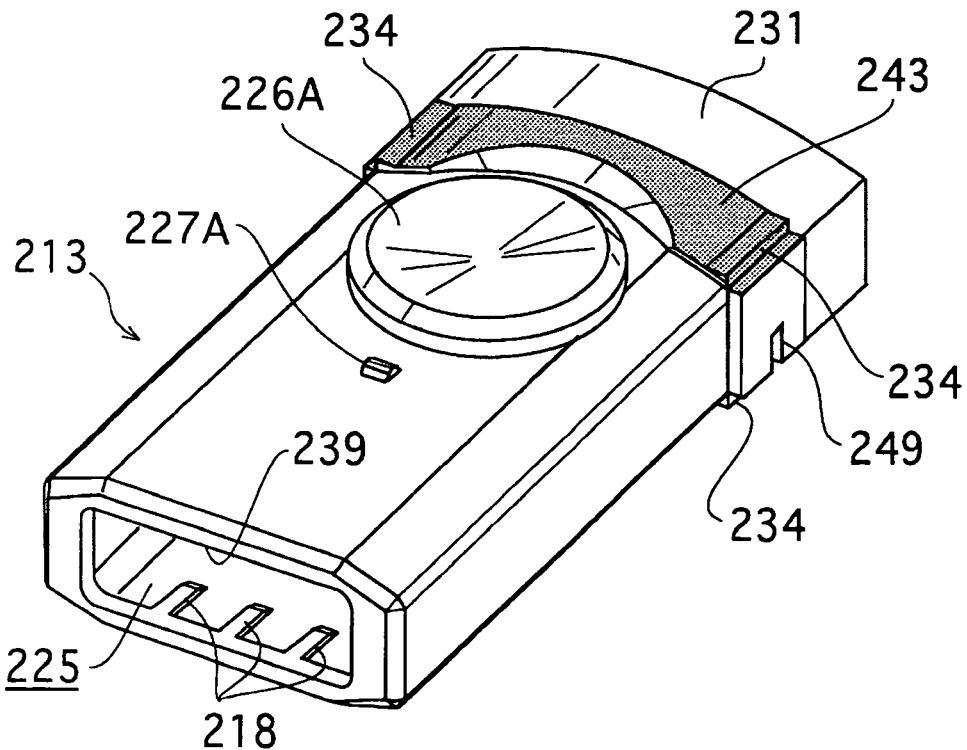
FIG. 40 is perspective view of a substrate holder 213 as viewed from an opening 239 at one end side.
Figure 41:
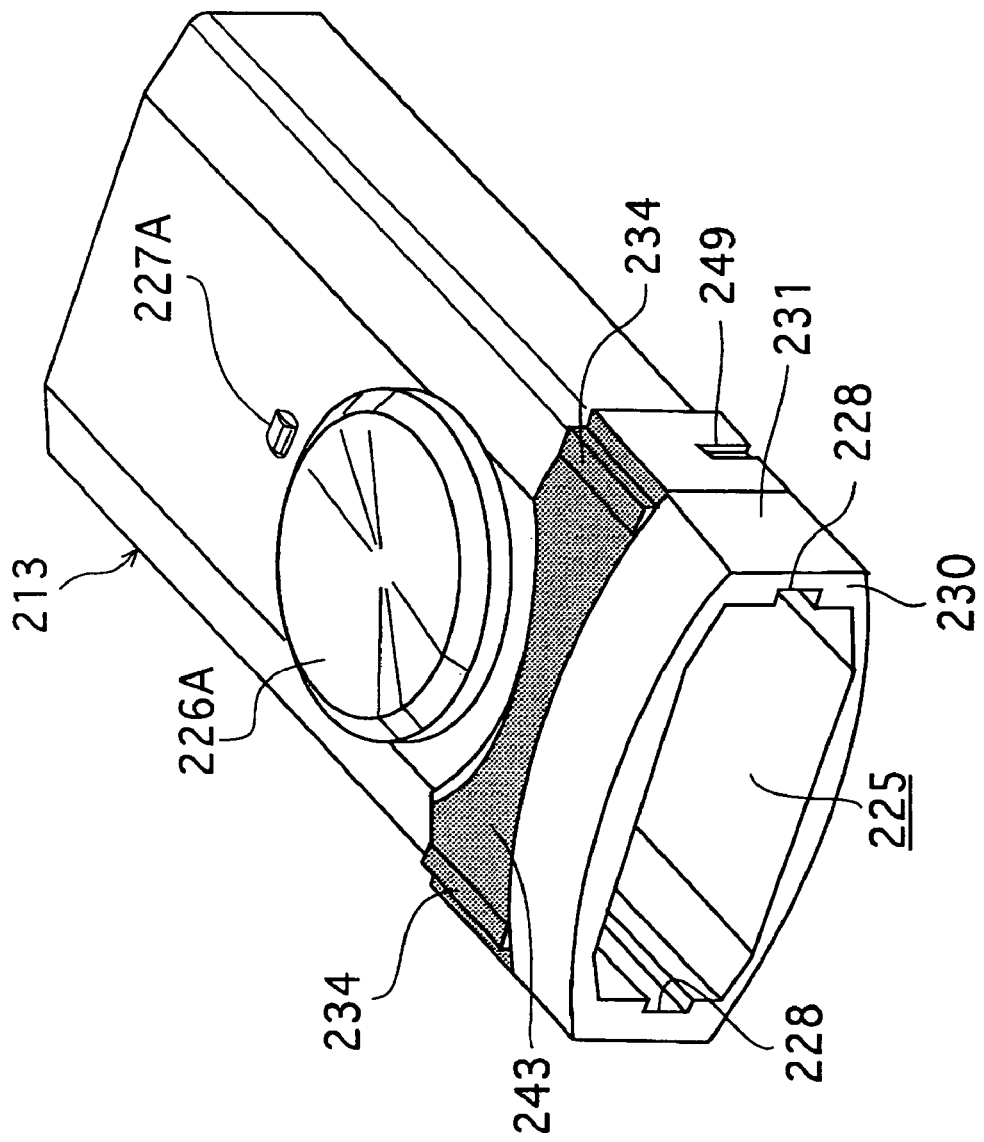
FIG. 41 is perspective view of a substrate holder 213 as viewed from an opening at other end side.
Figure 42:
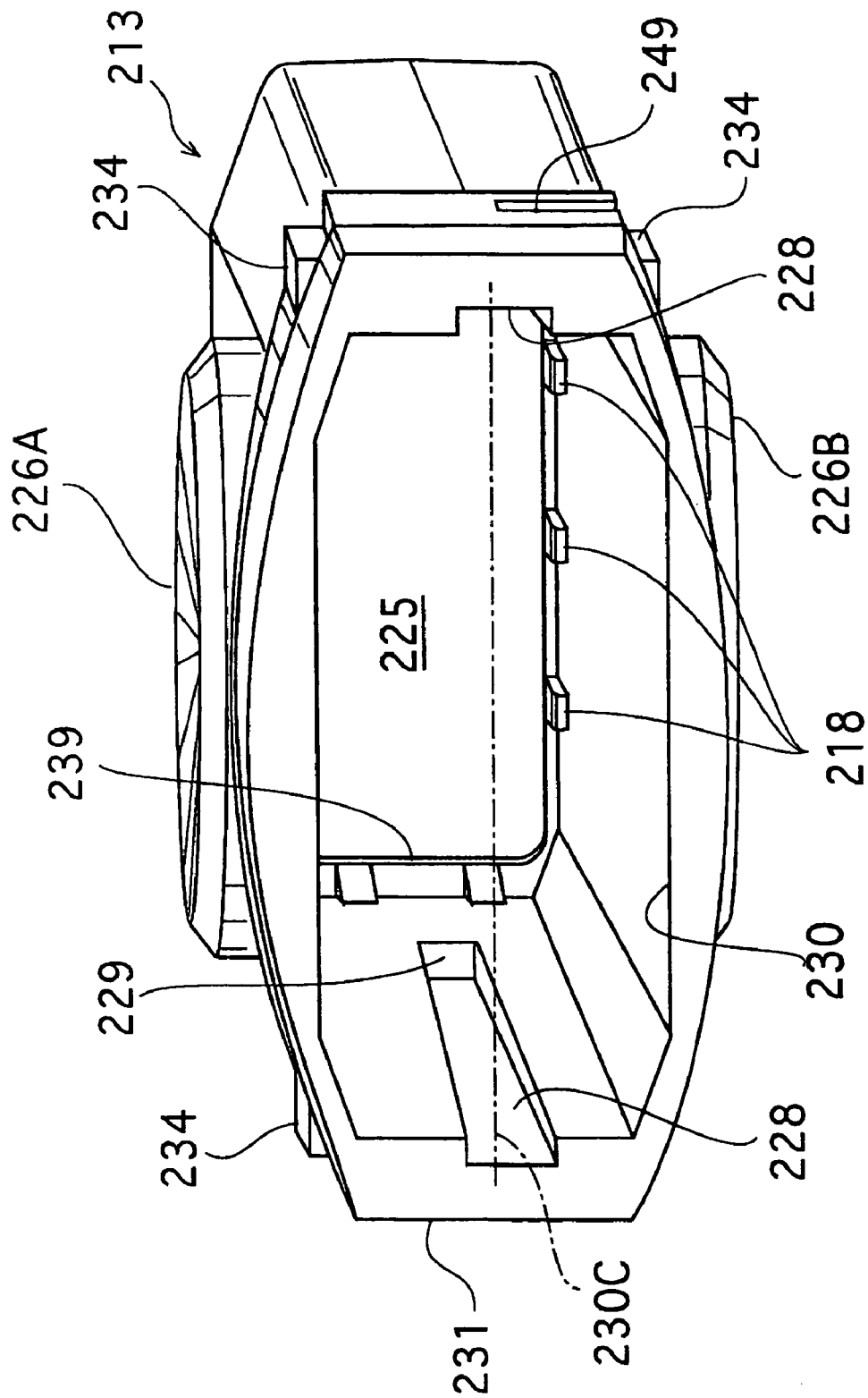
FIG. 42 is a perspective view showing a structure of a substrate insertion through-hole 225 of a substrate holder 213.
Figure 43:
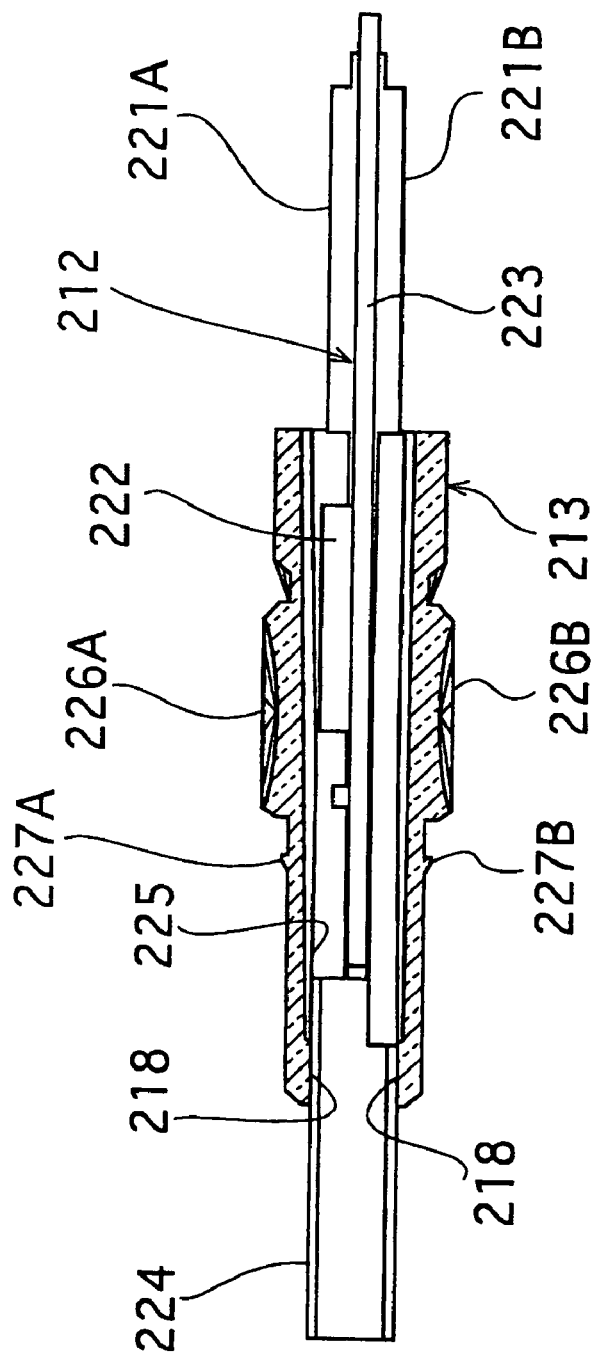
FIG. 43 is a side cross-sectional view of an assembly for a substrate holder 213 and a memory substrate 212.
Figure 44:
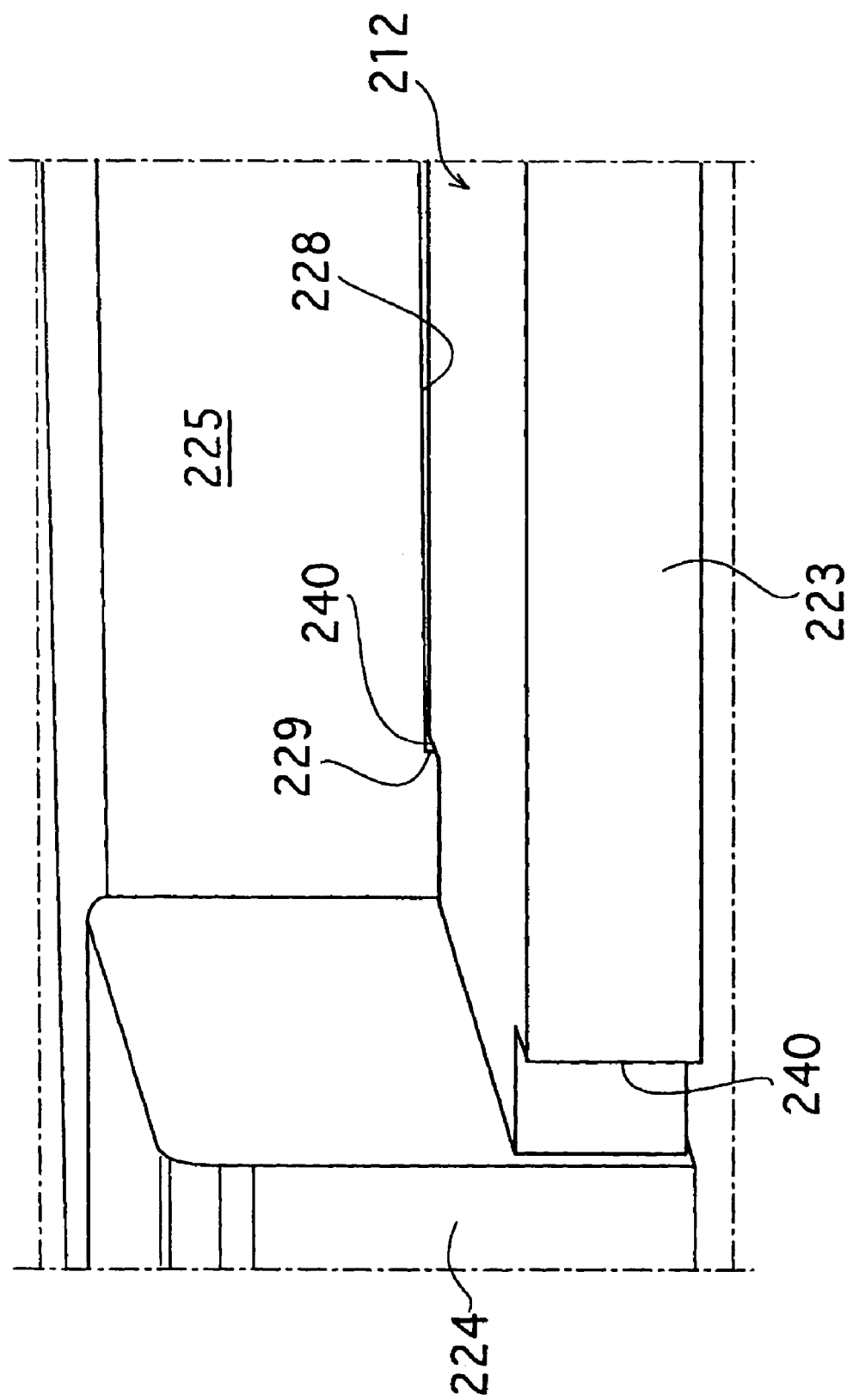
FIG. 44 is a perspective view of essential portion illustrating a mechanism for positioning a memory substrate 212 with respect to a substrate holder 213.

FIG. 39 is a side view of a substrate holder 213, FIG. 40 is a perspective view as viewed from the side of an opening 239 of one end of the substrate holder 213, FIG. 41 is a perspective view as viewed from the side of an opening an the other end of the substrate holder 213, FIG. 42 is a perspective view showing a configuration for a substrate insertion through-hole 225 of the substrate holder 213, FIG. 43 is a side cross-sectional view of an assembly for the substrate holder 213 and the memory substrate 212, and FIG. 44 is a cross-sectional perspective view of essential portion illustrating a mechanism for positioning the memory substrate 212 with respect to the substrate holder 213.

Figure 45:
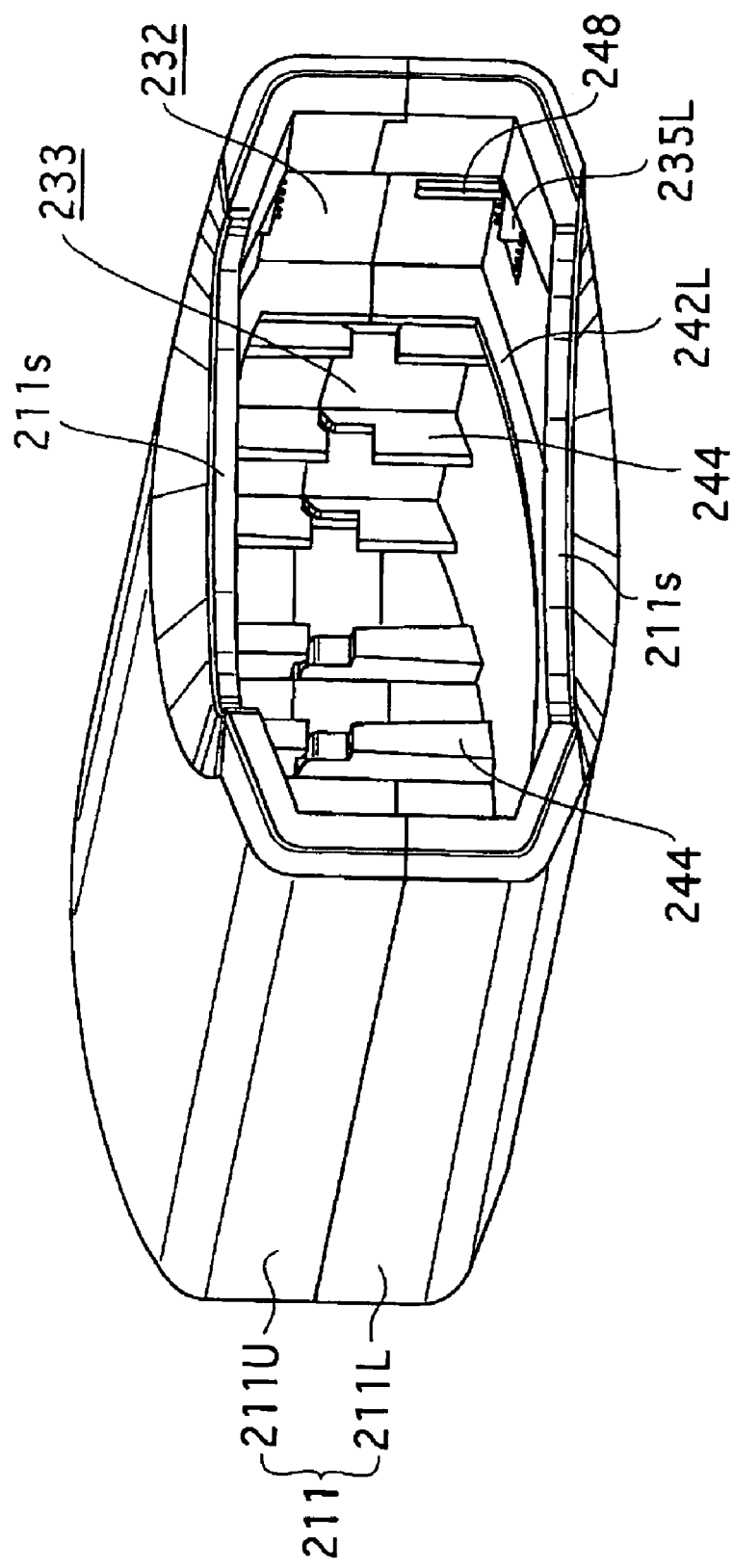
FIG. 45 is a perspective view showing an internal structure of a main body 211.
Figure 46:
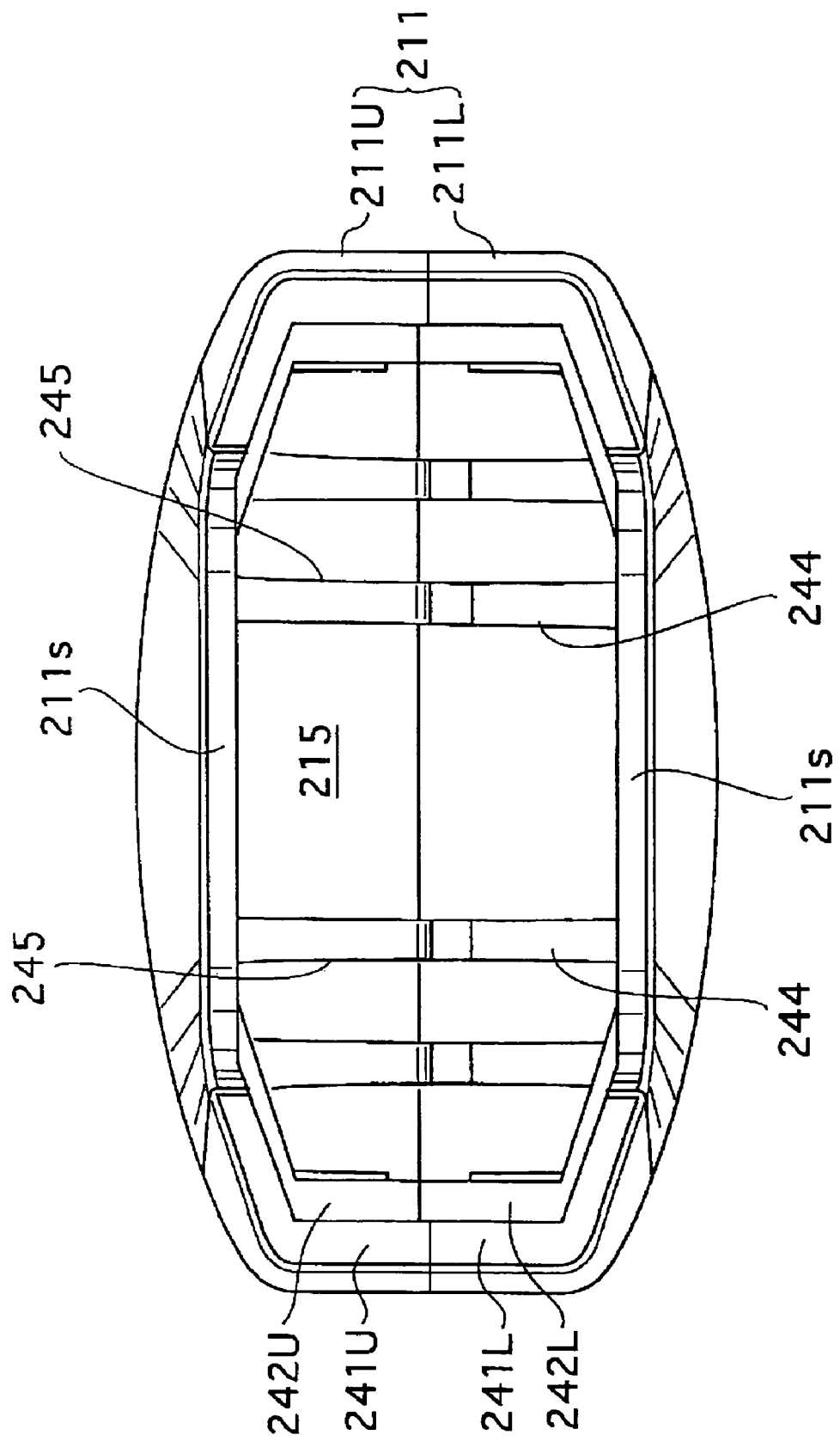
FIG. 46 is a front view of a main body 211.
Figure 47:
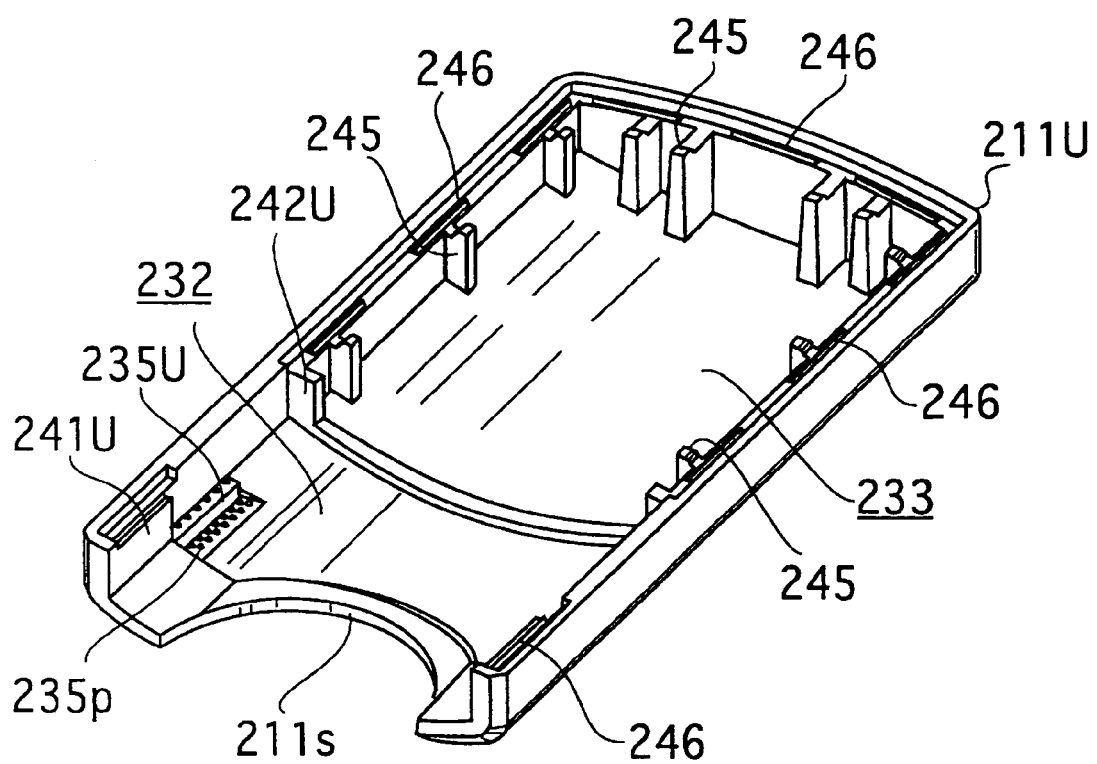
FIG. 47 is a perspective view showing an internal structure of a lower main body part 211L of a main body 211.
Figure 48:
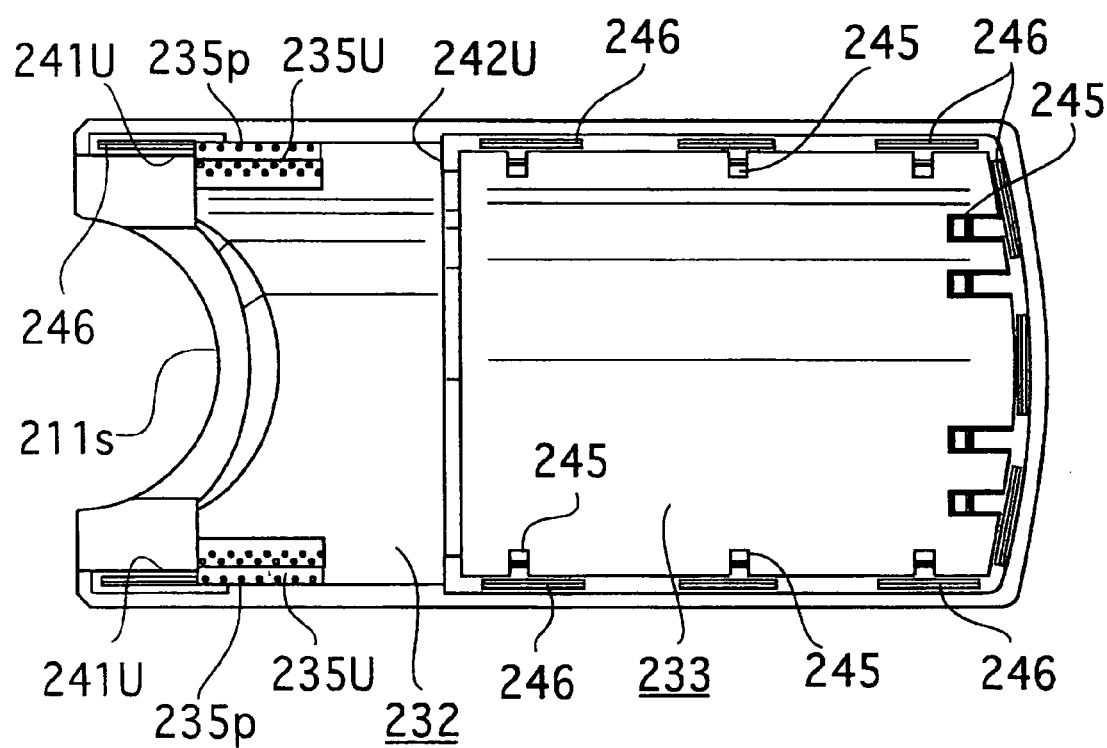
FIG. 48 is a plane view showing an internal structure of a lower main body part 211L.
Figure 49:
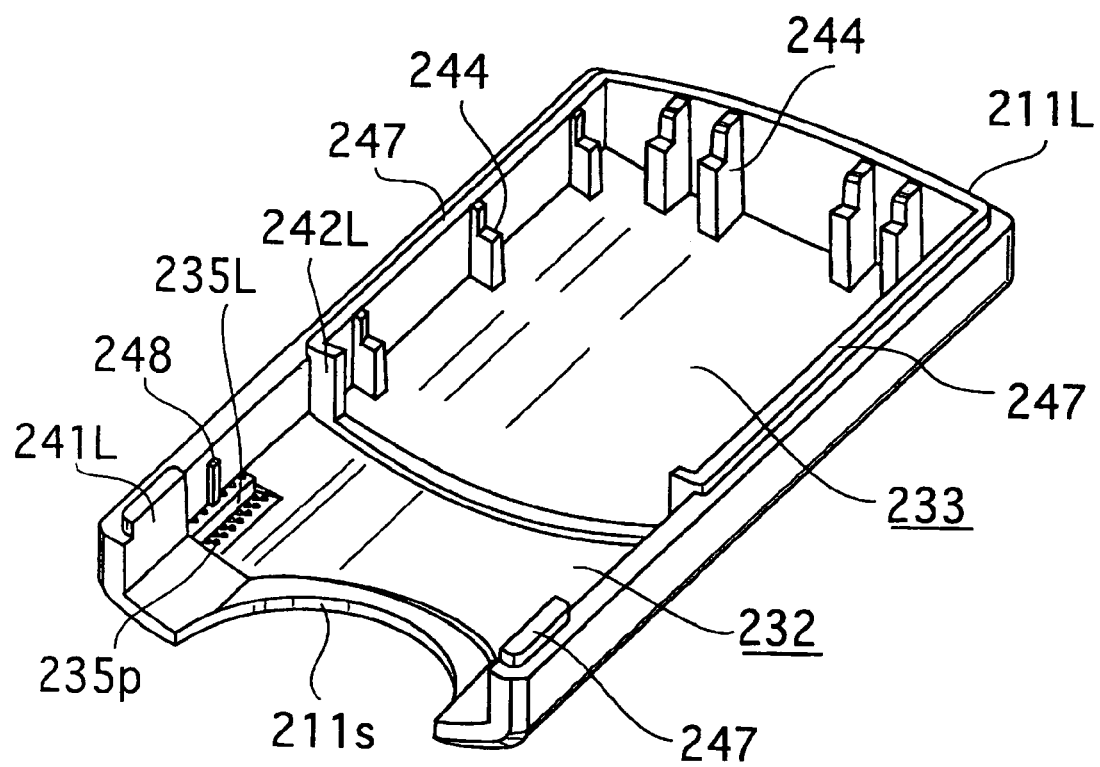
FIG. 49 is a perspective view showing an internal structure of an upper main body part 211U of a main body 211.
Figure 50:
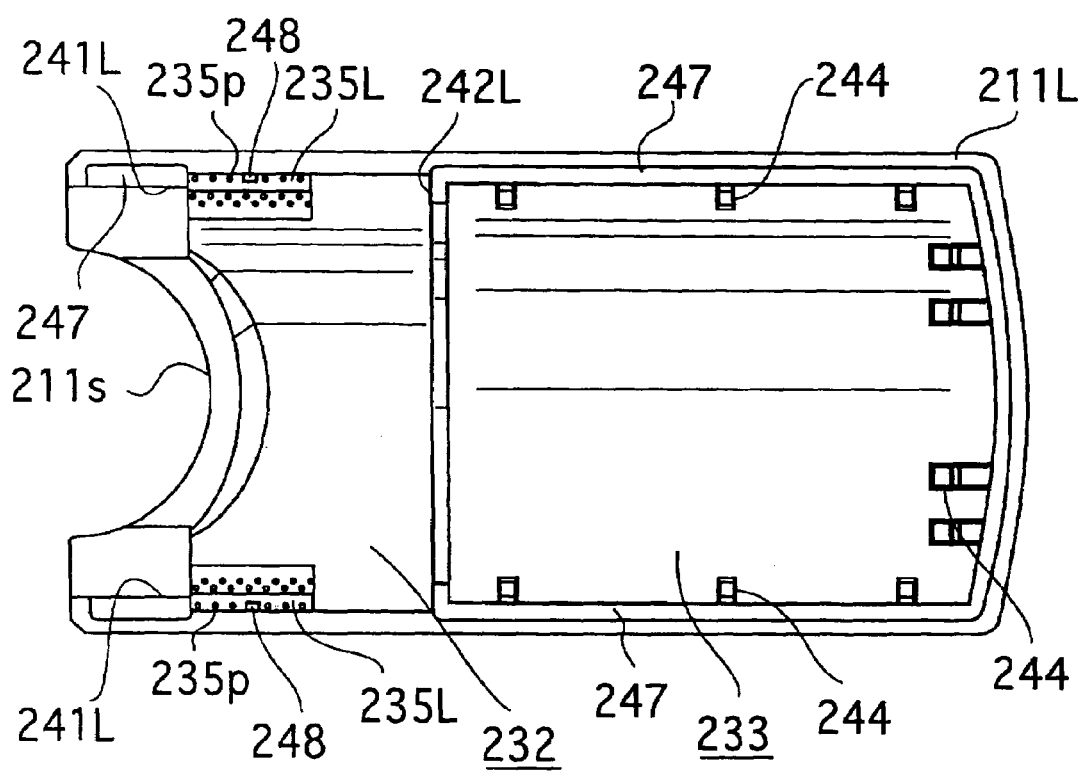
FIG. 50 is a plane view showing an internal structure of an upper main body part 211U.

FIG. 45 is a perspective view showing the internal structure of a main body 211, FIG. 46 is a front view of the main body 211, FIG. 47 is a perspective view showing the internal structure of a lower main body 211L of the main body 211, FIG. 48 is a plan view showing an internal structure for the lower main body 211L, FIG. 49 is a perspective view showing the internal structure of an upper main body 211U of the main body 211, and FIG. 50 is a plan view showing an internal structure of the upper main body 211U.

Figure 51:
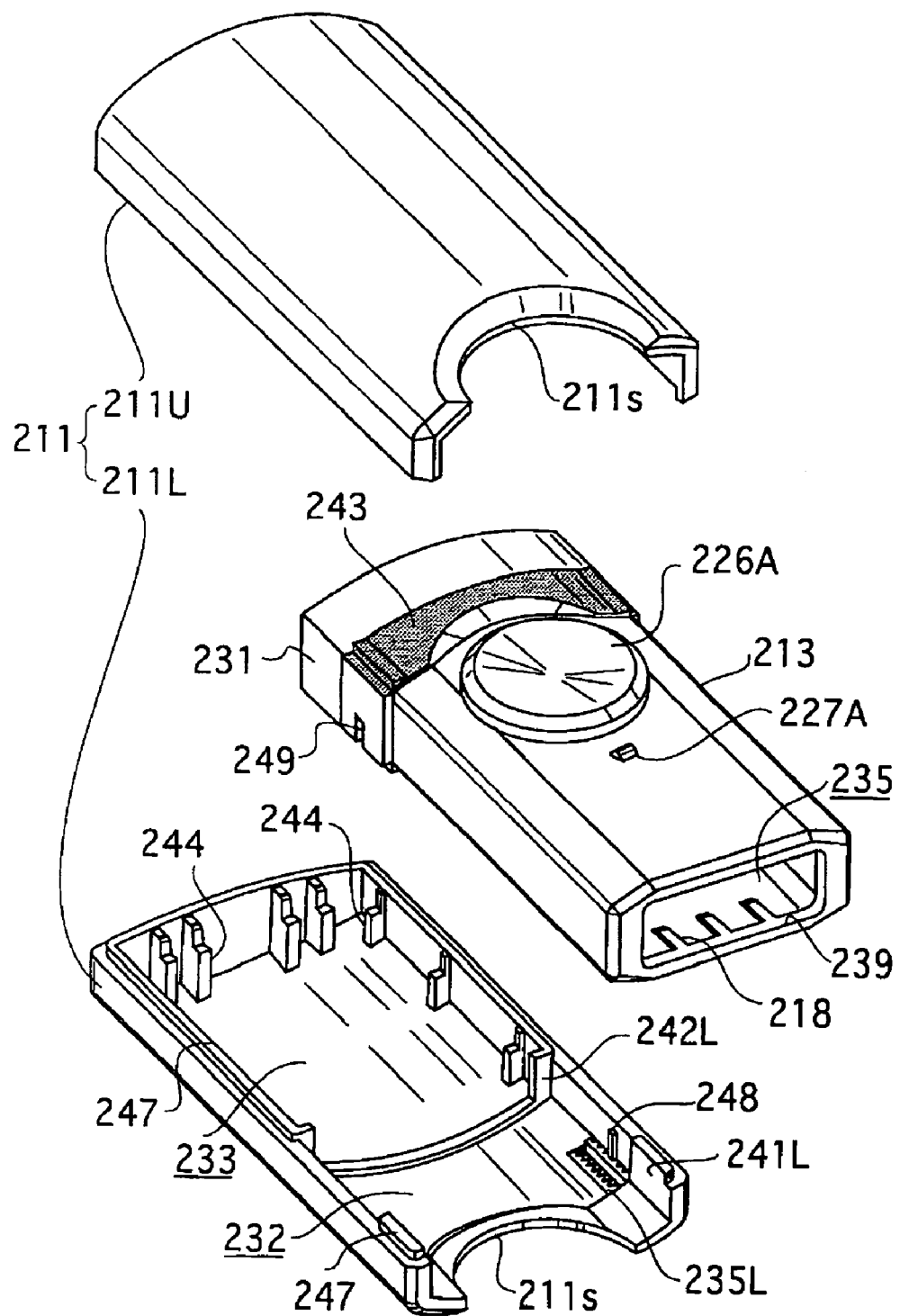
FIG. 51 is an exploded perspective view illustrating an assembly process of a main body 211 and a substrate holder 213.
Figure 52:
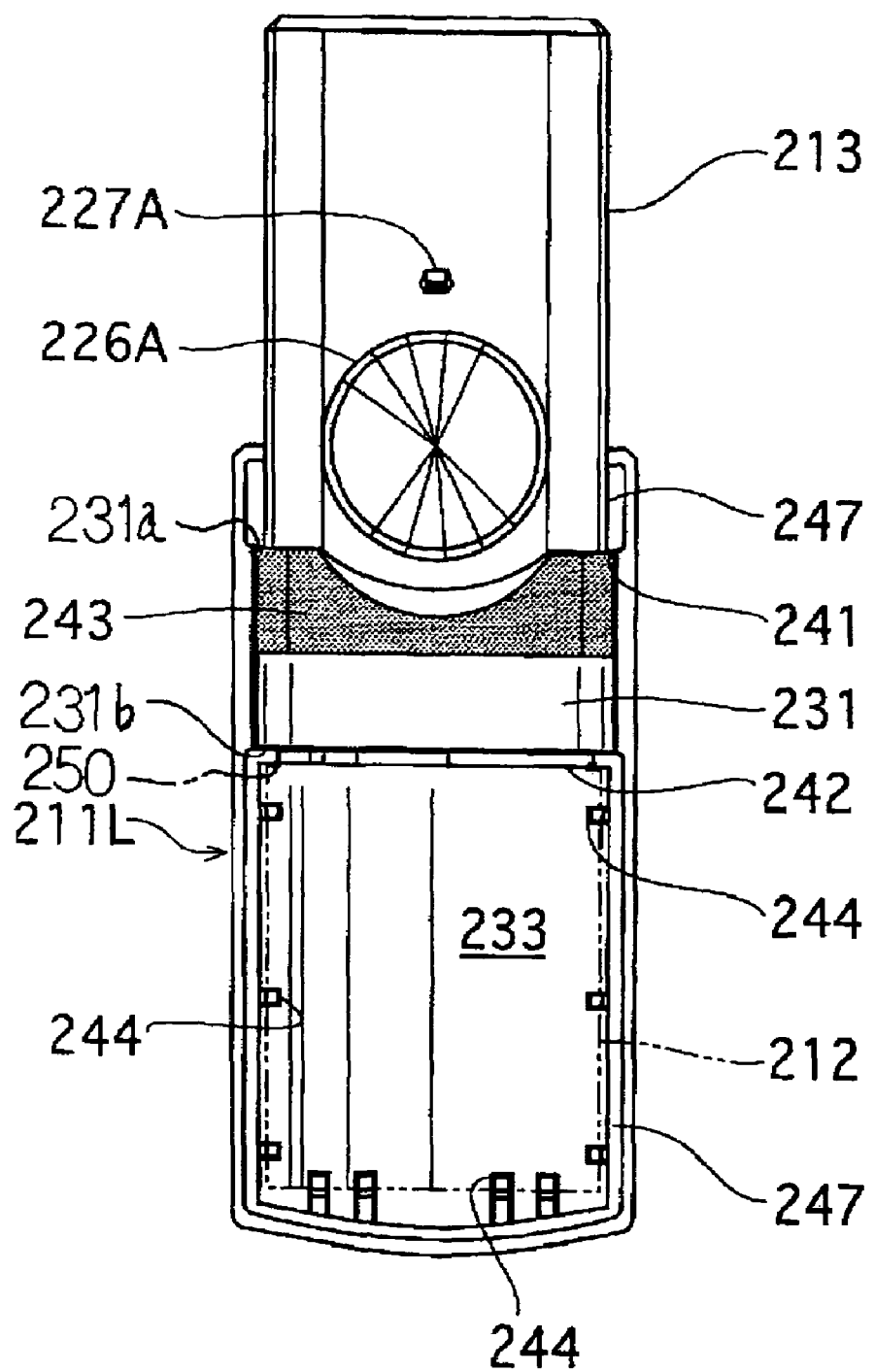
FIG. 52 is a plane showing a substrate holder 213 in an assembled state with respect to a lower main body part 211L.
Figure 53:
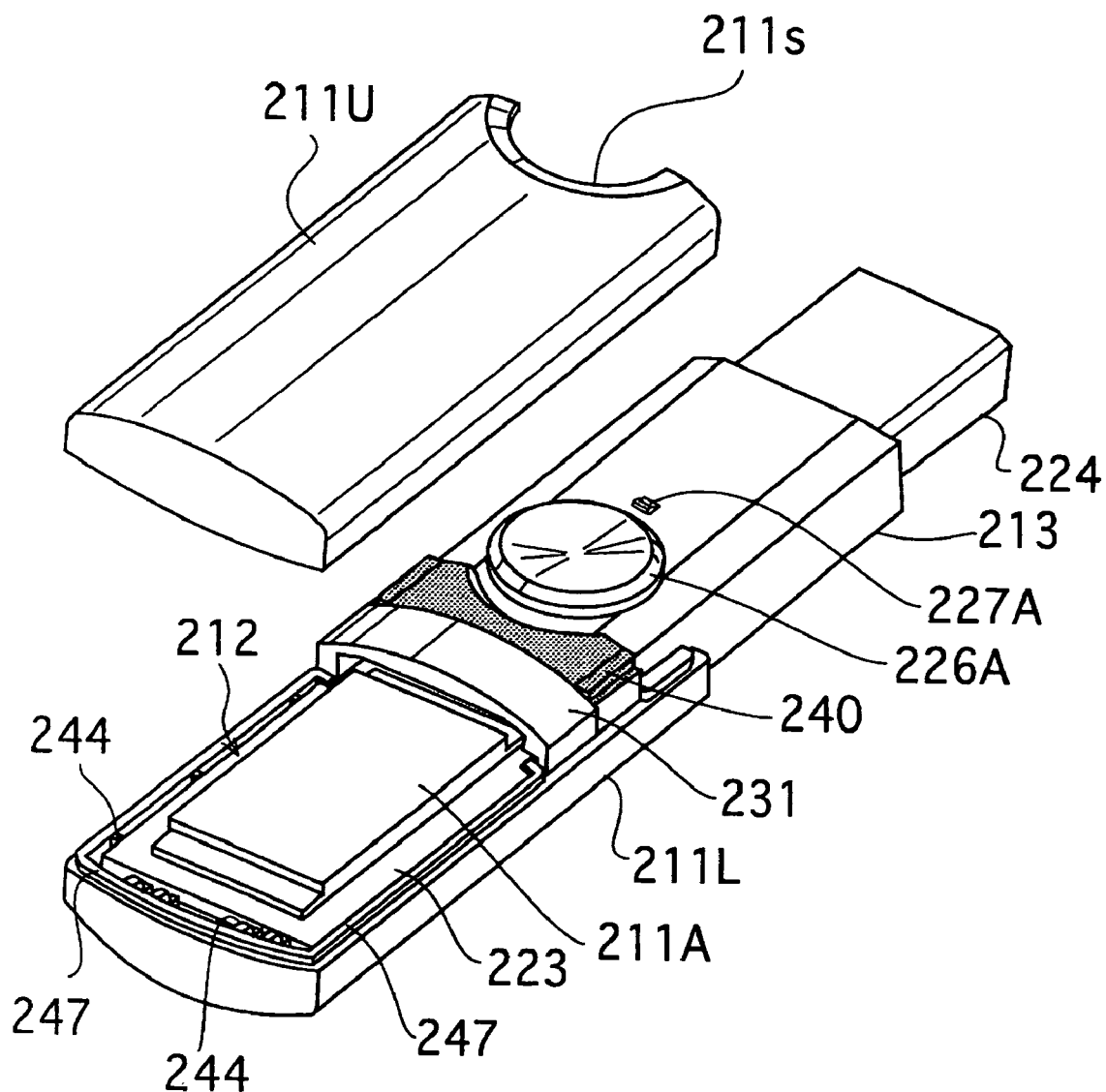
FIG. 53 is a perspective view illustrating a process for assembling an upper main body part 211U to a lower main body part 211L with which a substrate holder 213 is combined.
Figure 54:
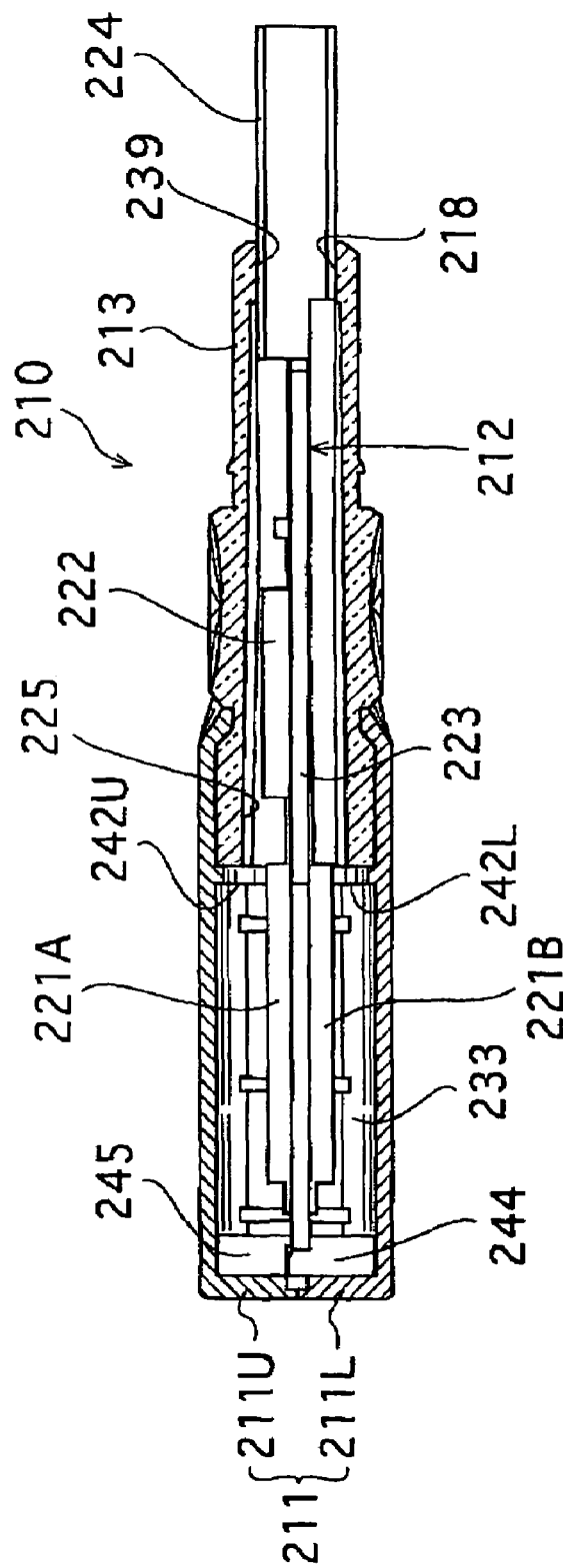
FIG. 54 is a side cross-sectional view of an external storage apparatus 210 (without a cap).
Figure 55:
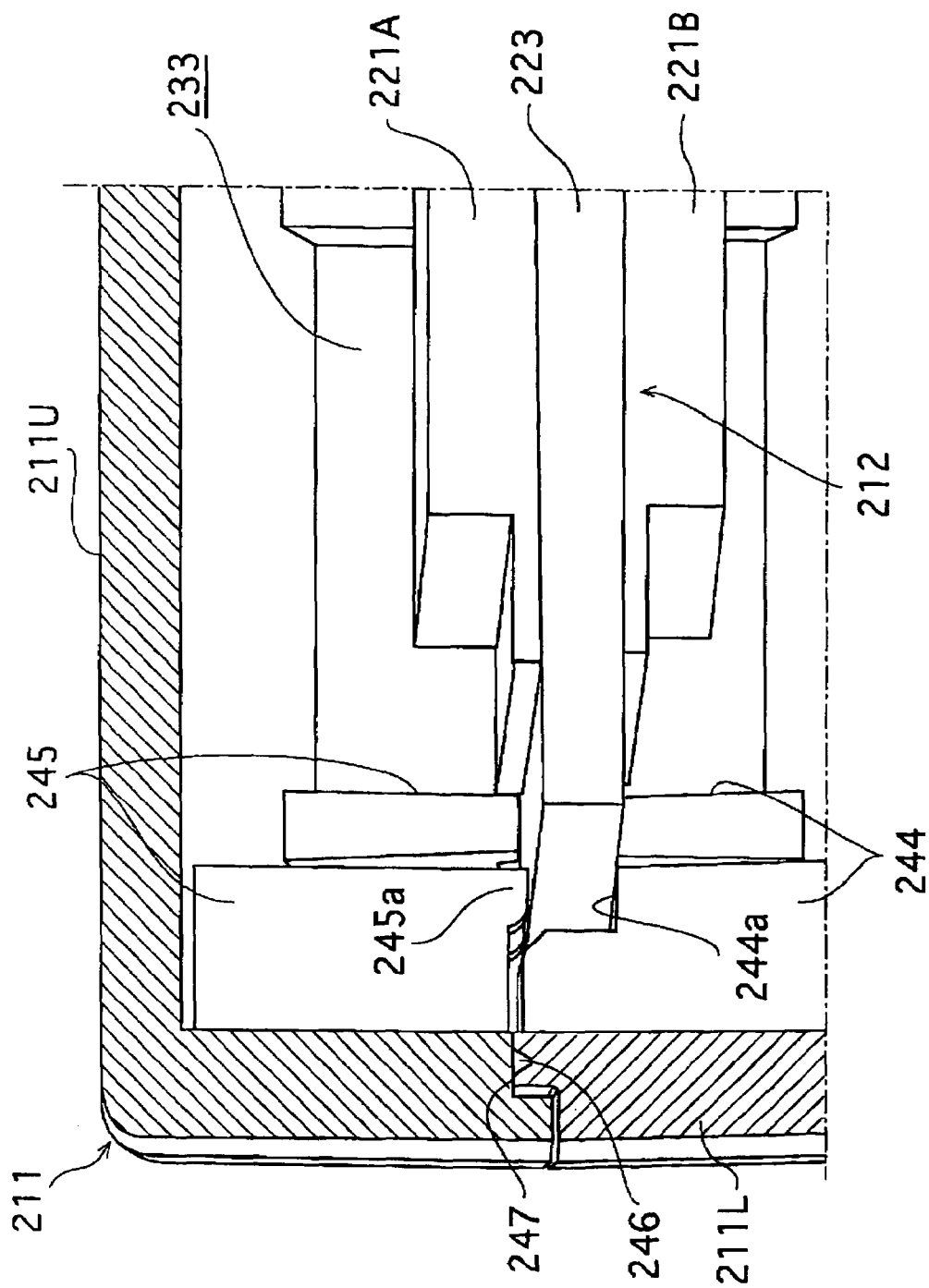
FIG. 55 is a cross-sectional perspective view of essential portion illustrating a support state of a memory substrate 212 within a main body 211.
Figure 56:
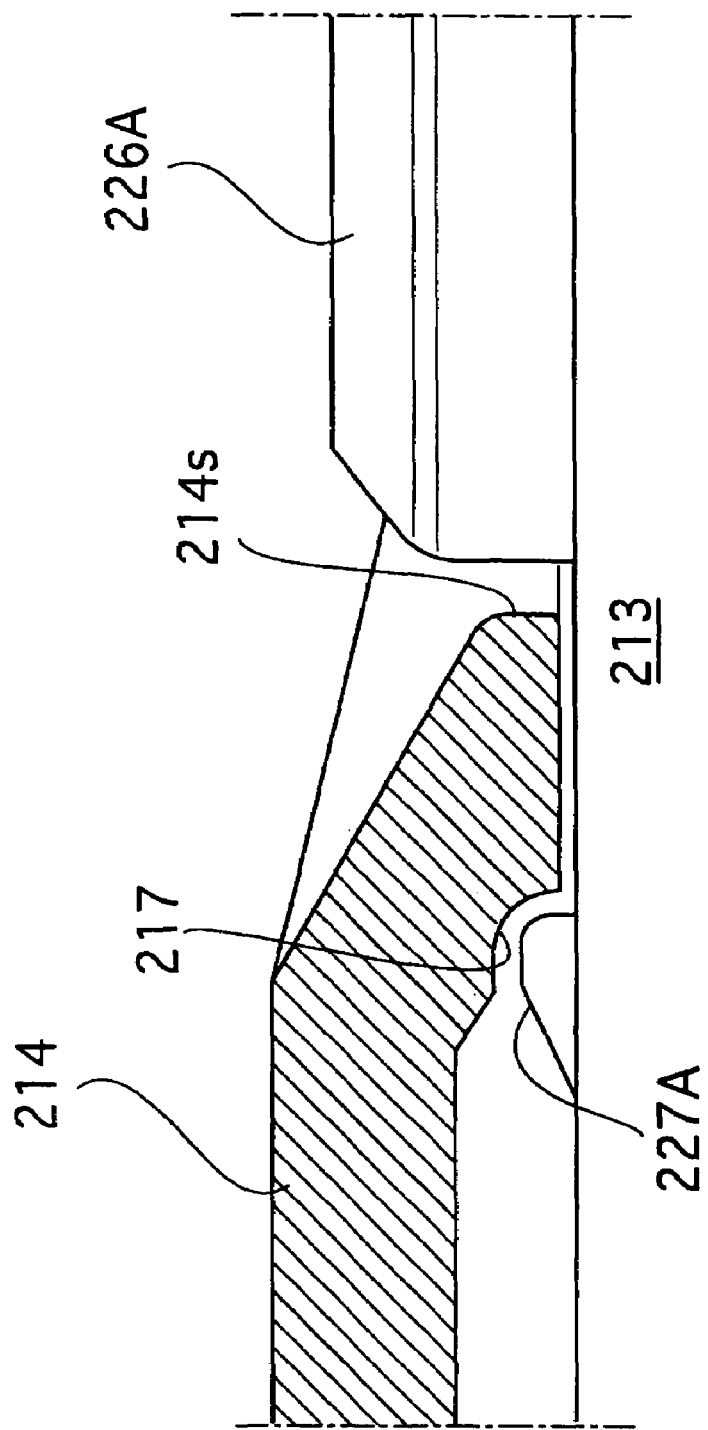
FIG. 56 is a cross-sectional perspective view of essential portion showing a configuration for connecting portion between a substrate holder 213 and a cap 214.

FIG. 51 is an exploded perspective view illustrating a process for assembling the main body 211 and substrate holder 213, FIG. 52 is a plan view showing the substrate holder 213 in an assembled state with respect to the lower main body 211, FIG. 53 is a perspective view illustrating a process for assembling the upper main body 211U to the lower main body 211 with which the substrate holder 213 is combined, FIG. 54 is a side cross-sectional view of the external storage apparatus 210 (with no cap), FIG. 55 is a cross-sectional perspective view illustrating a support mode of the memory substrate 212 within the main body 211, and FIG. 56 is a cross-sectional perspective view of essential portion showing a configuration for connecting portions between the substrate holder 213 and the cap 214.

The external storage apparatus 210 of this embodiment is comprised mainly of the case 211, a memory substrate 212, the substrate holder 213 and the cap 214 (FIG. 34 to FIG. 38). The main body 211 and cap 214 are constructed split up into two parts of top and bottom (front and rear).

The main body 211 and the cap 214 are formed, for example, from injection moldings made of colored opaque polycarbonate resin and are configured so as to be respectively symmetrical, as shown in FIG. 36 and FIG. 37. A space 215 housing the memory substrate 212 and the substrate holder 213 is provided within the main body 211 (FIG. 38, FIG. 45, FIG. 46). Further, a space 216 for housing the connector 224 and substrate holder 213 is provided within the cap 214 (FIG. 35).

The memory substrate 212 is comprised of a printed circuit board 223 constituted, for example, by a glass epoxy substrate, and a connector 224 provided at an edge portion of one end (FIG. 38) as an external connection terminal. The printed circuit board 223 is long with a narrow width, with electronic components 222 such as a semiconductor memory 221A such as a flash memory and crystal oscillators and controllers etc. being mounted on the surface of the printed circuit board 223. A semiconductor memory 221B (FIG. 43) is similarly mounted on the rear surface of the printed circuit board 223 so as to expand storage capacity. The connector 224 is comprised of metal such as stainless steel etc. for connecting a computer and peripheral equipment, with a plurality of connection terminals arrayed internally. In this embodiment, the connector 224 is configured to conform to a USB (Universal Serial Bus).

On the other hand, the substrate holder 213 is formed of, for example, a colored transparent polycarbonate resin injection molding. In this embodiment, the substrate holder 213 is formed in a shape that is substantially symmetrical in appearance from front to rear (top to bottom) (FIG. 39). Circular protrusions 226A and 226B are formed projecting from substantially central portions of the front and rear surfaces of the substrate holder 213. The outer surfaces of the protrusions 226A and 226B are curved in a concave shape, with a window being constructed so as to enable inside of the memory substrate 212 to be viewed from outside. Circular arc-shaped cut-outs 211s, 214s engaging with the peripheral surfaces of the protrusions 226A and 226B are formed at each open end of the main body 211 and cap 214 (FIG. 34 to FIG. 36).

Further, engaging projections 227A and 227B are formed positioned in the vicinity of the protrusions 226A and 226B at the front and rear surface of the substrate holder 213 and engage with engaging recessed sections 217 formed positioned at upper and lower inner edges of the opening of the cap 214 in the event of installing the cap 214 (FIG. 56).

The substrate insertion through-hole 225 through which the memory substrate 212 is inserted is formed within the substrate holder 213 (FIG. 38, FIG. 40 to FIG. 43). The overall length of the substrate holder 213 is shorter than the overall length of the memory substrate 212 containing the connector 224 and is formed so that the connector 224 and rear end of the printed circuit board 223 of the memory substrate 212 project respectively from the openings of the substrate insertion through-hole 225 under the state that the memory substrate 212 is inserted through the substrate insertion through-hole 225 (FIG. 43).

Guide sections 228, 228 with which the left and right edges of the printed circuit board 223 of the memory substrate 212 engage are formed at the left and right side surfaces of the substrate insertion through-hole 225 (FIG. 41, FIG. 42). The guide sections 228, 228 are formed as liner grooves formed at positions offset to the rear surface side with respect to the central axial line 230C (FIG. 42) in a width direction of an open end 230 of the substrate insertion side of the substrate holder 213. The extent of the offset corresponds to the distance between each of the axial centers of the connector 224 and the printed circuit board 223.

The guide sections 228, 228 have a function for guiding the advancement of the memory substrate 212 towards the substrate holder 213 in the case that the assembly posture of the memory substrate 212 is appropriate with respect to the substrate holder 213. Therefore, if the memory substrate 212 is inserted into the substrate insertion through-hole 225 back to front, it is possible for a worker to identify that assembly is erroneous because engaging of the memory substrate 212 and the guide sections 228, 228 is not possible or difficult.

Open ends of the guide sections 228, 228 are formed with comparatively broad widths and ease of assembly with the memory substrate 212 is ensured. On the other hand, guide sections 228, 228 are formed so as to become gradually narrower in width towards the side of the opening 239 at one end of the substrate insertion through-hole 225, with a stepped section 240 (FIG. 38) of the printed circuit board 223 coming into contact with a closed end 229 (FIG. 42) so as to restrict further advancement of the memory substrate 212 (FIG. 44). As a result, the extent of projection of the connector 224 from the opening 239 at one end of the substrate holder 213 is restricted.

In this embodiment, the connector 224 is assembled to the opening 239 by press-fitting. The magnitude of the pressure for press-fitting is taken to be, for example, about enabling assembly by the manual operation of a worker. As a result, after the memory substrate 212 is assembled to the substrate holder 213 in an appropriate manner, both the memory substrate 212 and the substrate holder 213 become integral due to the press-fitting action of the connector 224 with respect to the opening 239.

Support ribs 218 for supporting the outer peripheral surface of the connector 224 are formed at a plurality of locations (in this example, three on the top and bottom) (FIG. 40, FIG. 42) at the inside edge of the opening 239 so as to restrict inclination of the connector 224 with respect to the opening 239. These support ribs 218 are formed in a straight shape (draft angle 0) so as to fit tightly with the outer peripheral surface of the connector 224 (FIG. 43).

In FIG. 39, a region to the right side of the portion forming the protrusions 226A and 226B of the substrate holder 213 is to be an installation section 231 for installing the main body 211. This installation section 231 is sandwiched between the upper main body 211U and lower main body 211L constituting the main body 211 and is welded to the inner surfaces of the upper main body 211U and the lower main body 211L (FIG. 54).

As in the above, the main body 211 is configured from a combination of the upper main body 211U and the lower main body 211L (FIG. 45). The space 215 of the main body 211 is comprised of a holder containing section 232 for holding the installation section 231 of the substrate holder 213 and a substrate containing section 233 for holding the memory substrate 212 projecting from the substrate holder 213.

At the holder containing section 232 there are provided recesses 235U and 235L engaging with connecting ribs 234 (FIG. 39 to FIG. 42) formed at the corners of the installation section 231 of the substrate holder 213, first positioning ribs 241U, 241L for specifying the position of a front end 231a of the installation section 231 of the substrate holder 213, and second positioning ribs 242U and 242L for specifying the position of the rear end 231b of the installation section 231 (FIG. 47 to FIG. 50, FIG. 52). A plurality of conical projections 235p for use in ultrasonic welding are formed at the recesses 235U, 235L.

The front and rear surfaces of the installation section 231 of the substrate holder 213 are taken to be partially embossed (rough) surfaces 243 (FIG. 39 to FIG. 41), so as to make adhesion with the inner surfaces of the upper main body 211U and lower main body 211L facing these surfaces high. The adhesion can be further increased if the inner surfaces of the upper main body 211U and lower main body 211L facing the embossed surfaces 243 are similarly embossed surfaces.

On the other side, at the substrate containing section 233, a plurality of bearing ribs 244 having notches 244a for receiving the lower peripheral edge surface of the memory substrate 212 are formed at the side of the lower main body 211L (FIG. 49, FIG. 52, FIG. 53, FIG. 56). At the upper main body 211U, a plurality of opposing ribs 245 having projections 245a facing the upper peripheral edge surface of the memory substrate 212 are formed corresponding to the locations where the bearing ribs 244 are formed (FIG. 47, FIG. 55, FIG. 56). The memory substrate 212 is sandwiched by the bearing ribs 244 and the opposing ribs 245 but may also be installed between these ribs with a slight gap.

A plurality of welding ribs 246 substantially triangular in cross-section are provided at the inner peripheral edge of the upper main body 211U (FIG. 47, FIG. 48), so as to be welded to the welding surface 247 (FIG. 49, FIG. 50) of the lower main body 211L.

Further, in this embodiment, guide ribs 248, 248 are provided at both inside side surfaces of the substrate containing section 232 and engaging grooves 249, 249 capable of engaging with these guide ribs 248, 248 are provided at both side surfaces of the installation section 231 of the substrate holder 213. The engaging grooves 249, 249 are only formed on the rear surface side of the substrate holder 213 so that assembly with the lower main body 211L is not possible when the substrate holder 213 is back to front.

When assembling the substrate holder 213 and the main body 211, as shown in FIG. 52, first the installation section 231 of the substrate holder 213 is incorporated into the holder containing section 232 of the lower main body 211L. In this event, if the substrate holder 213 is back to front, the installation section 231 does not engage with the guide rib 248 so that assembly to the holder containing section 232 is restricted. It is therefore possible for a worker to identify erroneous assembly. As a result, the memory substrate 212 is prevented from being assembled to the main body 211 incorrectly by the substrate holder 213.

When the substrate holder 213 is incorporated into the holder containing section 232 of the lower main body 211L, the installation section 231 of the substrate holder 213 is positioned in a back and forth direction as a result of the front end 231 coming into contact with first positioning ribs 241U, 241L, and the rear end 231b coming into contact with second positioning ribs 242U, 242L (FIG. 52).

The memory substrate 212 incorporated into the substrate holder 213 is supported by the plurality of bearing ribs 244 at the substrate containing section 233 of the lower main body 211L. In this event, the memory substrate 212 is positioned in a back and forth direction as a result of stepped sections 250 coming into contact with the second positioning ribs 242U, 242L and the rear end coming into contact with the bearing ribs 244 on the side of the bottom part of the main body (FIG. 52).

Next, as shown in FIG. 54, the upper main body 211U is fitted to the lower main body 211L that the substrate holder 213 (and memory substrate 212) has been incorporated into. The upper main body 211U and the lower main body 211L are then connected together using ultrasonic welding bonding at the welding surface 247.

In this event, connecting ribs 234 of the installation section 231 of the substrate holder 213 are welded to the recesses 235U, 235L via the projections 235p and the embossed surfaces 243 are welded to the inner surface sections of the upper main body 211U and lower main body 211L. As a result, the upper and lower main bodies 211U, 211L are joined together at the same time the substrate holder 213 is firmly connected to them by welding.

Further, the memory substrate 212 is installed between the plurality of groups of bearing ribs 244 and the opposing ribs 245 at the substrate containing section 233 of the main body 211 so that rattling of the substrate within the main body is suppressed. Moreover, by interposing a slight gap between the ribs 244, 245 and the substrate, a certain amount of thermal deformation of the memory substrate 212 is permitted, substrate stress is alleviated, and damage to electronic components such as the semiconductor memory 211A and 211B and damage to the component connecting sections can be prevented.

According to this embodiment, as with each embodiment described above, it is possible to prevent erroneous assembly of the memory substrate 212 with respect to the main body 211, and it is possible to prevent falling quality due to erroneous assembly and variation in quality between products.

Further, the external storage apparatus 210 of this embodiment is different from each of the above embodiments in that an integrated configuration is adopted where the substrate holder 213 is sandwiched by the main body 211 of a configuration where the top and bottom are divided into two.

For example, in the case that a plurality of semiconductor memory is mounted on the memory substrate in order to increase recording capacity, the length of the memory substrate becomes larger (becomes longer). In this case, the main body housing the longer memory substrate also becomes longer and when this is formed integrally in an injection mold, the wall thickness on the opposite side to the opening section becomes larger due to the relationship between the mold draft angle etc., internal capacity becomes insufficient for housing the substrate, and there is a problem that sinks etc. may occur.

On the other hand, when the length of the substrate holder housing the memory substrate and the main body is made large, a welding operation in the lengthwise direction (direction of attachment and detachment of the connector) between the end surface of the substrate holder and the main body as described above for each of the embodiments becomes difficult, and this may cause the welding to be insufficient. Further, when the length of the main body and substrate holder is made large, as a result of the extent of projection of the product from the side surface of the equipment at the time of use becoming larger, stress incurred by the welding connection sections due to external force (bending, torsional stress, etc.) incurred by the main body increases, and in the worst case, there is the fear that connection sections maybe damaged to an extent that the main body and the substrate holder become separated.

Here, in this embodiment, the main body 211 is split into two to give an upper main body 211U and lower main body 211L sandwiching the substrate holder 213 from the front and rear, with the upper main body 211U, lower main body 211L and substrate holder 213 being made into a single main body using ultrasonic joining.

It is possible to attain a welding region with a large surface area by taking front and rear surfaces facing each of the inner wall surfaces of the upper main body 211U and lower main body 211L as the surface for welding the substrate holder 213 to the main body 211.

The internal space 215 of the main body 211 is comprised of a holder containing section 232 for holding the substrate holder 213 and a substrate containing section 233 for holding the memory substrate 212 projecting from the substrate holder 213.

A mechanism (241U, 241L, 242U, 242L) for positioning the substrate holder 213 in a back and forth direction (length wise direction) is provided at the holder containing section 232 to bring about a function for retaining the substrate holder 213.

A mechanism (244, 245) for supporting the peripheral edge of the memory substrate 212 so as to sandwich the memory substrate 212 from above and below is provided at the substrate containing section 233 so as to effectively prevent rattling of the substrate within the main body. Back and forth movement of the substrate within the main body is prevented by providing a mechanism (242U, 242L, 244, 245) for positioning in a back and forth direction (longitudinal direction) of the memory substrate 212.

With the above configuration, because the main body 211 and the substrate holder 213 are firmly welded at the same time, welding strength can be ensured, equipment for assembly processes and ultrasonic welding equipment etc. can be kept to a minimum, and increases in costs are avoided. Further, on the other hand, even if the strength of connection between the main body 211 and the substrate holder 213 deteriorates due to the influence of external force etc., separation can be reliably prevented by the retaining mechanism for the substrate holder 213 and product longevity can be ensured. Further, as it is possible to stably support the edge of the memory substrate within the main body, the substrate and electronic components can be protected from damage due to stress from tension and bending and damage to component joining sections can also be prevented. As a result, recording and reading of recording information can be made reliable over long periods of time.

In the above, a description is given of embodiments of the present invention but the present invention is by no means limited to these embodiments and various modifications are possible based on the technological concept of the present invention.

For example, in the first embodiment above, liner ribs are formed in order to prevent erroneous assembly of the main body 11 and the substrate holder 13 but the number of ribs formed is by no means limited to that of the above embodiment and this number maybe increased. As a result, bonding strength and reliability in the case of welding can be dramatically increased.

Further, in the third embodiment above, only the engaging positions of the engaging pawl 152S and the engaged sections 162S are arranged at asymmetrical positions with respect to the front and rear in order to prevent erroneous assembly of the first main body 121 and the second main body 122 but it is also possible for engaging positions of other engaging pawls and engaged sections to be arranged at asymmetrical positions with regards to the front and rear.

Moreover, with regards to assembly of the memory substrate 112 and the substrate holder 113, differences in patterns printed on the surface 113A and rear surface 113B of the substrate holder and the orientation of a projection 128 of the substrate holder 113 are used to discriminate between the front and rear of the substrate holder. For example, a clearance into which the projection 128 fits only when the surface 113A of the substrate holder 113 is oriented upwards may be formed for a pressing jig for the substrate holder 113 used in the printing process, so as to ensure that the substrate holder 113 cannot be installed at the installation position when the rear surface 113B of the substrate holder 113 is oriented upwards.

On the other hand, cases where an external connection terminal (connector) of an external storage apparatus of the present invention is restricted to a connection direction of a USB port etc. of a computer etc. are common. Namely, when the external storage apparatus is installed at a USB port in an incorrect direction, there is the fear that the USB port and external connection terminal of the external storage apparatus may be damaged.

Figure 57A:
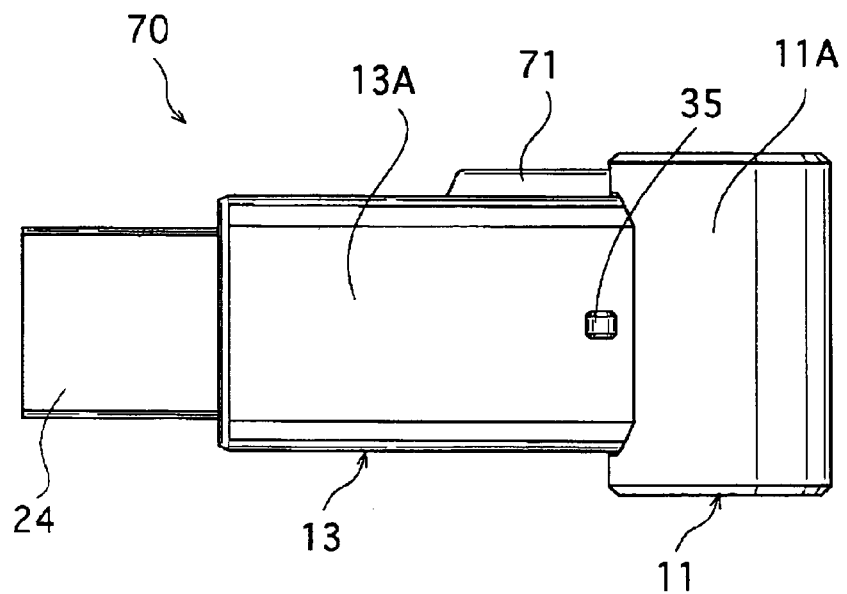
FIG. 57A and FIG. 57B are plane views showing a structure of a modification example of an external storage apparatus of the present invention.
Figure 57B:
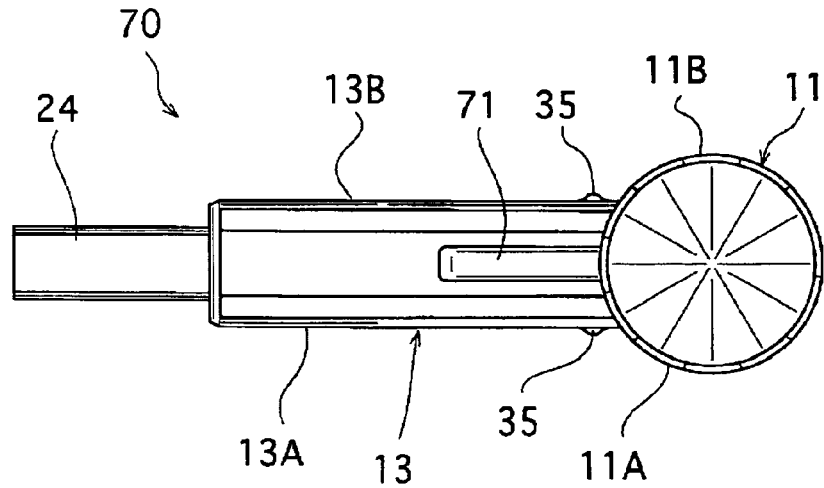
Figure 58:
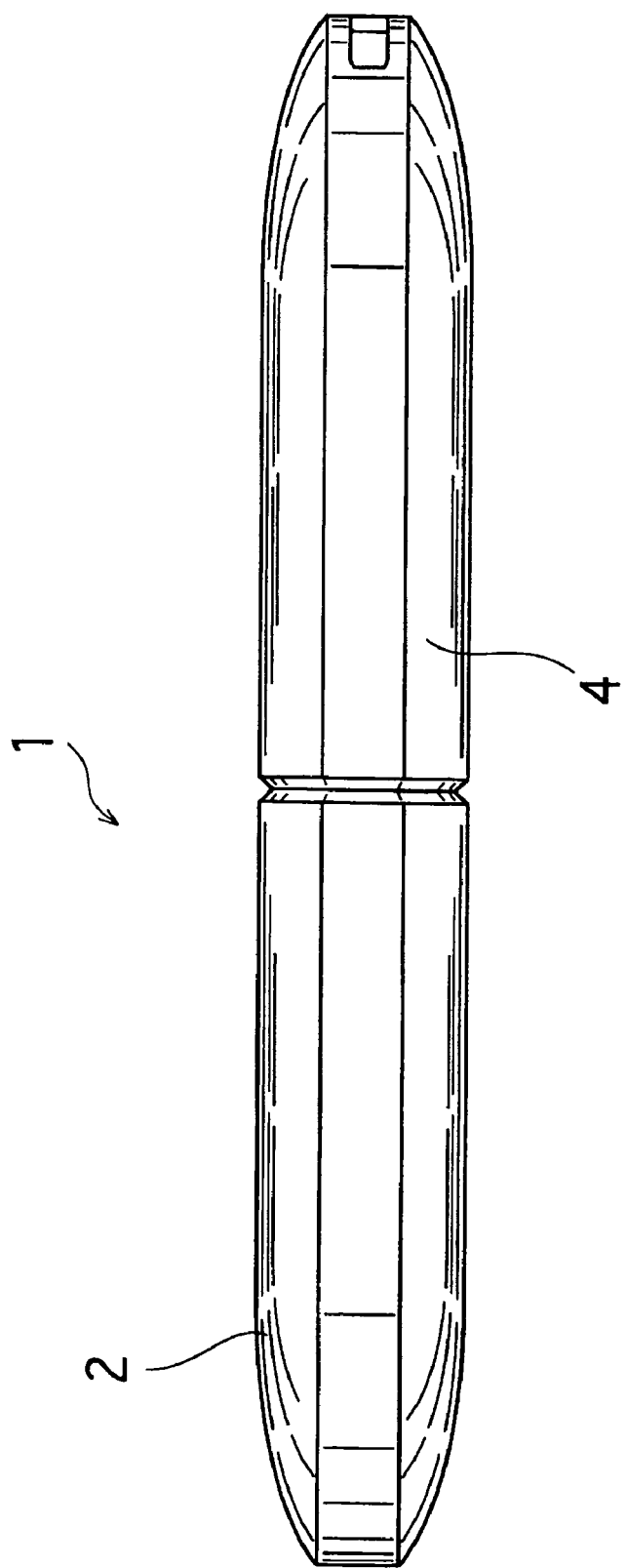
FIG. 58 is a side view of a conventional external storage apparatus 1.
Figure 59:
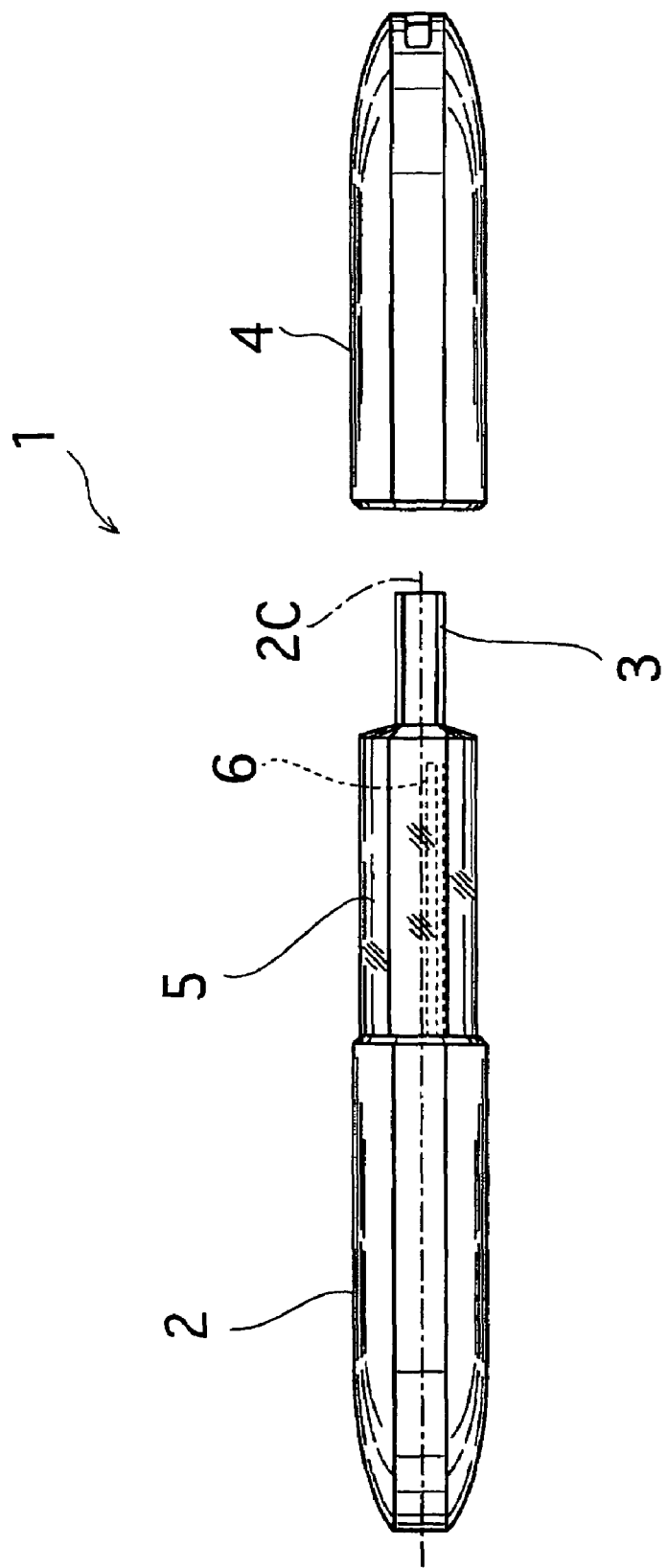
FIG. 59 is a side view showing a state of a conventional external storage apparatus 1 with a cap removed.
Figure 60:
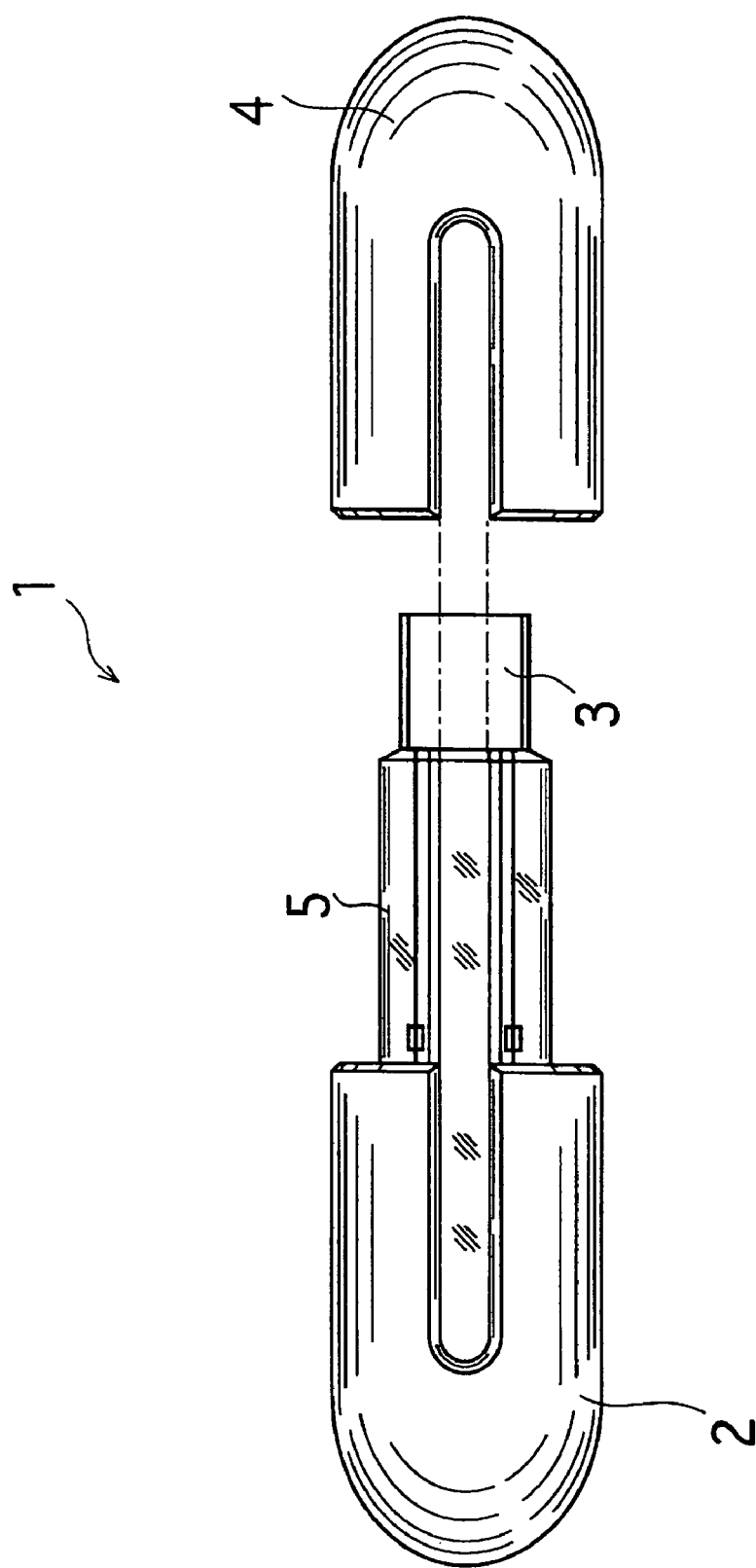
FIG. 60 is a plane view of FIG. 59.

For example, an erroneous connection prevention rib 71 indicating the connection direction of the connector 24 with respect to the USB port is provided as with the external storage apparatus 70 shown in FIG. 57A and FIG. 57B. As a result, it is possible to decide the connection direction of the connector 24 taking the forming surface of the erroneous connection prevention rib 71 as a reference.

Further, in a configuration for electronic equipment such as a computer equipped with, for example, a USB port, the USB port is housed within a case, and a connection hole for connecting to the USB port is provided in the case, a notch corresponding to the erroneous connection prevention rib 71 is formed at the connection hole, so as to enable prevention of insertion of the connector 24 in an incorrect direction.

According to the configuration for the external storage apparatus 70, it is possible to ensure an appropriate assembly operation for the surfaces 11A and 13A between the main body 11 and substrate holder 13 by forming a notch corresponding to the erroneous connection prevention rib 71 for the main body 11.

INDUSTRIAL APPLICABILITY

As described above, according to the external storage apparatus of the present invention, it is possible to reliably prevent erroneous assembly of the memory substrate to the main body. It is therefore possible to avoid variation in quality of products caused by erroneous assembly and deterioration in reliability of the products.

The invention claimed is:

1. An external storage apparatus characterized by comprising:
    a main body;
    a memory substrate, on which at least a semiconductor memory mounted, having an external connection terminal at one end thereof;
    a substrate holder having a substrate insertion through-hole therein through which said memory substrate to be inserted, for fixing said memory substrate to said main body under in such a way that said external connection terminal projects outward from an opening at one end of said substrate insertion through-hole; and
    a cap to be attachable and detachable to and from said substrate holder for protecting said external connection terminal;
    wherein erroneous assembly restricting means is a rib extending to a direction intersecting with other end of said memory substrate and restricts advancement of said memory substrate into said main body by contacting with other end of said memory substrate if assembly posture of said memory substrate with respect to said main body is not correct.

2. The external storage apparatus according to claim 1 is characterized in that:
    a holding groove is formed on said rib, for holding other end of said memory substrate if assembly posture of said memory substrate with respect to said main body is correct.

3. The external storage apparatus according to claim 2 is characterized in that:
    said holding groove holds said memory substrate in accompaniment with plastic deformation as said memory substrate advances.

4. The external storage apparatus according to claim 1 is characterized in that:
    a guide groove is formed on said rib, for guiding advancement of said memory substrate into said main body if assembly posture of said memory substrate with respect to said main body is correct.

5. The external storage apparatus according to claim 4 is characterized in that:
    a holding section is provided at a bottom of said main body, for holding other end of said memory substrate advanced.

6. The external storage apparatus according to claim 5 is characterized in that:
    said holding section holds said memory substrate in accompaniment with plastic deformation due to advancement of said memory substrate.

7. The external storage apparatus according to claim 1 is characterized in that:
    said main body has a space thorough which said substrate holder is inserted, and a restriction section is provided on an inner surface of said space, for restricting advancement of said substrate holder into said space by contacting with said substrate holder if assembly posture of said substrate holder with respect to said main body is not correct.

8. The external storage apparatus according to claim 7 is characterized in that:
    a plurality of liner ribs is provided on an outer surface of an end region at inserted side of said substrate holder to said space, along an insertion direction of said substrate holder with respect to said space;
    wherein said plurality of liner ribs is respectively provided positions where said ribs does not contact with said restriction section if assembly posture of said substrate holder with respect to said main body is correct and where said ribs contact with said restriction section if assembly posture of said substrate holder is not correct.

9. The external storage apparatus according to claim 8 is characterized in that:
    at least some of said plurality of ribs are functioned as a welding rib between said main body and said substrate holder during ultrasonic welding.

10. The external storage apparatus according to claim 1 is characterized in that:

said main body is shaped in a substantially columnar form and a space through which said substrate holder to be inserted is opened on a periphery surface thereof and an end portion at said main body side of said cap is shaped corresponding to said periphery surface of said main body.

11. The external storage apparatus according to claim 10 is characterized in that:
    each end of said main body that is shaped in a substantially columnar form has an inwardly curved shape, and a wave-shaped section for a slip prevention is provided at a front and rear surfaces of said cap.

12. The external storage apparatus according to claim 1 is characterized in that:
    said memory substrate is arranged at an offset position with respect to a central axial position of said main body.

13. The external storage apparatus according to claim 1 is characterized in that:
    said main body comprises
    a first main body through which said substrate holder to be inserted and
    a second main body forming an end region at an opposite side to a side through which said substrate holder to be inserted;
    wherein a slot is provided to said second main body, for attaching and detaching a card-like semiconductor memory apparatus to and from said memory substrate.

14. The external storage apparatus according to claim 13 is characterized in that:
    said second main body is joined to said first main body by snap connection through a plurality of engaging pawls.

15. The external storage apparatus according to claim 14 is characterized in that:
    a wall section is provided to said first main body, for restricting advancement of at least some of said engaging pawls into said first main body if assembly posture is not correct.

16. The external storage apparatus according to claim 1 is characterized in that:
    a gap is formed between an inner wall surface of said main body and other end of said memory substrate, and said external connection terminal is press-fitted to an opening at one end of said substrate insertion through-hole.

17. The external storage apparatus according to claim 1 is characterized in that:
    a guide section is formed in said substrate insertion through-hole, for guiding advancement of said memory substrate into said substrate holder if assembly posture of said memory substrate with respect to said substrate holder is correct.

18. The external storage apparatus according to claim 1 is characterized in that:
    said main body has a structure split up into two parts of top and bottom, and said substrate holder is held by said two-parts structured main body.

19. The external storage apparatus according to claim 18 is characterized in that:
    a mechanism for determining a position of said substrate holder in a back and forth direction is provided within said main body.

20. The external storage apparatus according to claim 18 is characterized in that:
    an engaging section for engaging with an outer peripheral surface of said substrate holder is formed in at least one of said two-parts structured main body if assembly posture of said substrate holder with respect to said main body is correct.

21. The external storage apparatus according to claim 18 is characterized in that:
    at least a part of outer peripheral surface of said substrate holder is welded to an inner surface of said main body.

22. The external storage apparatus according to claim 18 is characterized in that:
    a retaining section of said substrate holder is formed in an inner surface of said main body.

23. The external storage apparatus according to claim 18 is characterized in that:
    a mechanism is provided within said main body, for supporting a peripheral edge of said memory substrate projected from said substrate holder so as to sandwich from above and below.

* * * * *